(12) United States Patent
Chung et al.

(10) Patent No.: US 12,519,056 B2
(45) Date of Patent: Jan. 6, 2026

(54) SEMICONDUCTOR STRUCTURE WITH VIA EXTENDING ACROSS ADJACENT CONDUCTIVE LINES

(71) Applicant: Taiwan Semiconductor Manufacturing Company, Ltd., Hsinchu (TW)

(72) Inventors: Shu-Wei Chung, Hsinchu (TW); Yen-Sen Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/616,195

(22) Filed: Mar. 26, 2024

(65) Prior Publication Data

US 2024/0234301 A1 Jul. 11, 2024

Related U.S. Application Data

(62) Division of application No. 16/881,000, filed on May 22, 2020, now Pat. No. 11,967,550.

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76807* (2013.01); *H01L 21/76877* (2013.01); *H01L 23/528* (2013.01)

(58) Field of Classification Search
CPC .......... H01L 23/5226; H01L 21/76807; H01L 21/76877; H01L 23/528; H01L 21/76816
See application file for complete search history.

(56) References Cited

U.S. PATENT DOCUMENTS

2010/0308469 A1* 12/2010 Tsai .................... H01L 23/5226
257/E21.585

* cited by examiner

*Primary Examiner* — Phat X Cao
(74) *Attorney, Agent, or Firm* — JCIPRNET

(57) ABSTRACT

A semiconductor structure and method of forming the same are provided. The semiconductor structure has a conductive structure. The semiconductor structure includes a first conductive line, a second conductive line, a third conductive line and a conductive via. The first conductive line and the second conductive line are located in a first dielectric layer and extend along a first direction. The first conductive line and the second conductive line are spaced from each other by the first dielectric layer therebetween. The third conductive line is located in a second dielectric layer and extends along a second direction. The conductive via is vertically between the first conductive line and the third conductive line, and between the second conductive line and the third conductive line. The conductive via, in a vertical direction, is overlapped with a portion of the first dielectric layer that is laterally between the first conductive line and the second conductive line.

20 Claims, 57 Drawing Sheets

SEMICONDUCTOR STRUCTURE WITH VIA EXTENDING ACROSS ADJACENT CONDUCTIVE LINES

CROSS-REFERENCE TO RELATED APPLICATION

This application is a divisional application of and claims the priority benefit of a prior application Ser. No. 16/881,000, filed on May 22, 2020 and now allowed. The entirety of the above-mentioned patent applications is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

Such scaling down has also increased the complexity of manufacturing ICs and, for these advances to be realized, similar developments in IC manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
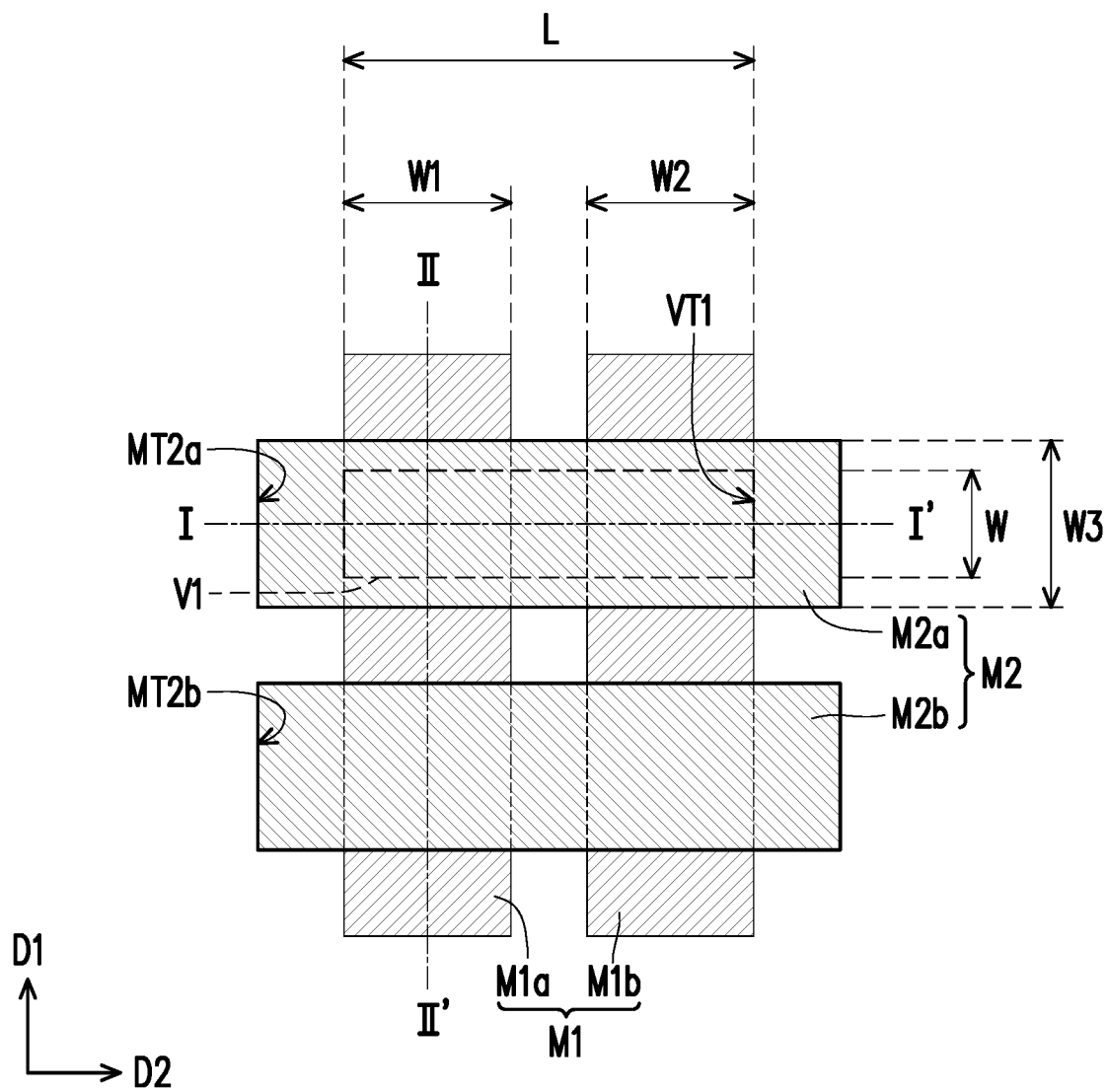
FIG. 1 illustrates a top view of a semiconductor structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are directed to provide an interconnect structure of a semiconductor structure and method of forming the same. The interconnect structure may be included in an integrated circuit (IC) chip/die and formed in back-end-of-line (BEOL) of IC fabrication. Throughout the various views and illustrative embodiments, like reference numbers are used to designate like elements. It is appreciated that although the interconnection structure fabricated in back-end-of-line (BEOL) is used as examples to explain the concept of the embodiments of the present disclosure, the embodiments of the present disclosure are readily applicable to other types of semiconductor structure including metal interconnection. The other types of semiconductor structure may include redistribution layer (RDL) structure of a package structure, a circuit board, or the like, and the disclosure is not limited thereto.

FIG. 1 is a top view of an interconnection structure of a semiconductor structure according to some embodiments of the disclosure. It is noted that, FIG. 1 merely illustrates two tiers conductive layers and conductive via therebetween for illustration, and some components are omitted from the top view for the sake of brevity, which will be described and shown in the corresponding cross-sectional views.

Referring to FIG. 1, in some embodiments, an interconnection structure includes first tier conductive layer M1, a conductive via V1 and second tier conductive layer M2. The first tier conductive layer M1 may include a plurality of conductive lines, such as the conductive lines M1$a$ and M1$b$. The second tier conductive layer M2 may include a plurality of conductive lines, such as the conductive lines M2$a$ and M2b. The number of the conductive lines shown in the figures is merely for illustration, and the disclosure is not limited thereto.

In some embodiments, the conductive lines M1a and M1b are extending along a first direction D1 and arranged along the first direction D2 perpendicular to the first direction D1. The conductive lines M2a and M2b are located above the first conductive lines M1a and M1b and may extend along the second direction D2 and arranged along the first direction D1. The conductive via V1 is located vertically between the first tier conductive layer M1 and the second tier conductive layer M2 to provide electrical connection therebetween. In some embodiments, the conductive via V1 is extending in the second direction D2 and across adjacent two first conductive lines M1a and M1b.

Various embodiments are provided to form the interconnection structure having the top view of FIG. 1.

FIG. 2A to FIG. 2J are schematic cross-sectional views illustrating a method of forming a semiconductor structure according to a first illustrative embodiment of the disclosure. Specifically, FIG. 2A to FIG. 2J illustrates cross-sectional views of intermediate stages of forming an interconnection structure having the top view of FIG. 1. FIG. 2A to FIG. 2J corresponds to cross-sectional views of intermediate stages taken along I-I' line and II-II' line of FIG. 1.

Figure 2A:
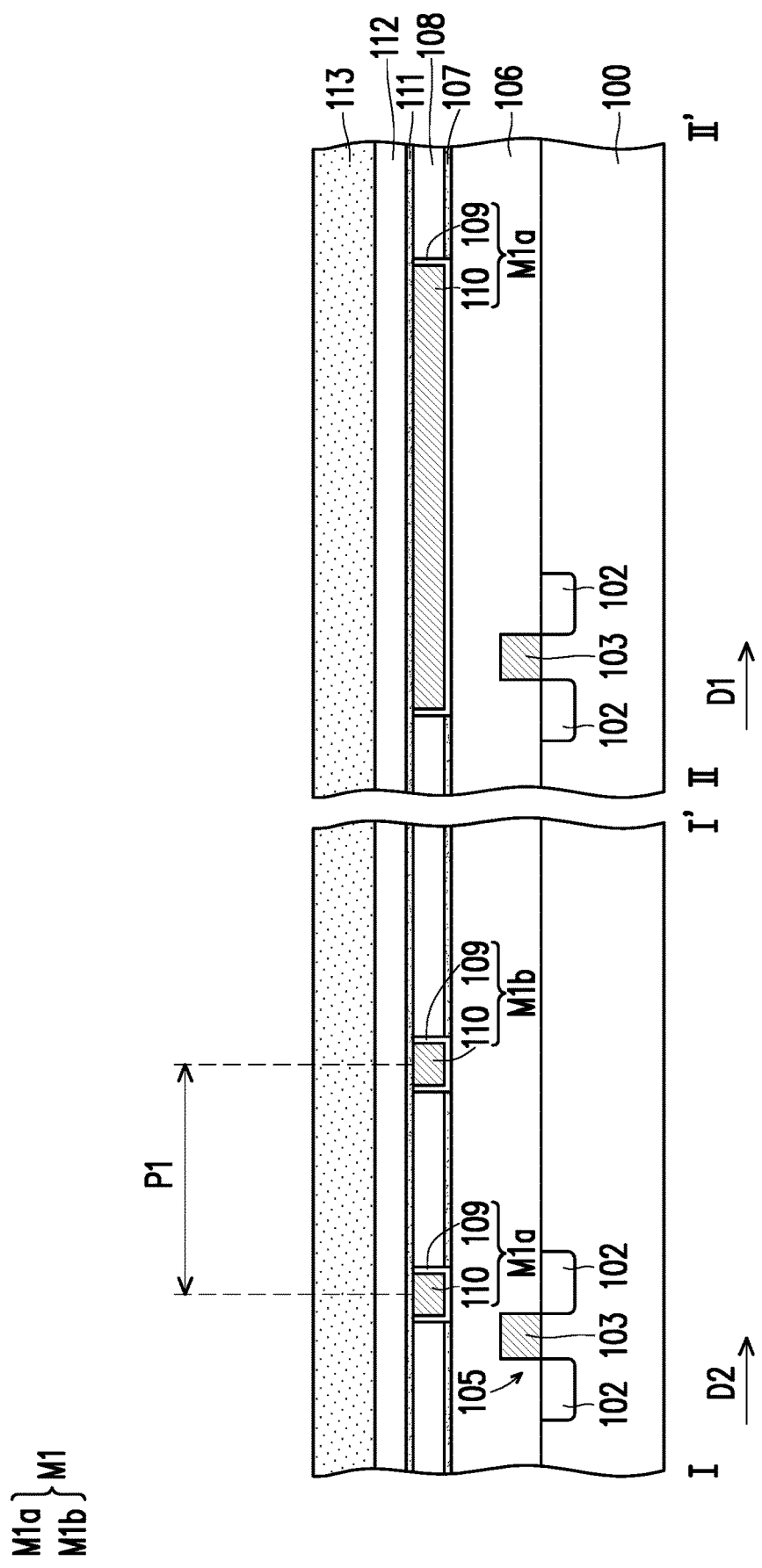
FIG. 2A through FIG. 2J are schematic cross-sectional views illustrating intermediate stages for forming a semiconductor structure according to a first embodiment of the disclosure.

Referring to FIG. 2A, in some embodiments, a substrate 100 is provided. In some embodiments, the substrate 100 is a semiconductor substrate, such as a bulk semiconductor substrate, a semiconductor-on-insulator (SOI) substrate, or the like, which may be doped (e.g., with a p-type or an n-type dopant) or undoped. The substrate 100 may be a wafer, such as a silicon wafer. Other substrates, such as a multi-layered or gradient substrate may also be used. In some embodiments, the semiconductor material of the substrate 100 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

Depending on the requirements of design, the substrate 100 may have doped regions therein, and the doped regions may include N-type dopants, P-type dopants, or combinations thereof. In some embodiments, various devices are formed in and/or on the substrate 100. The devices may include active devices, passive devices, or combinations thereof. For example, the devices may include transistors, capacitors, resistors, diodes, photodiodes, fuse devices, or the like, or combinations thereof.

For example, a device 105 is formed in and/or on the substrate 100. The device 105 is a transistor, such as N-type Metal-Oxide-Semiconductor (NMOS) transistor, an N-type Metal-Oxide-Semiconductor (PMOS) transistor, an N-type Fin Field-effect transistor (FinFET) device, a P-type FinFET device, or the like. In some embodiments, the device 105 includes a gate structure 103 and source/drain regions 102. The gate structure 103 is disposed on the substrate and may include a gate dielectric layer and a gate electrode on the gate dielectric layer (not specifically shown). The gate dielectric layer may include silicon oxide, silicon nitride, silicon oxynitride, high-k dielectric materials, or combinations thereof. The high-k material may have a dielectric constant greater than about 4 or 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. The gate electrode may include doped polysilicon, undoped polysilicon, or metal-containing conductive material such as copper, aluminum, tungsten, cobalt (Co), or a suitable material. In some embodiments, the gate structure 103 includes spacers (not shown) on sidewalls of the gate electrode and the gate dielectric layer. The spacers may include $SiO_2$, SiN, SiCN, SiOCN, SiC, SiOC, SiON, or the like, or combinations thereof.

The S/D regions 102 are disposed in the substrate 100 and on sides of the gate structure 103. In some embodiments, the S/D regions 102 are doped regions configured for a PMOS device or P-type FinFET and include p-type dopants, such as boron, BF, and/or a combination thereof. In alternative embodiments, the S/D regions 102 are doped regions configured for a NMOS device or N-type FinFET, and include n-type dopants, such as phosphorus, arsenic, and/or a combination thereof. The S/D regions 102 may be formed by an ion implanting process. However, the disclosure is not limited thereto.

In some other embodiments, the S/D regions 102 are strained layers (or referred to as epitaxial layers) formed by epitaxial growing process such as selective epitaxial growing process. In some embodiments, the strained layers include silicon germanium (SiGe), SiGeB, Ge, InSb, GaSb, InGaSb or combinations thereof for a P-type MOS or FinFET device. In alternative embodiments, the strained layers include silicon carbon (SiC), silicon phosphate (SiP), SiCP, InP, GaAs, AlAs, InAs, InAlAs, InGaAs or a SiC/SiP multi-layer structure, or combinations thereof for an N-type MOS or FinFET device.

It is noted that, the structure of the device 105 and the number of devices formed in and/or on the substrate 100 shown in the figures are merely for illustration, and the disclosure is not limited thereto. Alternatively and/or additionally, the device 105 may include some other components, and some other devices may be formed in and/or on the substrate 100 according to product design and requirement.

Still referring to FIG. 2A, an interlay dielectric layer (ILD) 106 is formed on the substrate 100 to cover the device 105. The interlayer dielectric layer 106 may include a single-layer structure or a multi-layer structure. In some embodiments, the ILD 106 includes a first ILD (not shown) laterally aside the gate structure 103, and a second ILD (not shown) on the first ILD and the gate structure 103.

In some embodiments, the ILD 106 includes silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the ILD 103 may include low-k dielectric material with a dielectric constant lower than 4, extreme low-k (ELK) dielectric material with a dielectric constant lower than 2.5. In some embodiments, the low-k material includes a polymer based material, such as benzocyclobutene (BCB), FLARE®, or SILK®; or a silicon dioxide based material, such as hydrogen silsesquioxane (HSQ) or SiOF. The ILD 106 may be formed by CVD, PECVD, FCVD, spin coating or the like.

In some embodiments, contacts (not shown) are formed within the ILD 106 to electrically connect to the devices of the substrate 100. For example, the contacts may be electrically connected to the gate structure 103 and/or the S/D regions 102 of the device 105. In some embodiments, the contact includes a barrier layer and a conductive post on the barrier layer. The barrier layer may include titanium, tantalum, titanium nitride, tantalum nitride, manganese nitride or a combination thereof. The conductive layer may include metal, such as tungsten (W), copper (Cu), Ru, Ir, Ni, Os, Rh, Al, Mo, Co, alloys thereof, combinations thereof or any metal material with suitable resistance and gap-fill capability.

In some embodiments, an etching stop layer 107 and a dielectric layer 108 are then sequentially formed on the ILD 106. The dielectric layer 108 may also be referred to as inter-metal dielectric (IMD) layer. The materials of the etching stop layer 107 and the dielectric layer 108 are different. In some embodiments, the etching stop layer 107 includes SiN, SiC, SiOC, SiON, SiCN, SiOCN, or the like, or combinations thereof, and may be formed by CVD, plasma-enhanced CVD (PECVD), flowable CVD (FCVD), ALD or the like. The material and forming method of the dielectric layer 108 may be similar to those of the dielectric layer 106. For example, the dielectric layer 108 may include silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), or above-described low-k or ELK dielectric material, or the like, or combinations thereof.

Thereafter, the first tier conductive layer M1 is formed in the dielectric layer 108 and the etching stop layer 107. In some embodiments, the first tier conductive layer M1 includes a barrier layer 109 and a conductive layer 110 on the barrier layer 109. The barrier layer 109 may include titanium, tantalum, titanium nitride, tantalum nitride, manganese nitride or a combination thereof. The conductive layer 110 may include metal or metal alloy, such as tungsten (W), copper (Cu), Ru, Ir, Ni, Os, Rh, Al, Mo, Co, alloys thereof, combinations thereof or other suitable metallic material. In some embodiments, the first tier conductive layer M1 may be formed by the following processes: the etching stop layer 107 and the dielectric layer 108 are patterned to form conductive line trenches therein, a barrier material layer and a conductive material layer are formed to overfill the conductive line trenches and cover the top surface of the dielectric layer 108, a planarization process, such as a chemical mechanical polishing (CMP) process is then performed to remove excess portions of conductive material layer and barrier material layer over the top surface of the dielectric layer 108, and the barrier layer 109 and conductive layer 110 are remained in the conductive line trenches to constitute the first tier conductive layer M1. In some embodiments, a seed layer (not shown) may further be formed between barrier layer 109 and the conductive layer 110. The seed layer is a metal seed layer, such a copper seed layer. In some embodiments, the seed layer includes a first metal layer such as a titanium layer and a second metal layer such as a copper layer over the first metal layer.

In some embodiments, the first tier conductive layer M1 includes conductive lines M1a and M1b immediately adjacent to each other. The conductive lines M1a and M1b have a pitch P1. The first tier conductive layer M1 is electrically connected to the devices (such as, the device 105) in/on the substrate 100 through the above-described contacts.

Still referring to FIG. 2A, after the conductive layer M1 is formed, an etching stop layer 111 and a dielectric layer 112 are sequentially formed on the conductive layer M1 and the dielectric layer 108. The dielectric layer 112 may also be referred to as an IMD layer. The materials and forming methods of the etching stop layer 111 and dielectric layer 112 maybe selected from the same candidate materials and forming methods of the etching stop layer 107 and the dielectric layer 108, respectively.

Still referring to FIG. 2A, a mask layer 113 is formed on the dielectric layer 112. In some embodiments, the mask layer 113 includes a photoresist formed by spin coating, for example.

Figure 2B:
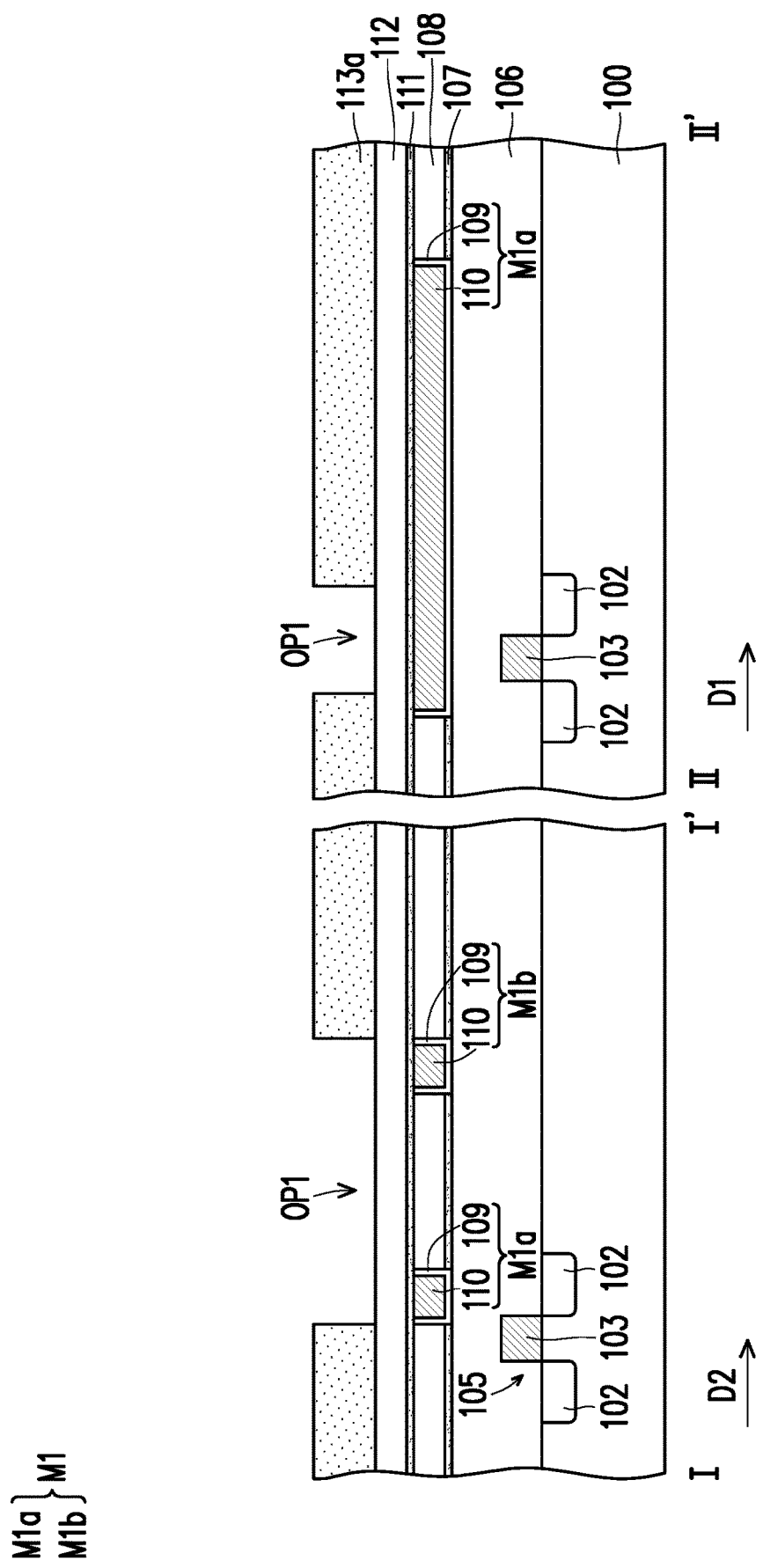

Referring to FIG. 2A and FIG. 2B, the mask layer 113 is patterned to form a patterned mask layer 113a. The patterned mask layer 113a includes an opening OP1 exposing a portion of the top surface of the dielectric layer 112. The patterning process may be a photolithograph process including exposure and development processes. In some embodiments, the opening OP1 is a trench extends along the second direction D2, and is used for defining a via trench. In other words, the pattern of the patterned mask layer 113a corresponds to the subsequently formed conductive via V1. In some embodiments, the opening OP1 is disposed directly over the conductive lines M1a and M1b, and has a length larger than the pitch P1 (FIG. 2A) of the conductive lines M1a and M1b.

Figure 2C:
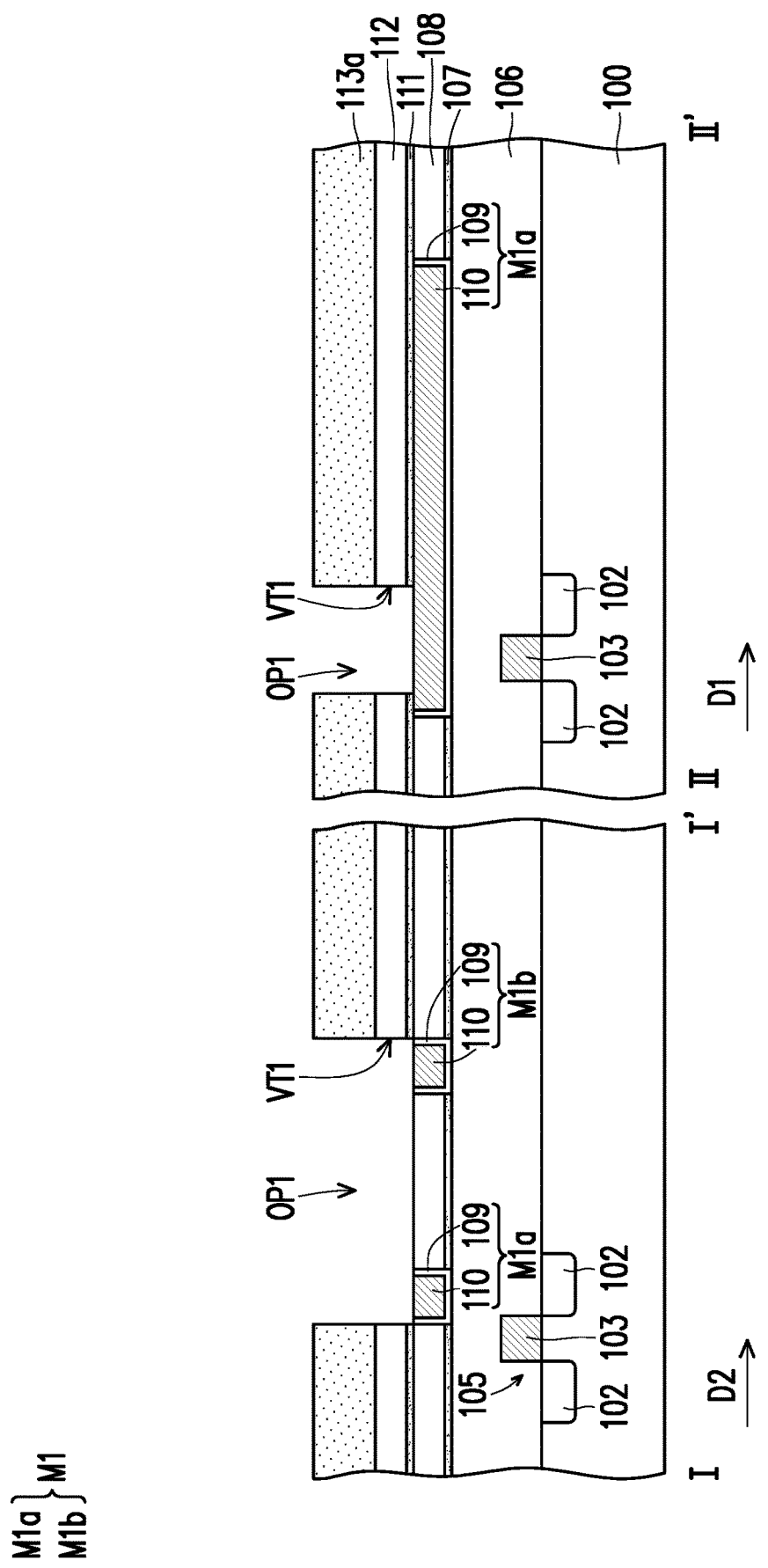

Referring to FIG. 2B and FIG. 2C, thereafter, the dielectric layer 112 and the etching stop layer 111 are patterned with the patterned mask layer 113a as a mask, so as to form a via trench VT1 in the dielectric layer 112 and the etching stop layer 111. For example, one or more etching process(es) is performed with the patterned mask layer 113a as an etching mask, so as to remove portions of the dielectric layer 112 and the etching stop layer 111 exposed by the opening OP1 of patterned mask layer 113a. The etching process(es) may include dry etching process, wet etching process, or a combination thereof. In some embodiments, the via trench VT1 extends along the second direction D2 and exposes portions of the top surfaces of the conductive lines M1a and M1b and a portion of the top surface of the dielectric layer 108 laterally between the adjacent two conductive lines M1a and M1b. In some embodiments, the length of the via trench VT1 is larger than the pitch P1 (FIG. 2A) of the conductive lines M1a and M1b and may be substantially equal to the distance from a sidewall of the conductive line M1a to a sidewall of the conductive line M1b.

Figure 2D:
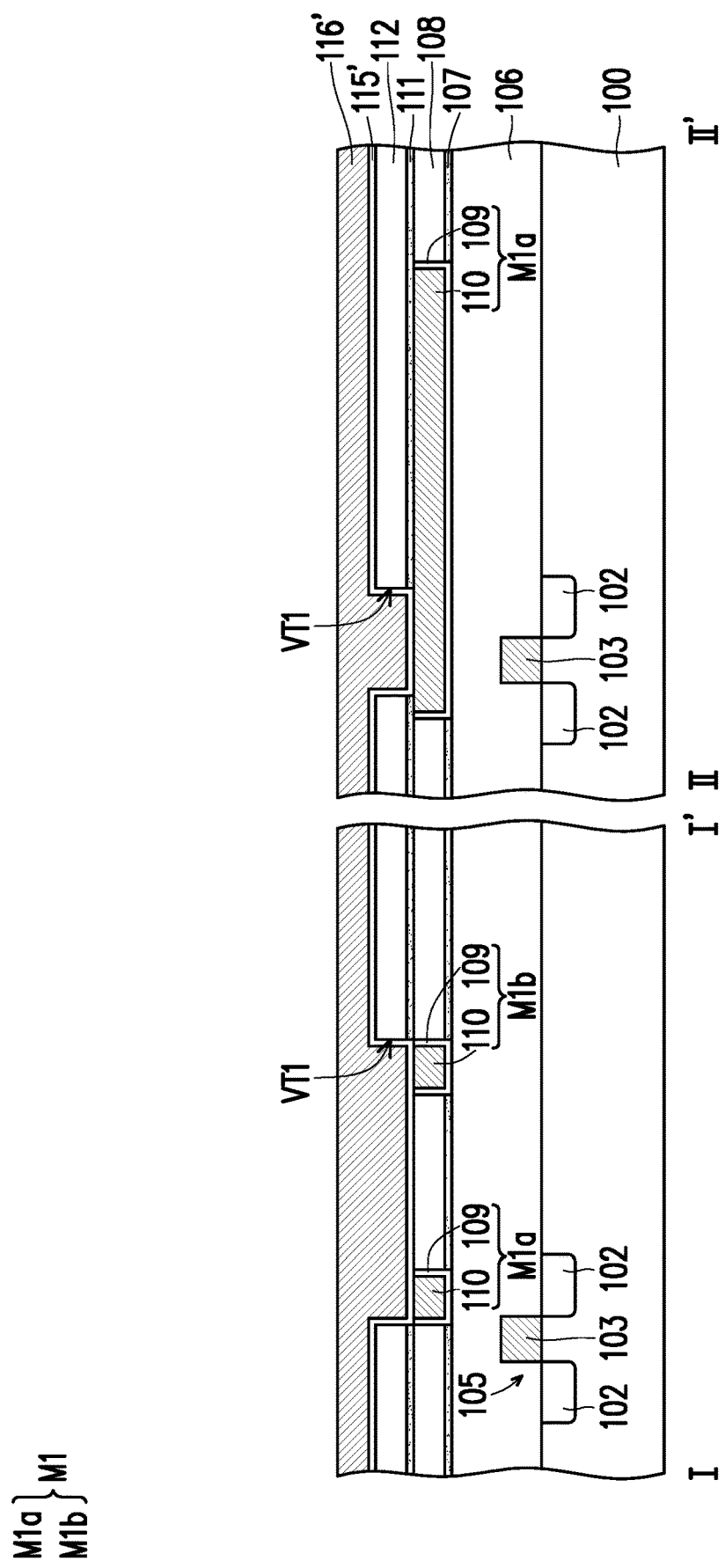

Referring to FIG. 2C and FIG. 2D, the patterned mask layer 113a is removed by an ashing process or a stripping process, for example. A barrier material layer 115' and a conductive material layer 116' are then formed over the substrate 100. In some embodiments, the barrier material layer 115' and the conductive material layer 116' overfill the via trench VT1 and cover the top surface of the dielectric layer 112. The barrier material layer 115' may include titanium, tantalum, titanium nitride, tantalum nitride, manganese nitride or a combination thereof. The conductive material layer 116' may include metal and/or metal alloy, such as, copper (Cu), tungsten (W), Ru, Ir, Ni, Os, Rh, Al, Mo, Co, alloys thereof, or combinations thereof or any other suitable metallic material. The forming method of the barrier material layer 115' and the conductive material layer 116' may include CVD, PVD, electrochemical plating (ECP), electrodeposition (ELD), ALD, or the like or combinations thereof. In some embodiments, a seed layer may be formed between the barrier material layer and the conductive material layer through a sputtering process, for example. In some embodiments, the seed layer may be a copper seed layer and may include a first metal layer such as a titanium layer and a second metal layer such as a copper layer over the first metal layer.

Figure 2E:
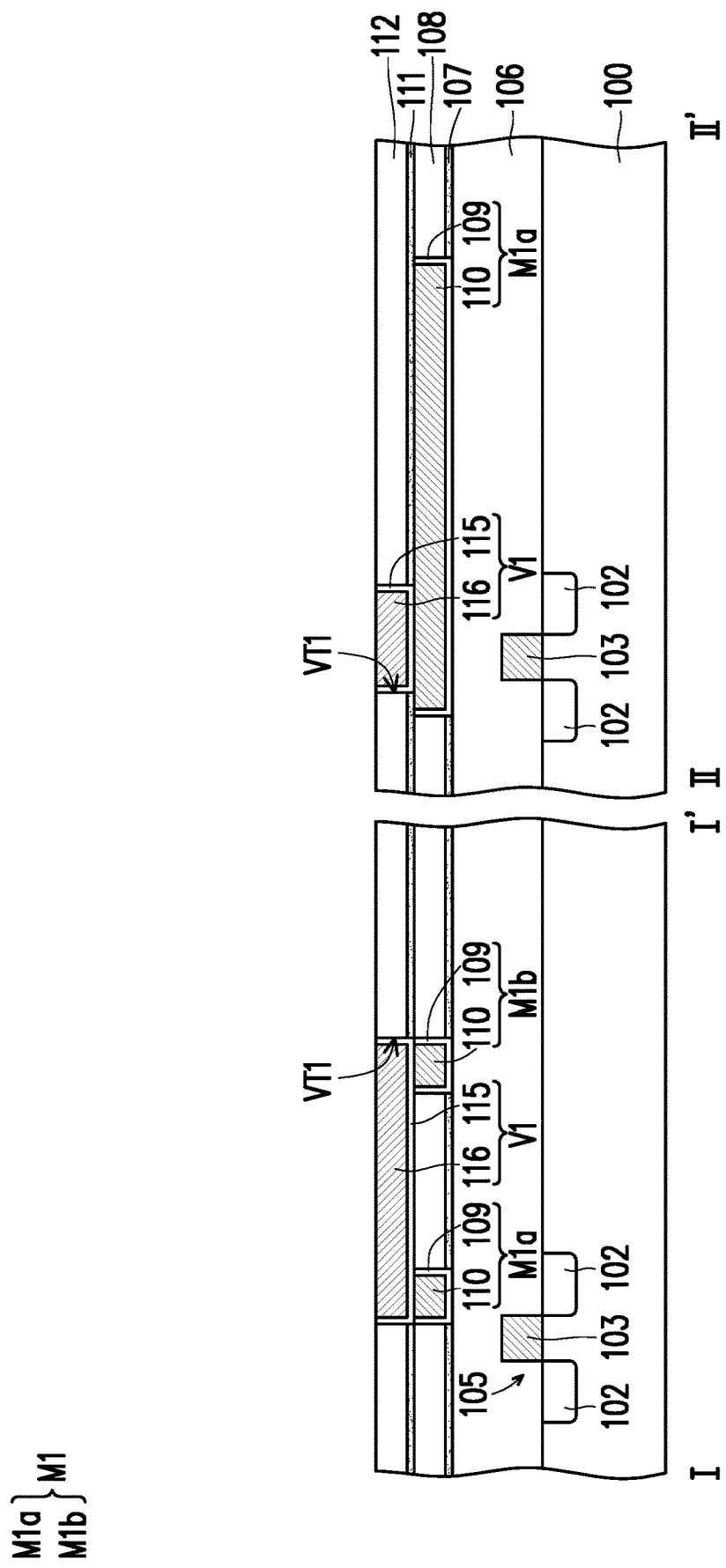

Referring to FIG. 2D and FIG. 2E, thereafter, a planarization process is performed to remove excess portions of the conductive material layer 116' and the barrier material layer 115' over the top surface of the dielectric layer 112, remaining a barrier layer 115 and a conductive layer 116 in the via trench V1 to form the conductive via V1. The conductive via V1 is electrically connected to the conductive lines M1a and M1b. In some embodiments, the conductive via V1 is on and across the two conductive lines M1a and M1b and covers a portion of the top surface of the dielectric layer 108 laterally between the conductive lines M1a and M1b. In some embodiments, the top surfaces of the barrier layer 115 and the dielectric layer 116 of the conductive via V1 are substantially coplanar with the top surface of the dielectric layer 112.

Figure 2F:
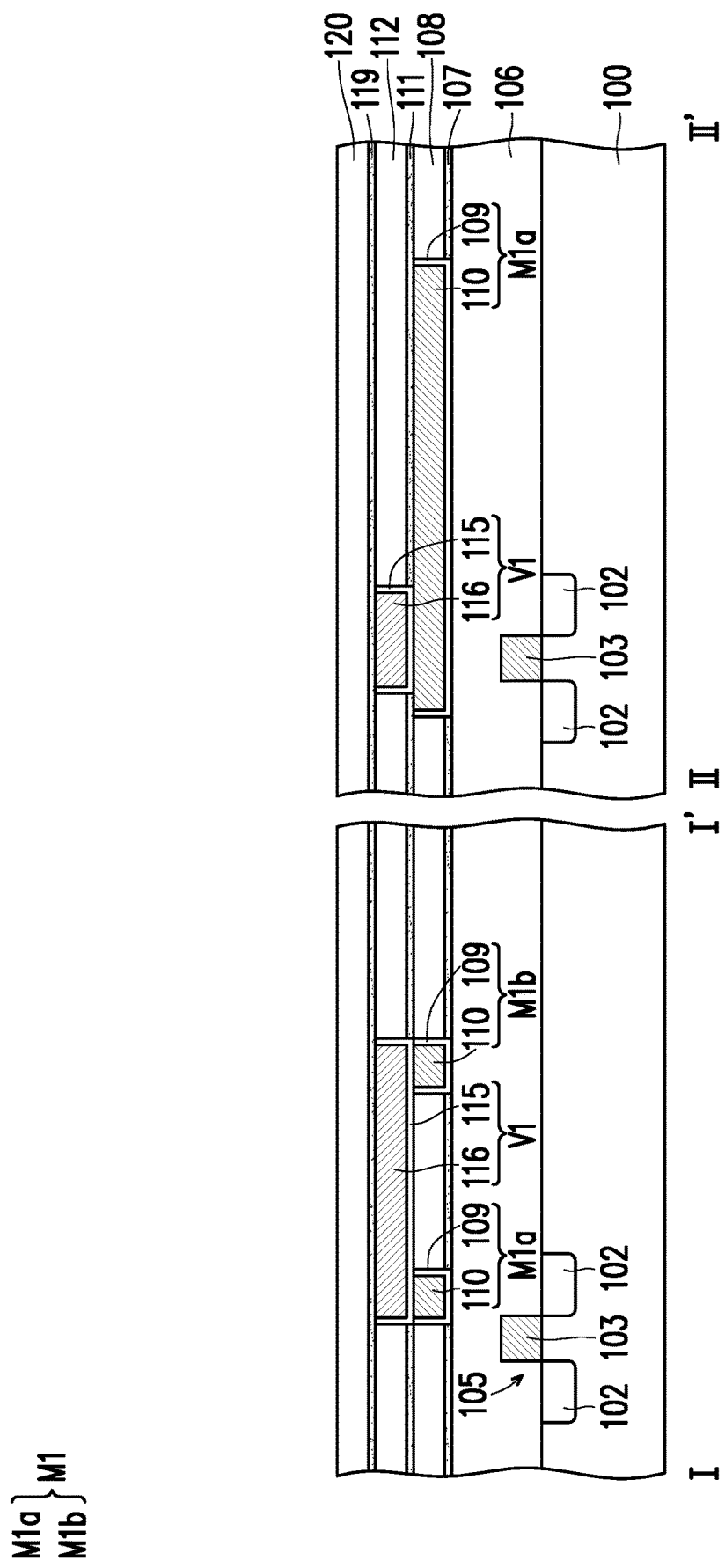

Referring to FIG. 2F, an etching stop layer 119 and a dielectric layer 120 are formed on the conductive via V1 and the dielectric layer 112. The materials and forming methods of the dielectric etching stop layer 119 and the dielectric layer 120 may be selected from the same candidate materials and forming methods of the etching stop layer 111 and the dielectric layer 112, respectively, which are not repeated again herein.

Figure 2G:
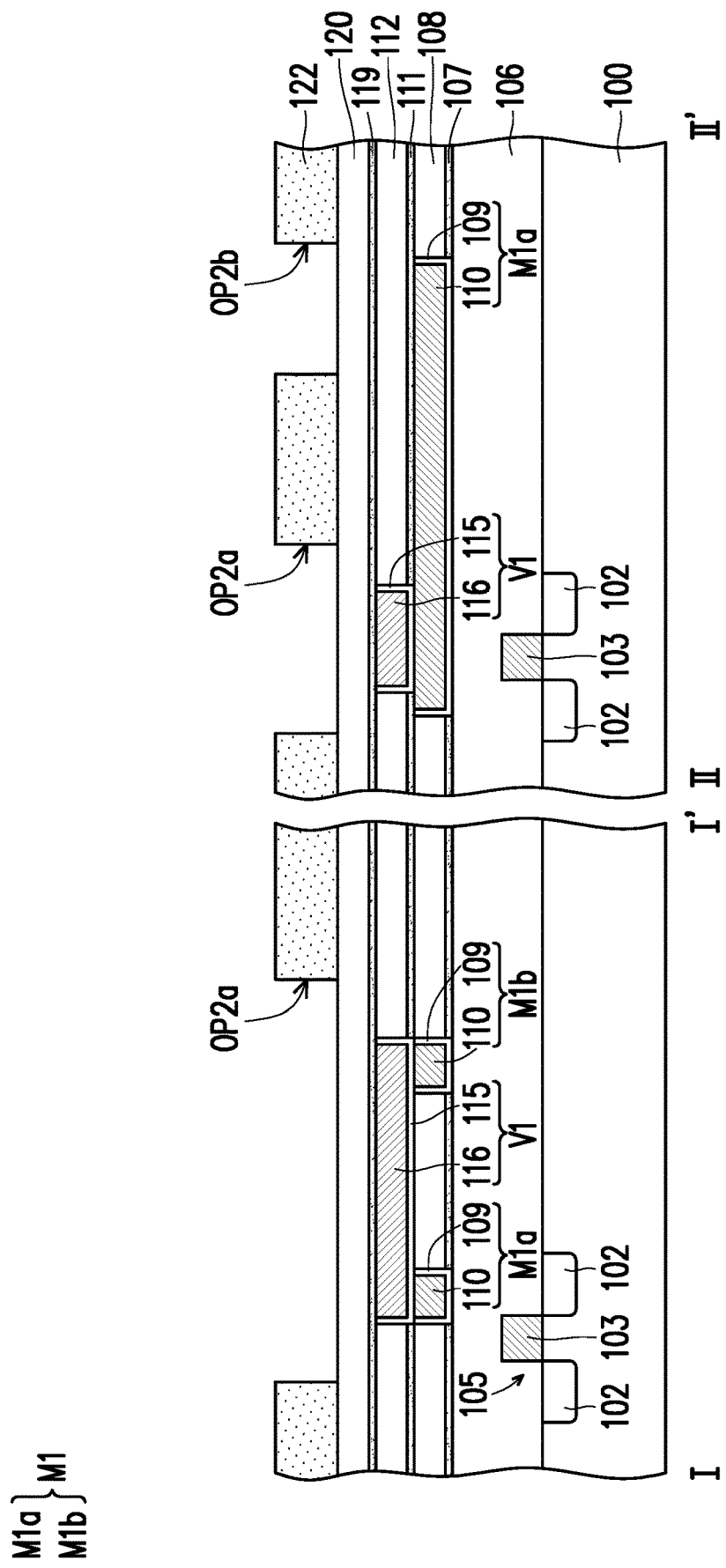

Referring to FIG. 2G, a patterned mask layer 122 is formed on the dielectric layer 120. The patterned mask layer 122 may be a patterned photoresist, and the forming method of the patterned mask layer 122 is substantially similar to that of the above-described patterned mask layer 113a. The patterned mask layer 122 is used for defining conductive line trenches. In some embodiments, the patterned mask layer 122 includes a plurality of openings OP2a and OP2b exposing portions of the top surface of the dielectric layer 120. In some embodiments, the openings OP2a and OP2b are trenches extending along the second direction D2 and arranged along the first direction D1, but the disclosure is not limited thereto. In some embodiments, the opening OP2a is directly over the conductive via V1.

Figure 2H:
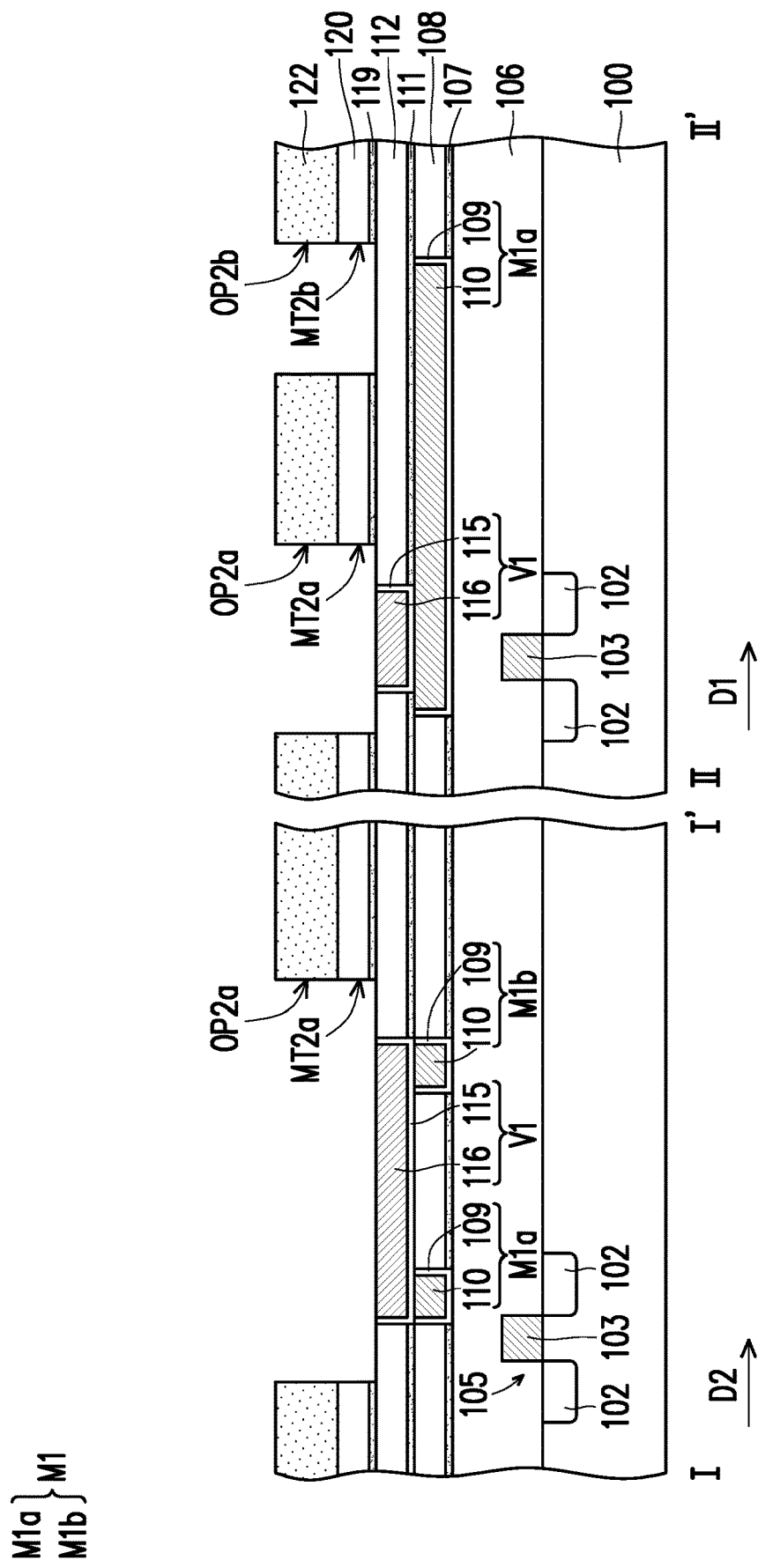

Referring to FIG. 2G and FIG. 2H, thereafter, the dielectric layer 120 and the etching stop layer 119 are patterned using the patterned mask layer 122 as a mask, so as to form conductive line trenches MT2a and MT2b in the dielectric layer 120 and the etching stop layer 119. For example, one or more etching process(es) may be performed with the patterned mask layer 122 as an etching mask, so as to remove portions of the dielectric layer 120 and the etching stop layer 119 exposed by the openings OP2a and OP2b of the patterned mask layer 122. In some embodiments, the conductive line trench MT2a exposes (i.e. completely exposes) the top surface of the conductive via V1 and a portion of the top surface of the dielectric layer 112. The conductive line trench MT2b exposes a portion of the top surface of the dielectric layer 112.

Figure 2I:
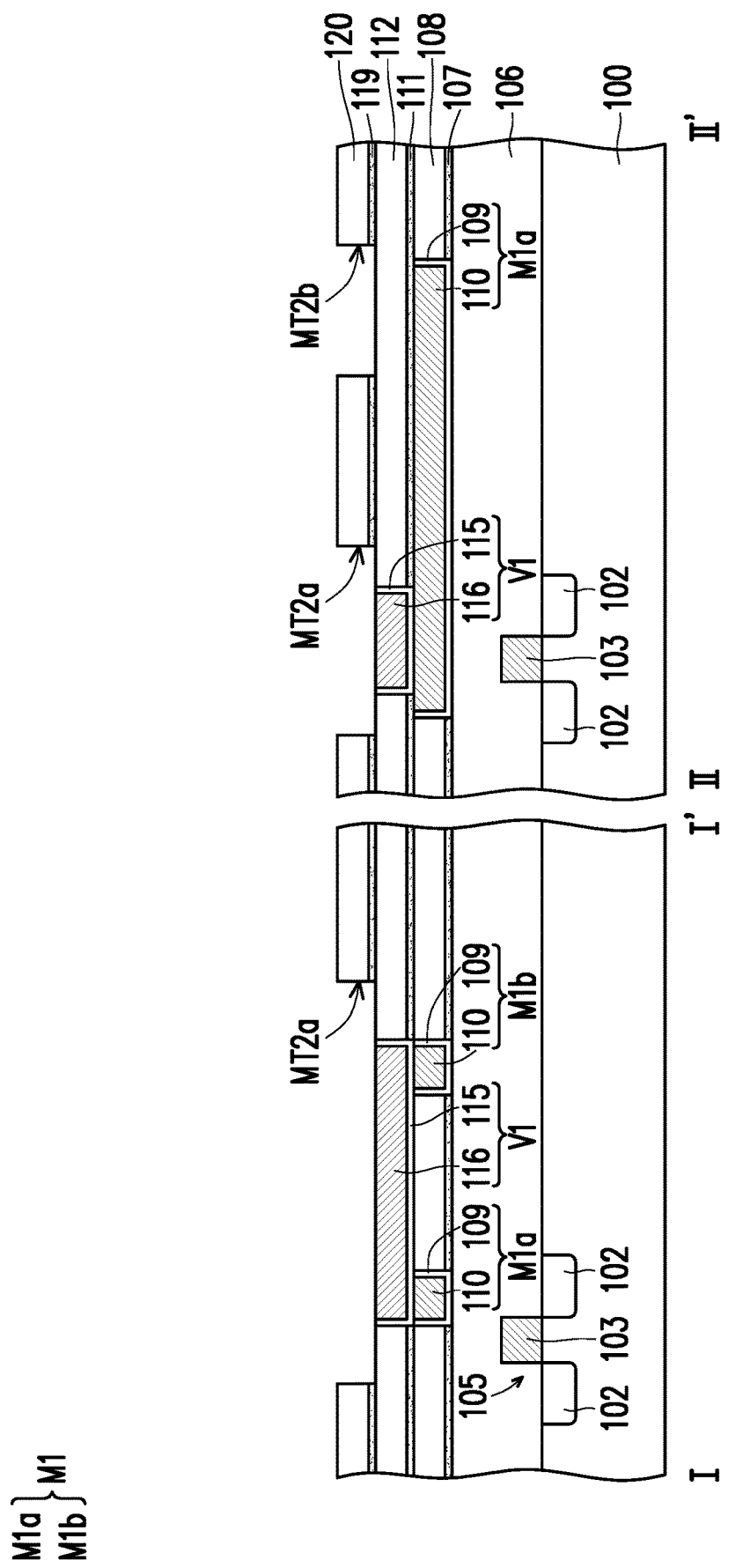
Figure 2J:
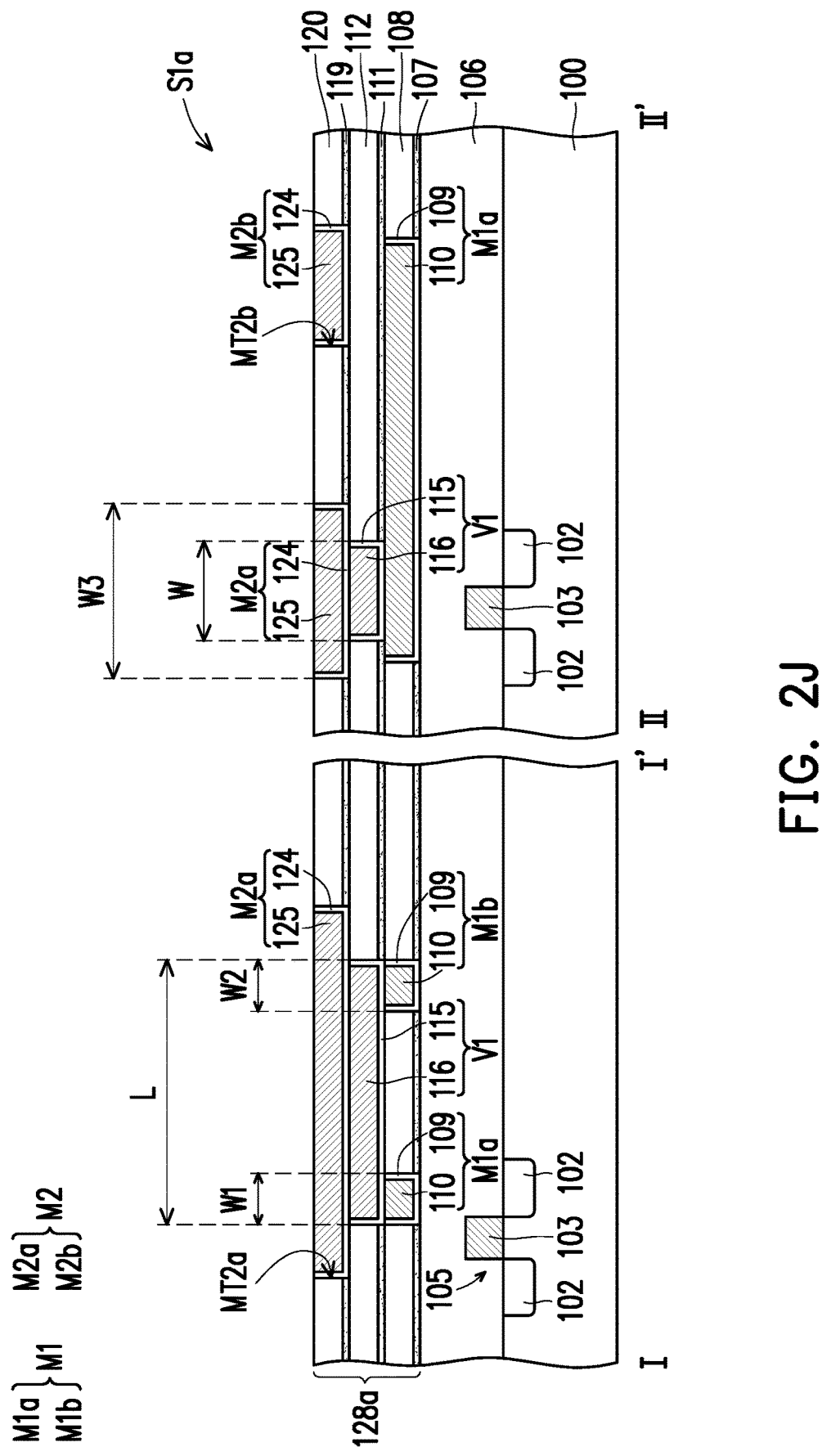

Referring to FIG. 2I and FIG. 2J, the patterned mask layer 122 is then removed, and a barrier layer 124 and a conductive layer 125 are formed in the conductive line trenches MT2a and MT2b, so as to form the second tier conductive layer M2. The material and forming method of the conductive lines M2 are substantially similar to those of the conductive via V1 and the conductive lines M1, which are not described again here. In some embodiments, the barrier layer 124 and the conductive layer 125 in the conductive line trench MT2a constitute the conductive line M2a, while the barrier layer 124 and the conductive layer 125 in the conductive line trench MT2b constitute the conductive line M2b. In some embodiments, further processes maybe performed to formed multi-layers of conductive layers and conductive vias over the second tier conductive layer M2 and the dielectric layer 20 to form an interconnection structure 128a. It should be understood that, the two tiers of conductive layers M1 and M2 of the interconnection structure 128a are shown and described for illustration, and the number of the tiers of conductive layers included in the interconnection structure 128a is not limited thereto. In some embodiments, a semiconductor structure S1a is thus formed.

Referring to FIG. 1 and FIG. 2J, the semiconductor structure S1a includes the substrate 100, the device 105, the interlayer dielectric layer 106 and the interconnection structure 128a. In some embodiments, the interconnection structure 128a includes the dielectric features (the etching stop layers 107, 111 and 119, the dielectric layers 108, 112, and 120) and the conductive features (the first tier conductive layer M1, the conductive via V1 and the second tier conductive layer M2) embedded in the dielectric features.

In some embodiments, the first tier conductive layer M1 includes a first conductive line M1a and a second conductive line M1b. The first conductive line M1a and the second conductive line M1b may be parallel with each other and extend along the first direction D1. In some embodiments, the first conductive line M1a and the second conductive line M1b are immediately adjacent to each other. That is to say, there is free of other conductive lines laterally between the first conductive line M1a and the second conductive line M1b. The second tier conductive layer M2 is disposed over the first tier conductive layer M1, and may include the first conductive line M2a and the second conductive line M2b. In some embodiments, the first conductive line M2a and the second conductive line M2b are parallel with each other and extend along the second direction D2 perpendicular to the first direction D1.

The conductive via V1 is disposed between the first tier conductive layer M1 and the second tier conductive layer M2 to provide electrical connection therebetween. In some embodiments, the conductive via V1 is strip shaped and extends in the second direction D2, which is the same as the extending direction D2 of the conductive lines M2a and M2b and perpendicular to the extending direction D1 of the conductive lines M1a and M1b. In some embodiments, the conductive via V1 is directly underlying the conductive line M2a and across the conductive lines M1a and M1b, such that the conductive lines M1a and M1b are electrically connected to each other through the conductive via V1, and the conductive line M2a is electrically connected to the conductive lines M1a and M1b through the conductive via V1. In some embodiments, the conductive line M2b is spaced from the conductive line M2a by the dielectric features (dielectric layer 120/etching stop layer 119) therebetween. The conductive line M2b may be electrically connected to the conductive lines M2a through other conductive via and/or conductive lines (not shown).

The conductive via V1 is across the conductive line M1a and the conductive line M1b and covers a portion of the top surface of the dielectric layer 108 laterally between the conductive line M1a and the conductive line M1b. In other words, the conductive via V1 is overlapped with the conductive line M2a, the conductive lines M1a and M1b, the dielectric layer 108 and the etching stop layer 107 in a direction perpendicular to the top surface of the substrate 100. In some embodiments, the orthogonal projection of the conductive via V1 on the top surface of the substrate 100 is located within the orthogonal projection of the conductive line M2a on the top surface of the substrate 100, and may be perpendicular to the orthogonal projection of the conductive line M1a on the top surface of the substrate 100.

Still referring to FIG. 1 and FIG. 2J, the length L of the conductive via V1 in the second direction D2 is larger than the width W1 of the conductive line M1a and the width W2 of the conductive line M1b, and less than the length of the conductive line M2a in the direction D2. In some embodiments, the length L of the conductive via V1 is larger than the sum (W1+W2) of the widths W1 and W2 of the conductive lines M1a and M1b. In some embodiments, the opposing sidewalls of the conductive via V1 in the direction D2 are substantially aligned with a sidewall of the conductive line M1a and a sidewall of the conductive line M1b, respectively. However, the disclosure is not limited thereto. In alternative embodiments, the opposing sidewalls of the conductive via V1 in the direction D2 may be laterally offset from the sidewall of the conductive line M1a and/or the sidewall of the conductive line M1b.

In some embodiments, the width W of the conductive via V1 in the direction D1 is less than the width W3 of the conductive line M2a in the direction D1, and the opposing sidewalls of the conductive via V1 in the direction D1 may be laterally offset from the opposing sidewalls of the conductive line M2a in the direction D1. However, the disclosure is not limited thereto. In alternative embodiments, one or both of the opposing sidewalls of the conductive via V1 in the direction D1 may be substantially aligned with the corresponding one or both of the opposing sidewalls of the conductive line M2a in the direction D1.

FIG. 3A to FIG. 3I are schematic cross-sectional views illustrating a method of forming a semiconductor structure according to a second illustrative embodiment of the disclosure. Specifically, FIG. 3A to FIG. 3I illustrates cross-sectional views of intermediate stages of forming an interconnection structure having the top view of FIG. 1. FIG. 3A to FIG. 3J corresponds to cross-sectional views of intermediate stages taken along I-I' line and II-II' line of FIG. 1. The second illustrative embodiment differs from the first illustrative embodiment in that, the conductive via and second tier conducive layer are formed by single-damascene process in the first illustrative embodiment, while the second illustrative embodiment utilizes dual-damascene (trench first) process to form the conductive via and the second tier conductive layer.

Figure 3A:
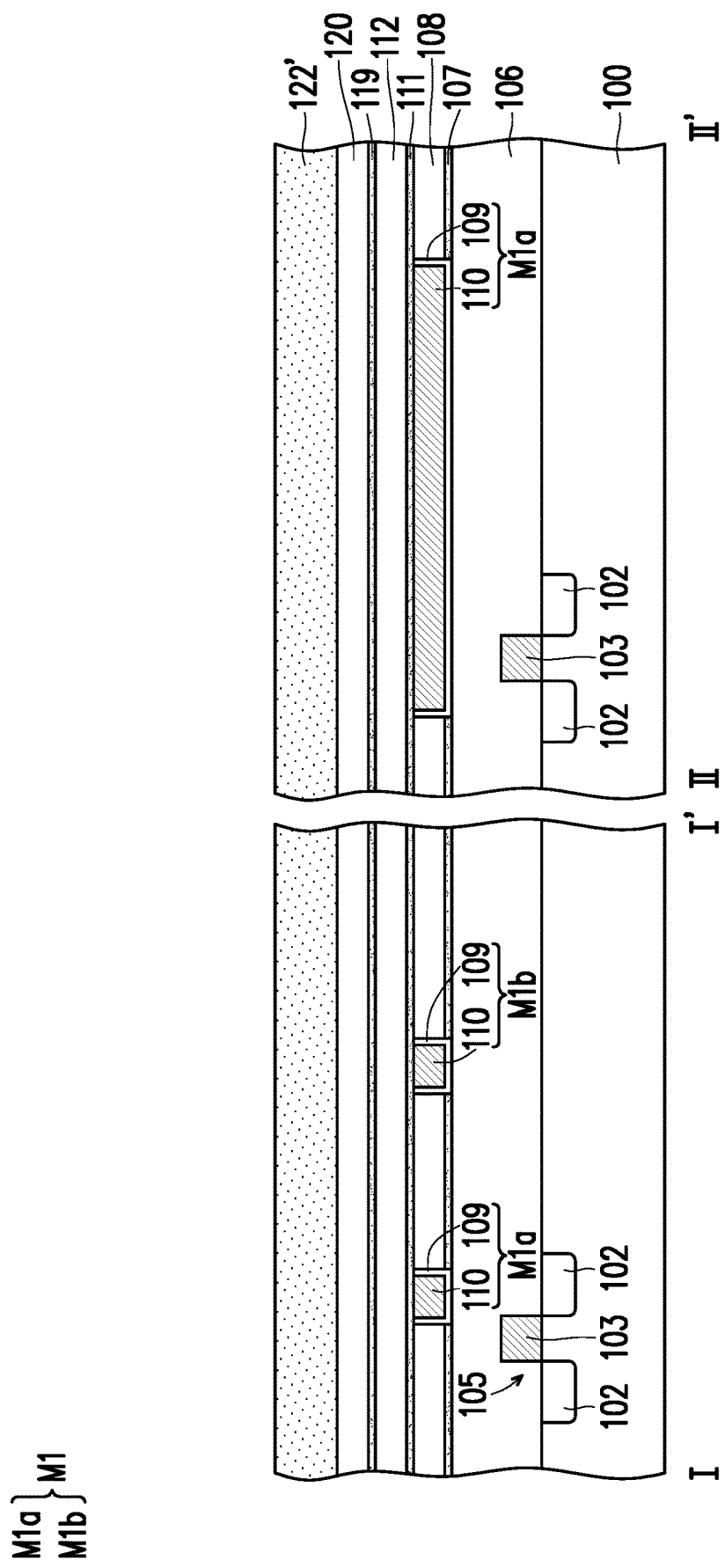
FIG. 3A through FIG. 3I are schematic cross-sectional views illustrating intermediate stages for forming a semiconductor structure according to a second embodiment of the disclosure.

Referring to FIG. 3A, in some embodiments, after the etching stop layer 111 and the dielectric layer 112 are formed on the first tier conductive layer M1 and dielectric layer 108, the etching stop layer 119 and the dielectric layer 120 are sequentially formed on the dielectric layer 112. Thereafter, a mask layer 122' is formed on the dielectric layer 120. The mask layer 122' includes a photoresist, for example.

Figure 3B:
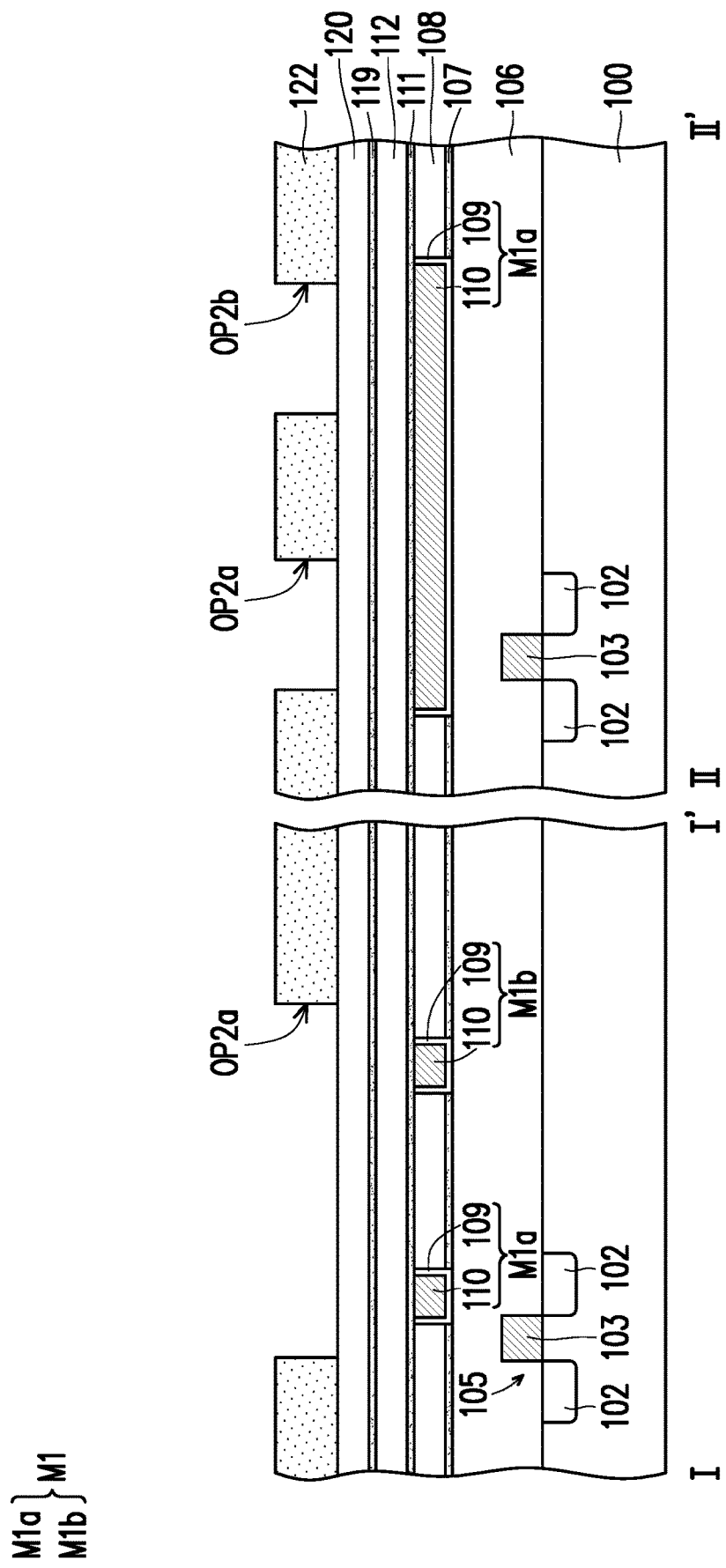

Referring to FIG. 3B, the mask layer 122' is patterned by, for example, exposure and development process, so as to form a patterned mask layer 122 having openings OP2a and OP2b for defining conductive line trenches. The openings OP2a and OP2b expose portions of the top surface of the dielectric layer 120. In some embodiments, the openings OP2 are trenches parallel with each other and extending along the second direction D2. The structure of the patterned mask layer 122 are substantially the same as those described in the first illustrative embodiment.

Figure 3C:
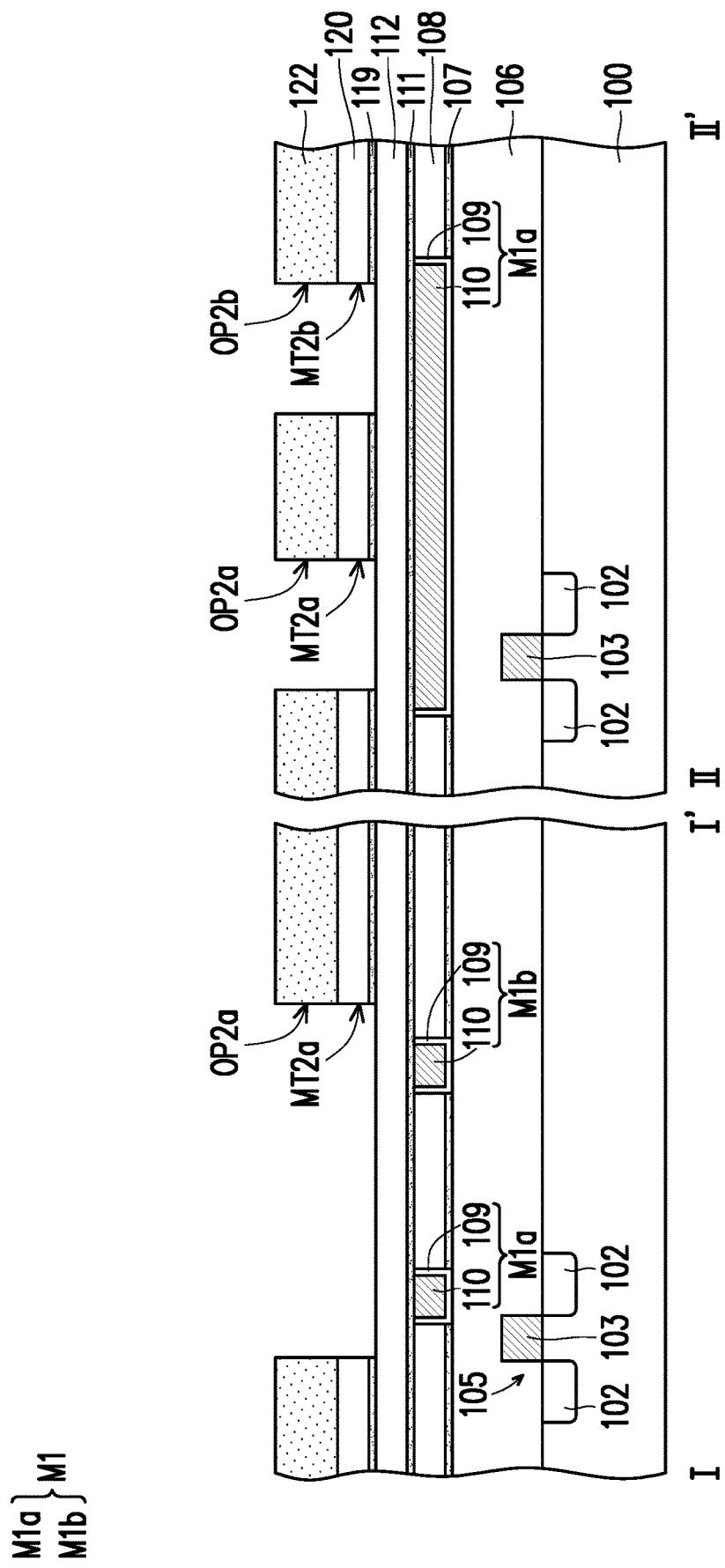

Referring to FIG. 3B and FIG. 3C, the dielectric layer 120 and the etching stop layer 119 are patterned using the patterned mask layer 122 as a mask, so as to form conductive line trenches MT2a and MT2b in the dielectric layer 120 and the etching stop layer 119. For example, portions of the dielectric layer 120 and the etching stop layer 119 are removed by etching process(es) using the patterned mask layer 122 as an etching mask, such that the pattern of the patterned mask layer 122 is transferred into the dielectric layer 120 and the etching stop layer 119. In some embodiments, the etching process is stopped when the etching stop layer 119 is removed and the top surface of the dielectric layer 112 is exposed.

Figure 3D:
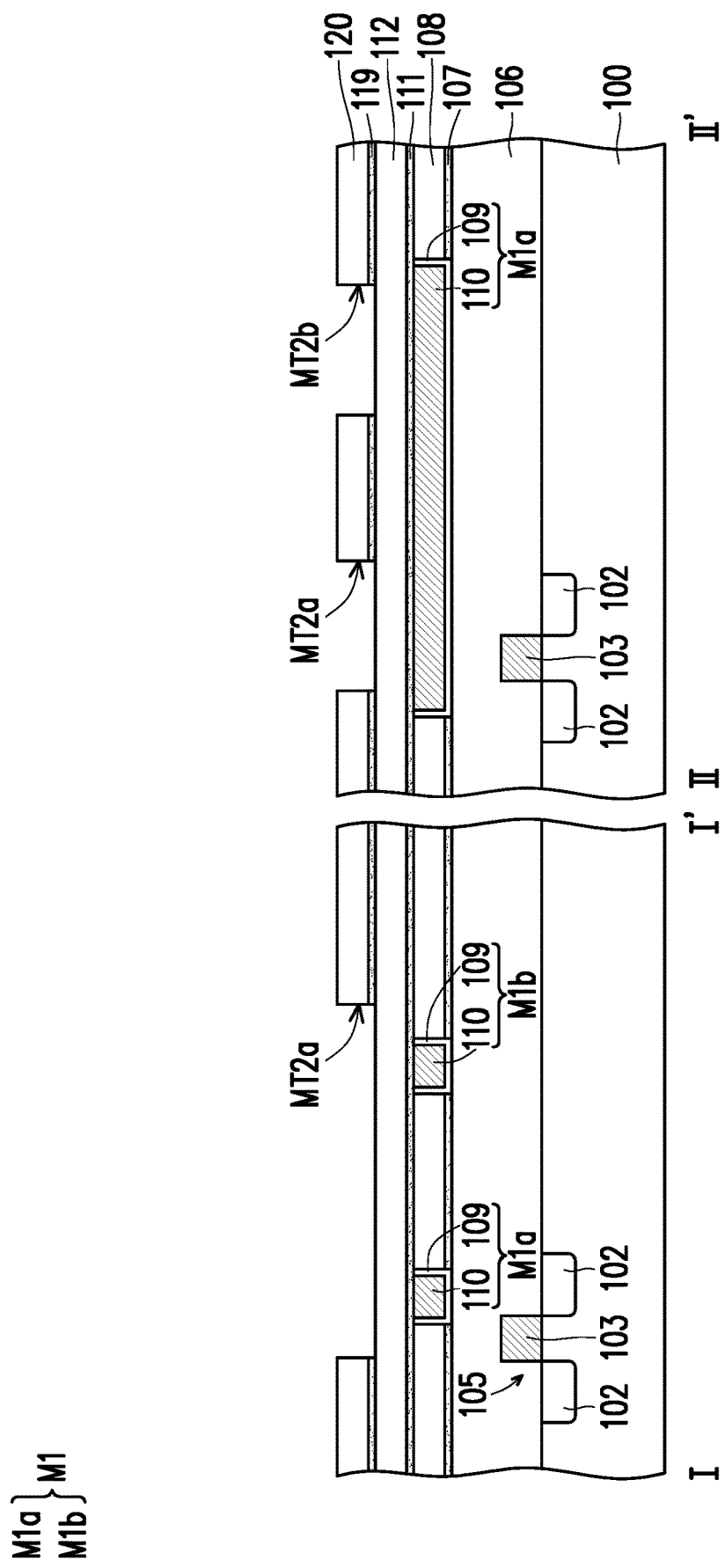
Figure 3E:
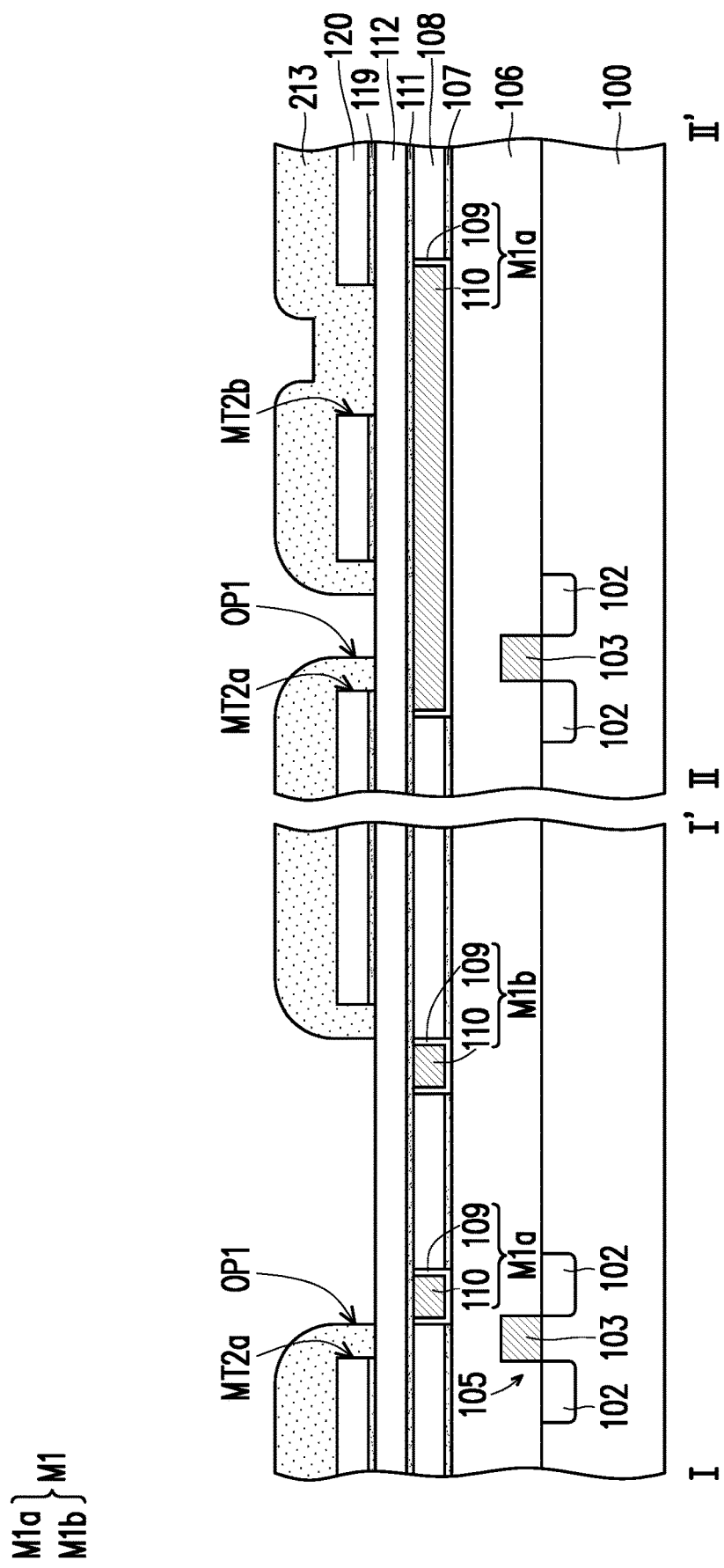

Referring to FIG. 3D and FIG. 3E, the patterned mask layer 122 is removed, and a patterned mask layer 213 is formed over the substrate 100. The patterned mask layer 213 has an opening OP1 and is used for defining the via trench. In some embodiments, the patterned mask layer 213 has a pattern similar to that of the patterned mask layer 113a (FIG. 2B), the difference lies that portions of the patterned mask layer 213 fills into the conductive line trenches MT2a and MT2b.

Referring to FIG. 3E, the patterned mask layer 213 covers the top surface of the dielectric layer 120 and partially fills into the conductive line trench MT2a to cover a portion of the top surface of the dielectric layer 112 previously exposed by the conductive line trench MT2a. In some embodiments, the conductive line trench MT2b is filled by the patterned mask layer 213, and the top surface of the dielectric layer 112 previously exposed by the conductive line trench MT2a is substantially completely covered by the patterned mask layer 213. The opening OP1 of the patterned mask layer 213 is located within the conductive line trench MT2a and has a dimension less than that of the conductive line trench MT2a. The opening OP1 exposes a portion of the top surface of the dielectric layer 112.

Figure 3F:
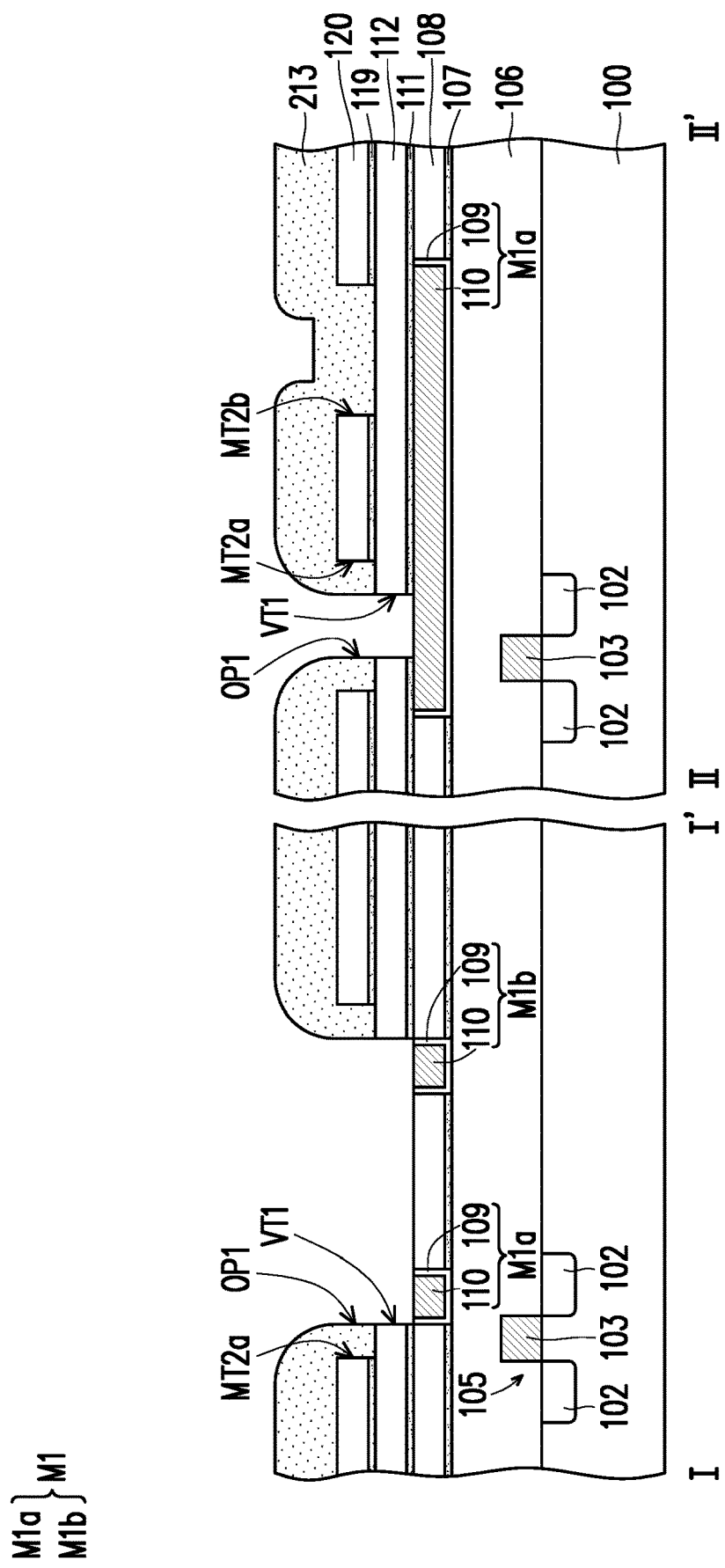

Referring to FIG. 3F, portions of the dielectric layer 112 and the etching stop layer 111 exposed by the opening OP1 are removed by one or more etching process(es) with the patterned mask layer 213 as an etching mask, so as to form a via trench VT1 in the dielectric layer 112 and the etching stop layer 111. The via trench VT1 extends along the direction D2 and exposes top surfaces of the conductive lines M1 and a portion of the top surface of the dielectric layer 108 laterally between the conductive lines M1.

Figure 3G:
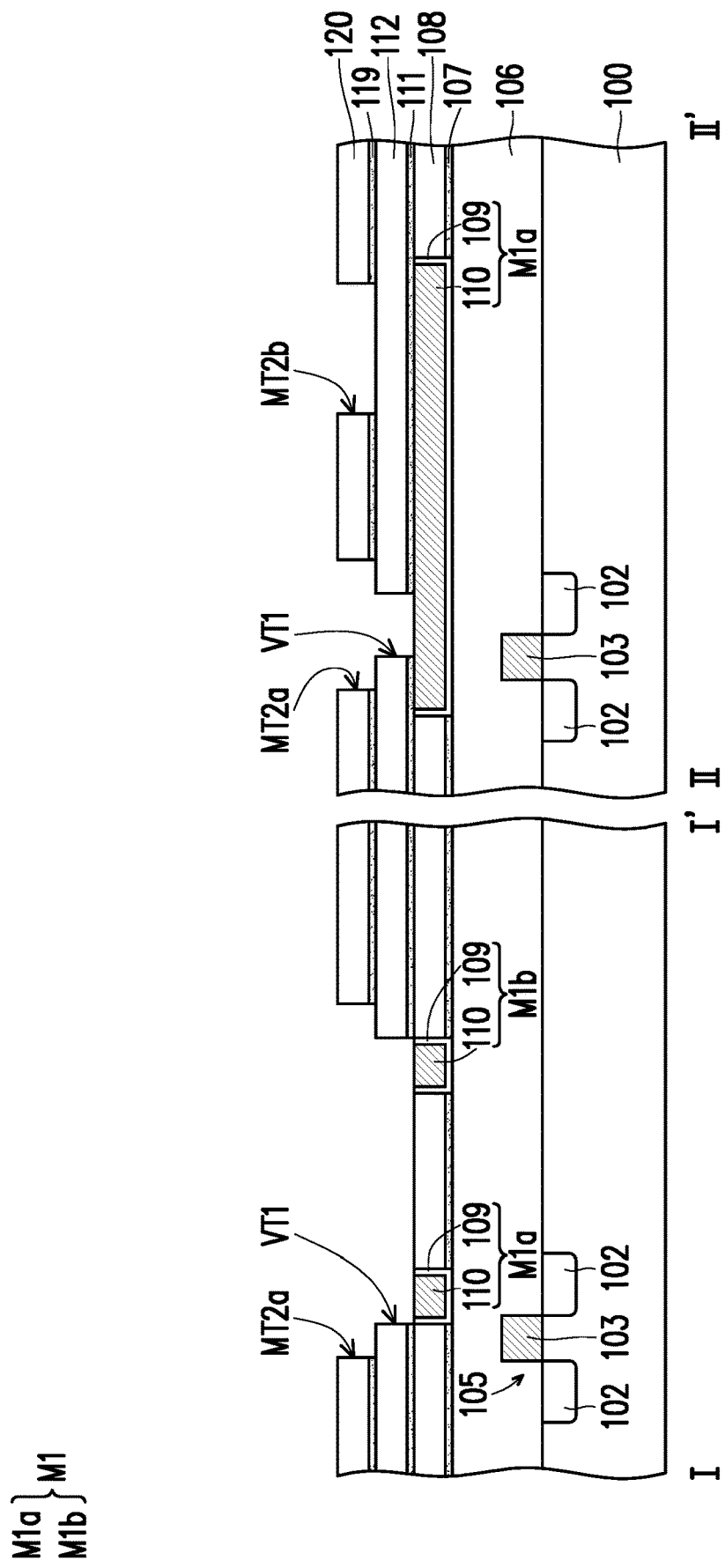

Referring to FIG. 3G, the patterned mask layer 213 (FIG. 3F) is removed by stripping or ashing process, for example. As such, the conductive line trenches MT2a and MT2b are formed in the dielectric layer 120 and the etching stop layer 119, and the via trench VT1 is formed in the dielectric layer 112 and the etching stop layer 111. In some embodiments, the conductive line trench MT2a is overlapped with and in spatial communication with the via trench VT1. The conductive line trench MT2a has a larger dimension than the via trench VT1. The conductive line trench MT2b is spaced from the conductive line trench MT2a.

Figure 3H:
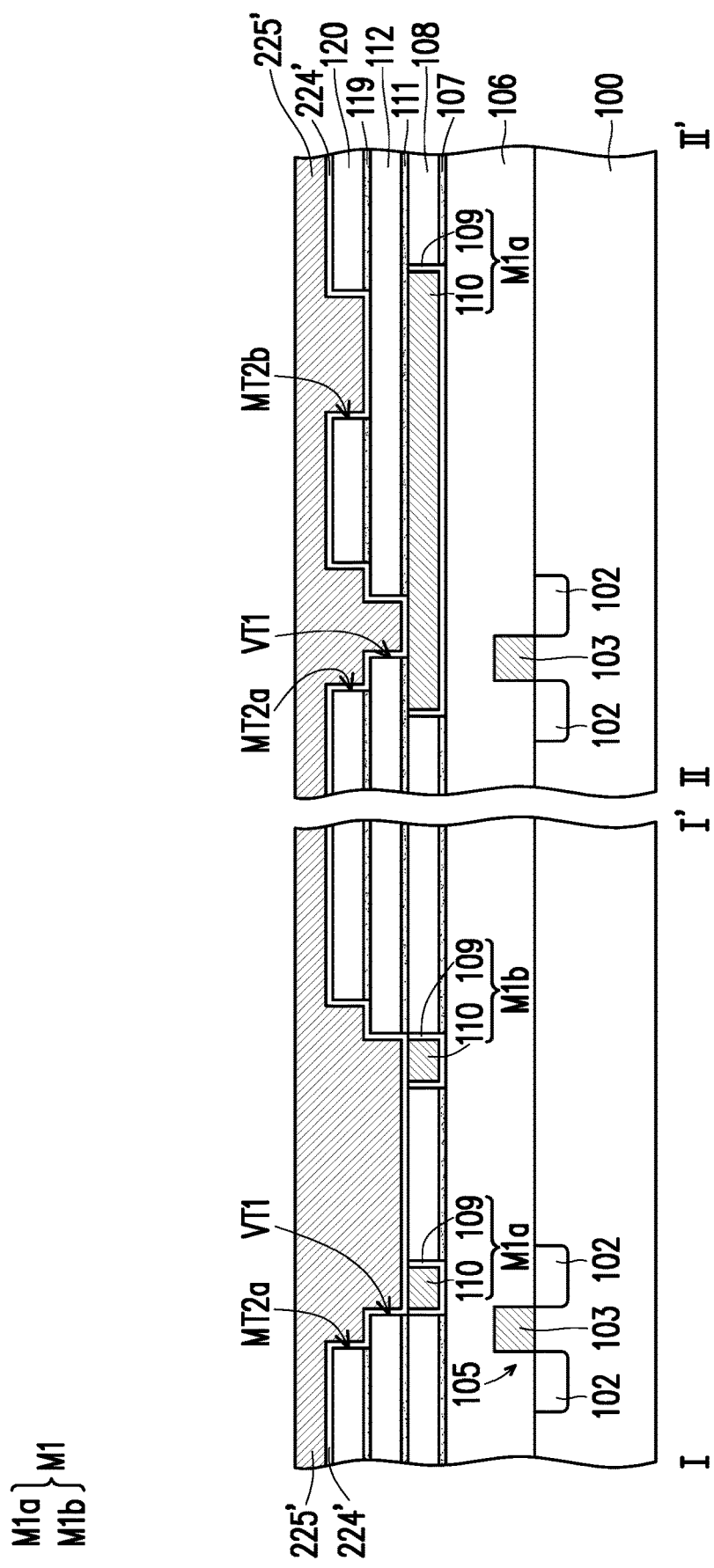

Referring to FIG. 3H, a barrier material layer 224' and a conductive layer 225' are formed over the substrate 100 to fill the conductive line trenches MT2a and MT2b and the via trench VT1. In some embodiments, the barrier material layer 224' and the conductive material layer 225' overfill the conductive line trenches MT2a and MT2b and the via trench VT1 and cover the top surface of the dielectric layer 120. The material and forming method of the barrier layer and conductive layer are similar to those described in the foregoing embodiments.

Figure 3I:
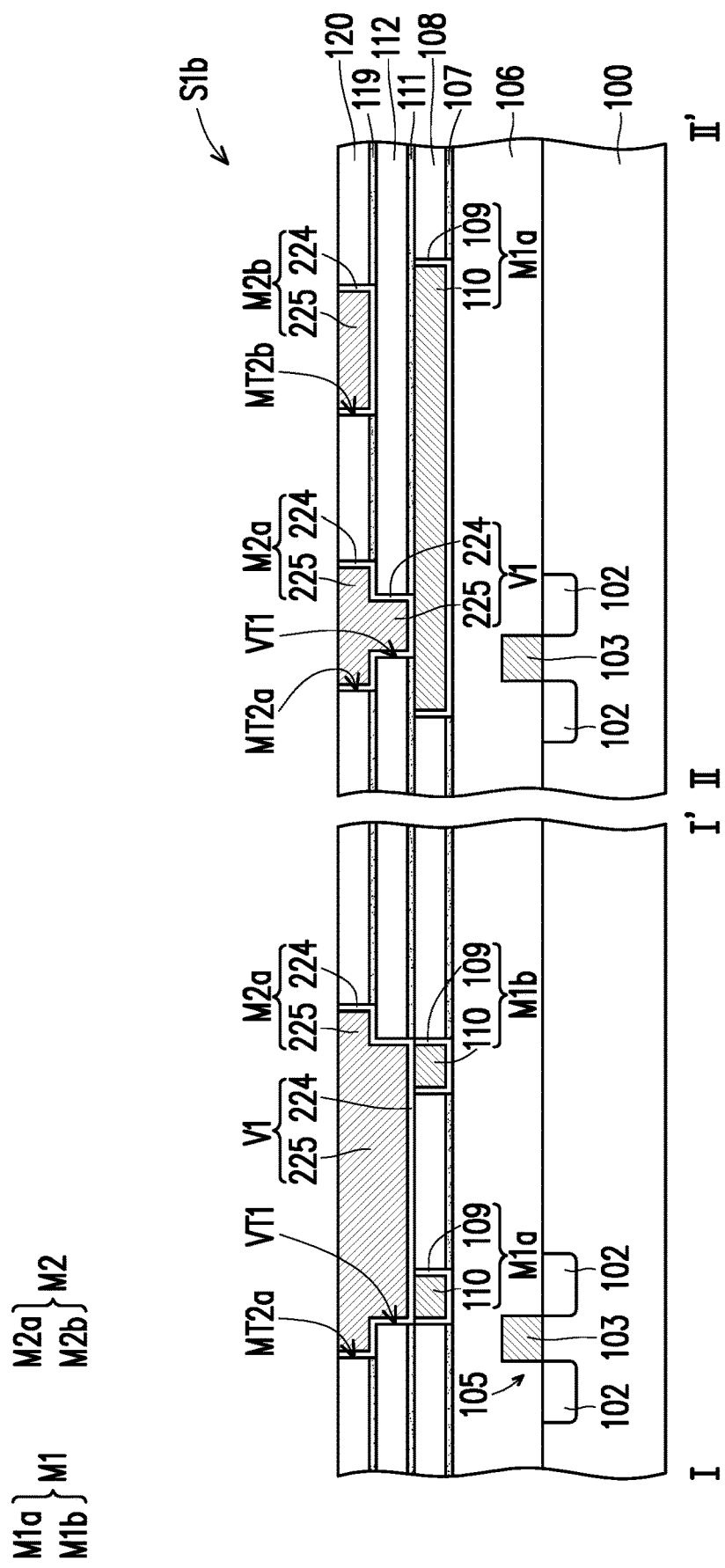

Referring to FIG. 3H and FIG. 3I, a planarization process is then performed to remove excess portions of the conductive material layer 225' and the barrier material layer 224' over the top surface of the dielectric layer 120, remaining a barrier layer 224 and a conductive layer 225 in the conductive line trenches MT2a and MT2b and the via trench VT1 to form the second tier conductive layer M2 and the conductive via V1. The second tier conductive layer M2 includes a conductive line M2a and a conductive line M2b.

Specifically, the conductive layer 225 and the barrier layer 224 within the conductive line trench MT2a constitute the conductive line M2a; the conductive layer 225 and the barrier layer 224 within the conductive line trench MT2b constitute the conductive line M2b; the conductive layer 225 and the barrier layer 224 within the via trench VT1 constitute the conductive via V1. The conductive via V1 is located vertically between the conductive line M2a and the conductive lines M1a to provide the electrical connection therebetween.

Referring to FIG. 3I, a semiconductor structure S1b is thus formed. The semiconductor structure S1b includes the substrate 100, the device 105, and the interconnection structure 128a. The interconnection structure 128a includes the first tier conductive layer M1, the conductive via V1 and the second tier conductive layer M2. In the present embodiment, the conductive via V1 and the second tire of conductive layer M2 are formed simultaneously by a trench first dual-damascene process. The conductive via V1 and the overlying conductive line M2a share the barrier layer 224 and the conductive layer 225, and there is free of interface between the conductive via V1 and the conductive line M2a. The other structural features of the semiconductor structure S1b are substantially the same as those of the above-described semiconductor structure S1a (FIG. 2J), which are not repeated again here.

FIG. 4A to FIG. 4I are schematic cross-sectional views illustrating a method of forming a semiconductor structure according to a third illustrative embodiment of the disclosure. Specifically, FIG. 4A to FIG. 4I illustrates cross-sectional views of intermediate stages of forming an interconnection structure having the top view of FIG. 1. FIG. 4A to FIG. 4I corresponds to cross-sectional views of intermediate stages taken along I-I' line and II-II' line of FIG. 1. The third illustrative embodiment differs from the forgoing embodiments in that, the conductive via and second tier conducive layer are formed by dual-damascene (via first) process.

Figure 4A:
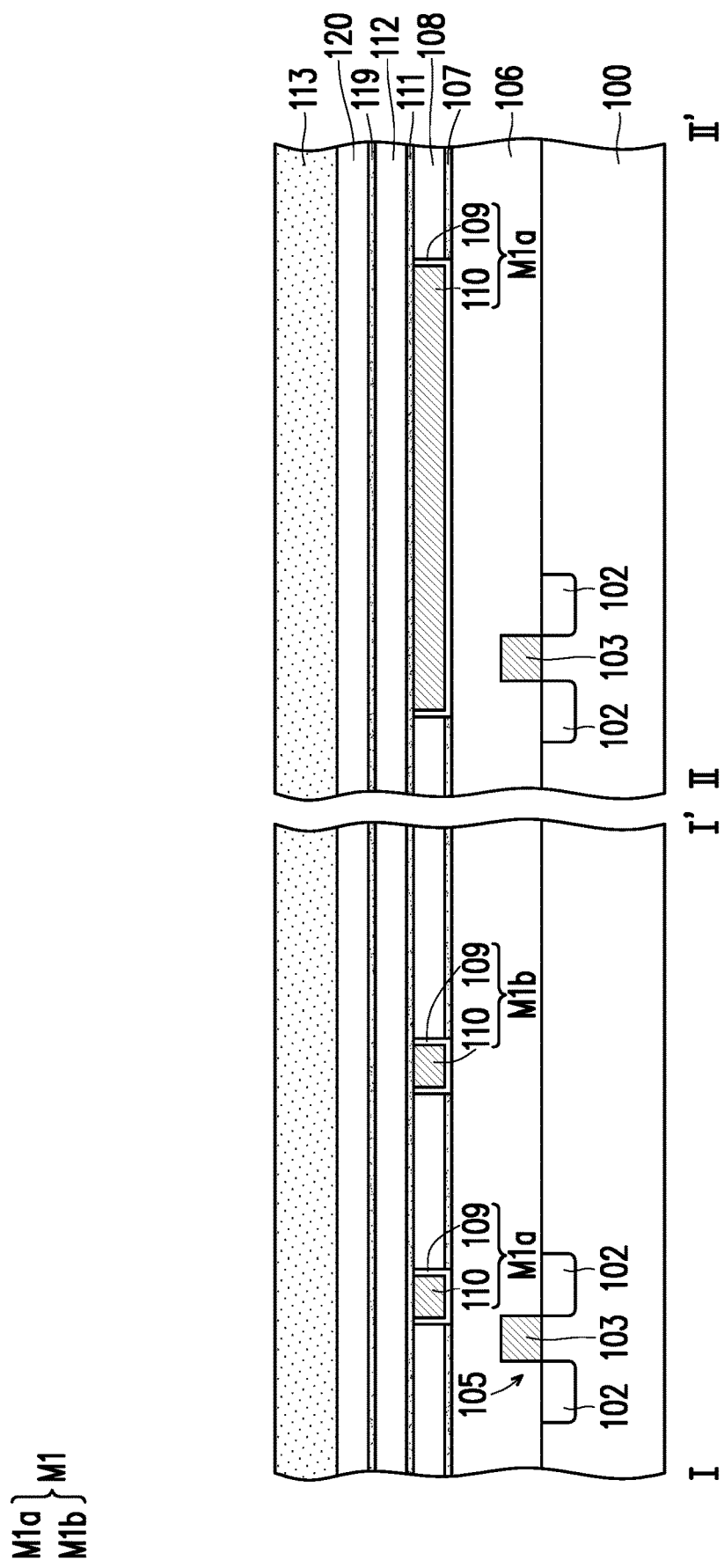
FIG. 4A through FIG. 4I are schematic cross-sectional views illustrating intermediate stages for forming a semiconductor structure according to a third embodiment of the disclosure.

Referring to FIG. 4A, the etching stop layer 111, the dielectric layer 112, the etching stop layer 119 and the dielectric layer 120 are sequentially formed on the first tier conductive layer M1 and the dielectric layer 108, and a mask layer 113 is formed on the dielectric layer 120.

Figure 4B:
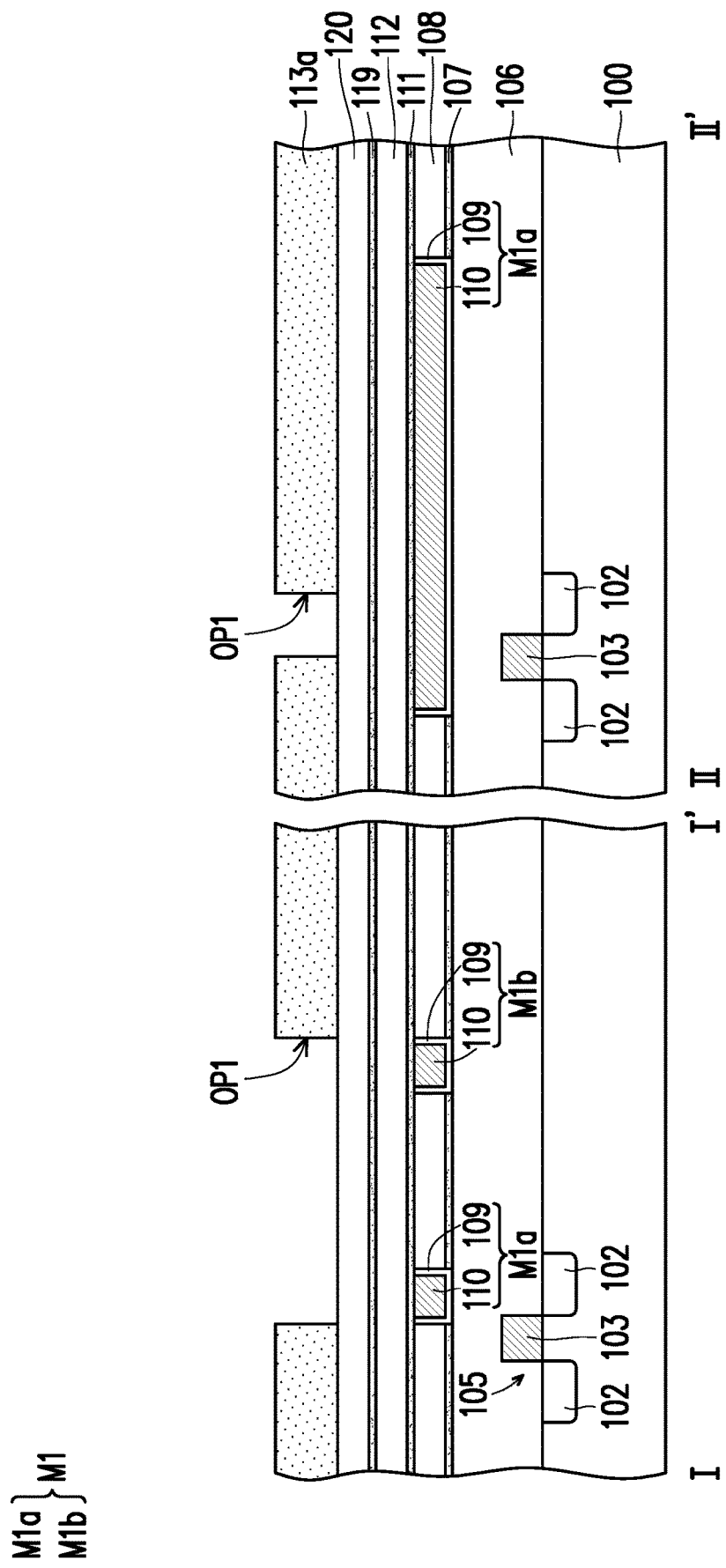

Referring to FIG. 4A and FIG. 4B, the mask layer 113 is patterned to form a patterned mask layer 113a having an opening OP1 for defining a via trench. The opening OP1 exposes a portion of the top surface of the dielectric layer 120. In some embodiments, the opening OP1 is a trench extending along the second direction D2.

Figure 4C:
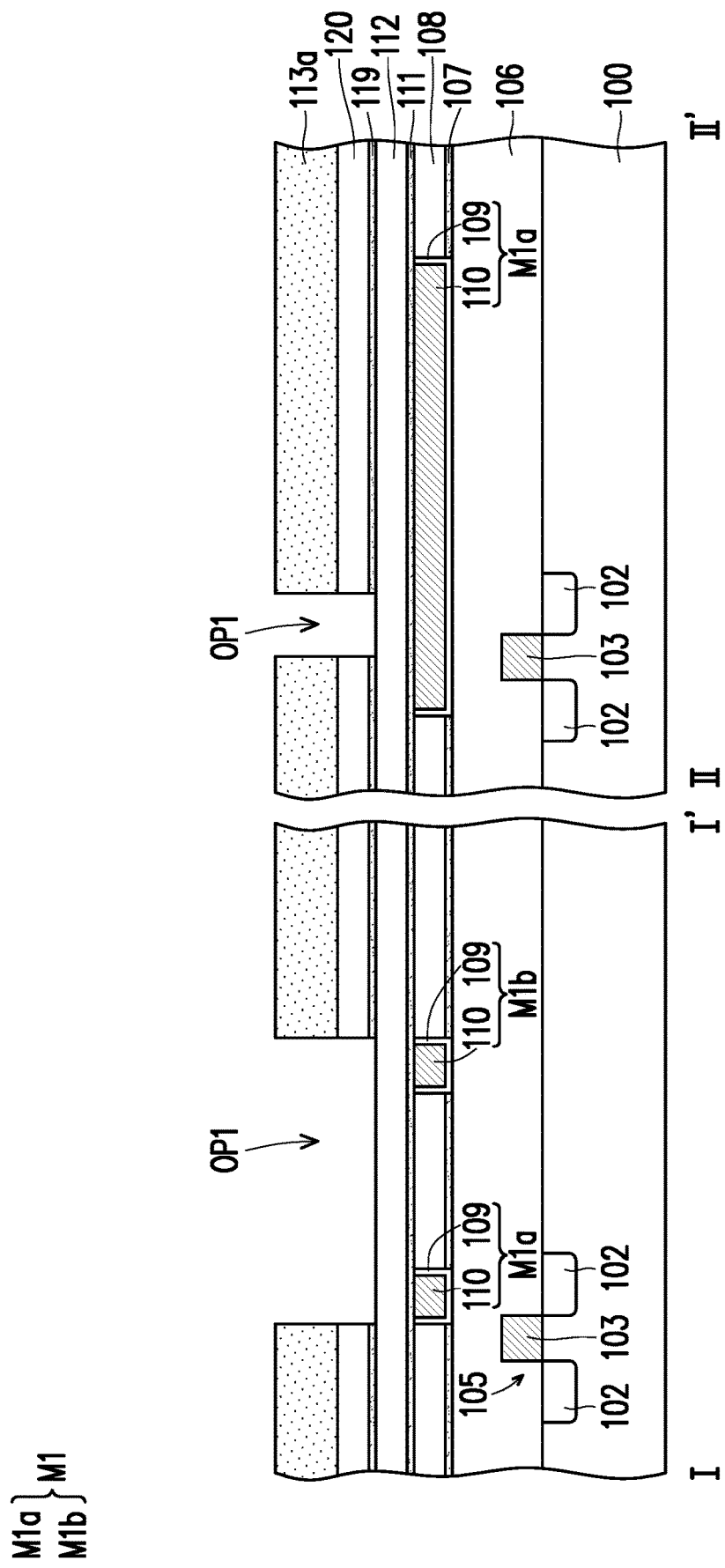

Referring to FIG. 4C, portions of the dielectric layer 120 and the etching stop layer 119 are removed by etching process(es) using the patterned mask layer 113a as an etching mask, such that the opening OP1 extends down into the dielectric layer 120 and the etching stop layer 119. In some embodiments, the etching process stops when the etching stop layer 119 is removed and the top surface of the dielectric layer 112 is exposed.

Figure 4D:
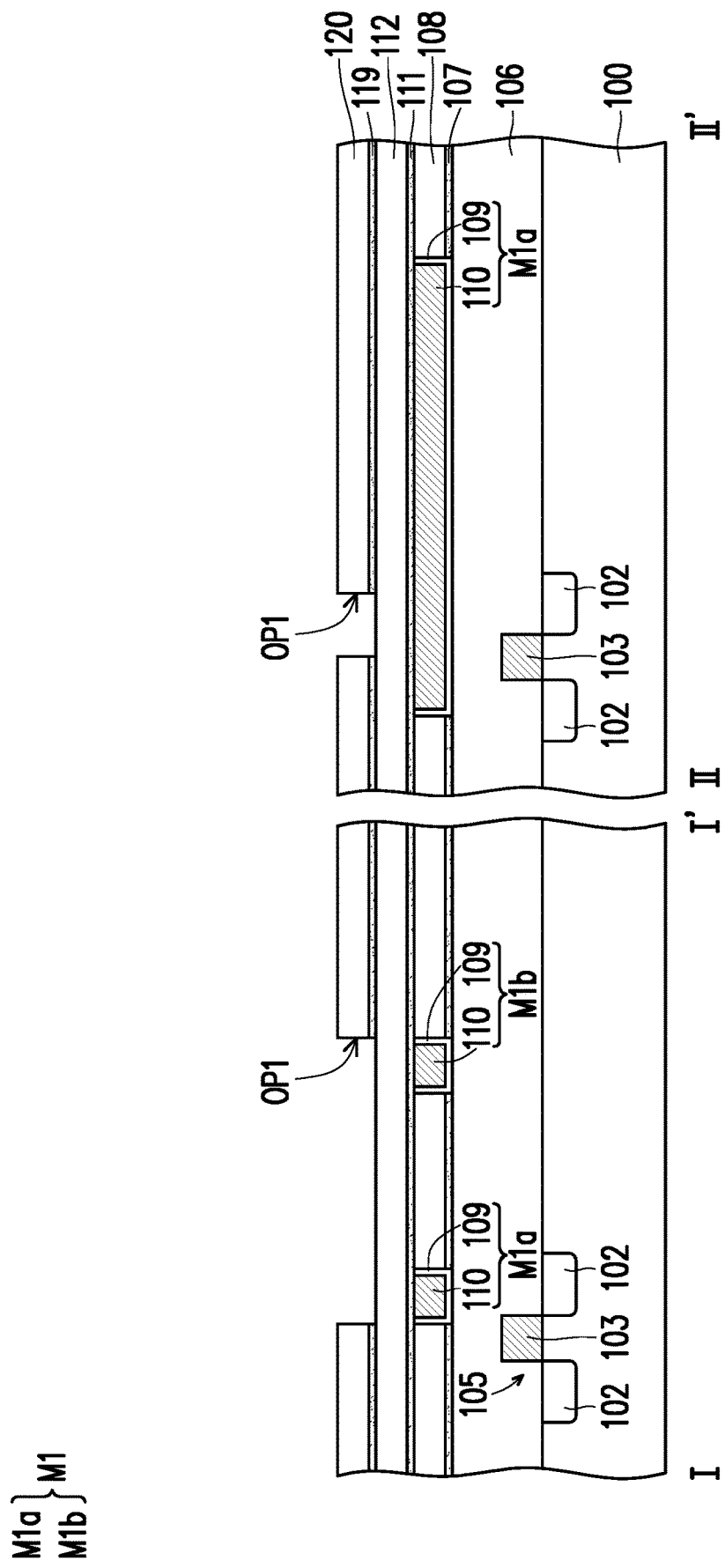
Figure 4E:
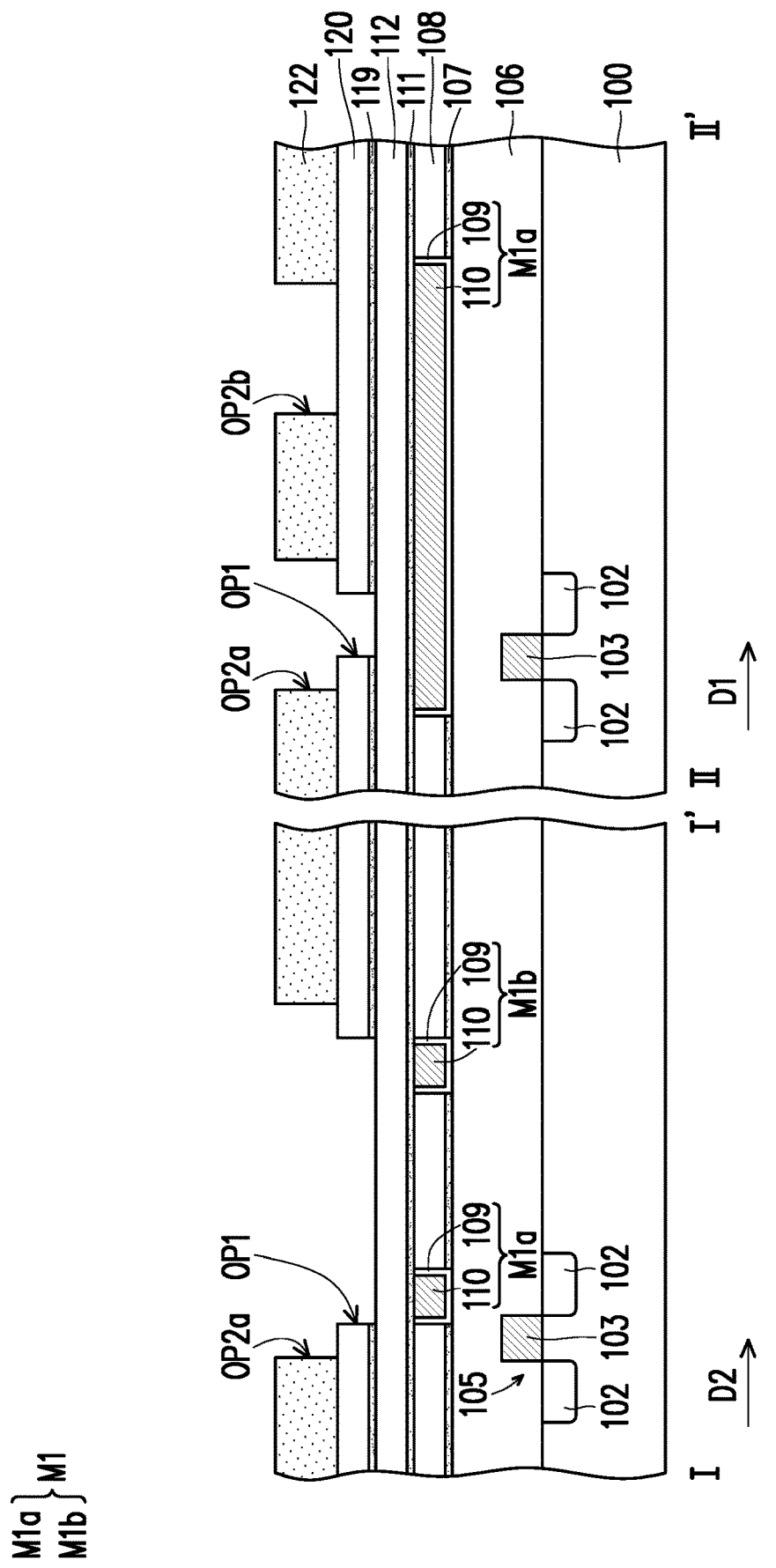

Referring to FIG. 4D and FIG. 4E, the patterned mask layer 113a is removed, and a patterned mask layer 122 is formed on the dielectric layer 120. The patterned mask layer 122 has openings OP2a and OP2b for defining conductive line trenches. In some embodiments, the openings OP2a and OP2b are trenches parallel with each other and extend along the second direction D2. The opening OP2a is directly over and in spatial communication with the opening OP1, and the dimension of the opening OP2a is larger than that of the opening OP1.

Figure 4F:
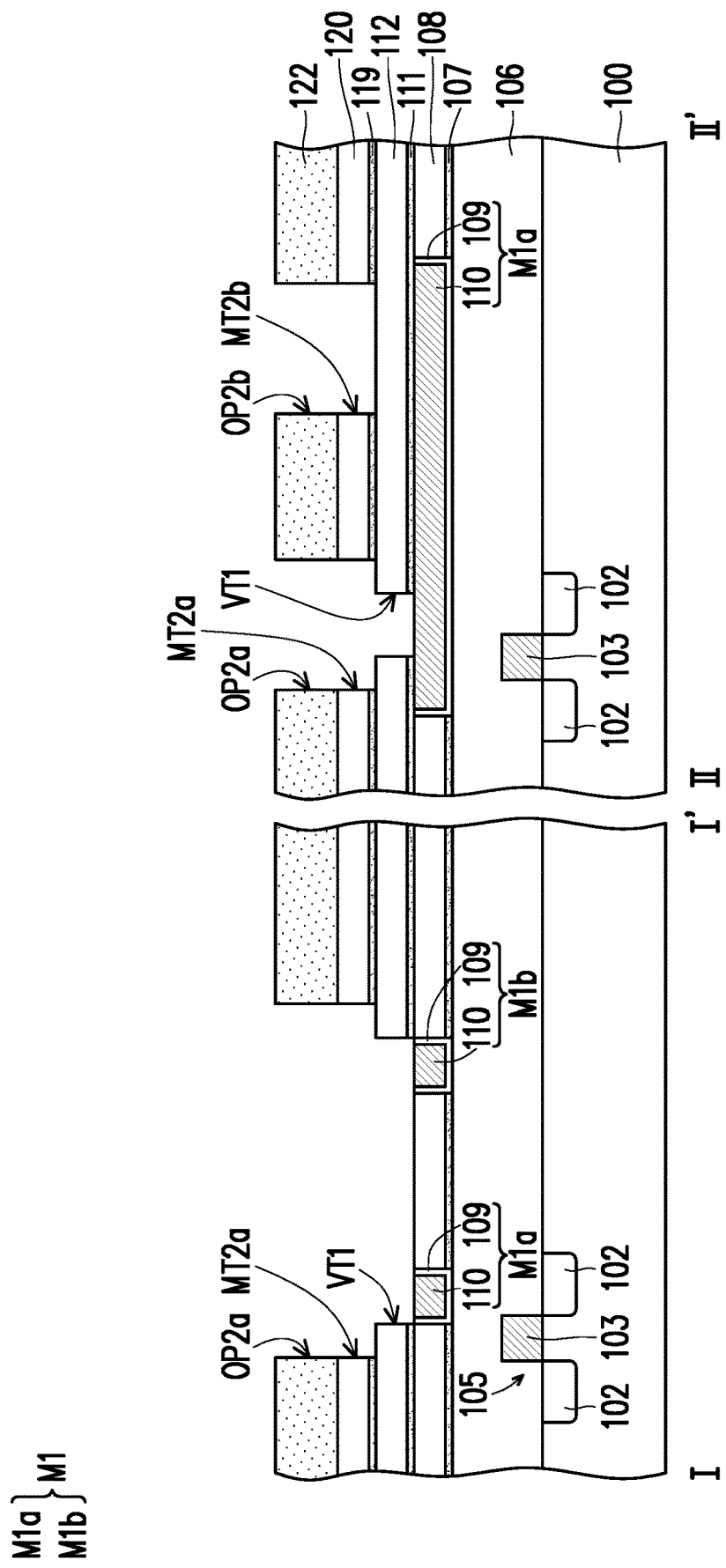

Referring to FIG. 4E and FIG. 4F, an etching process is performed with the patterned mask layer 122 as an etching process, so as to remove portions of the dielectric layer 120 and the etching stop layer 119 exposed by the openings OP2a and OP2b, and portions of the dielectric layer 112 and the etching stop layer 111 exposed by the opening OP1. In other words, the etching process removes one layer of dielectric layer and one layer of etching stop layer. As such, the openings OP2a and OP2b of the patterned mask layer 122 extend down into the dielectric layer 120 and the etching stop layer 119, and the conductive line trenches MT2a and MT2b are formed in the dielectric layer 120 and the etching stop layer 119, while the opening OP1 (FIG. 4E) is transferred into the dielectric layer 112 and the etching stop layer 111, and a via trench VT1 is formed in the dielectric layer 112 and the etching stop layer 111. In other words, the etching stop layer 111 and the dielectric layer 112 are patterned to form a via trench VT1 therein, and the etching stop layer 119 and the dielectric layer 120 are pattered to form conductive line trench MT2a and MT2b therein. The structural features of the via trench VT1 and the conductive line trenches MT2a and MT2b are substantially the same as those described in the second illustrative embodiment.

Figure 4G:
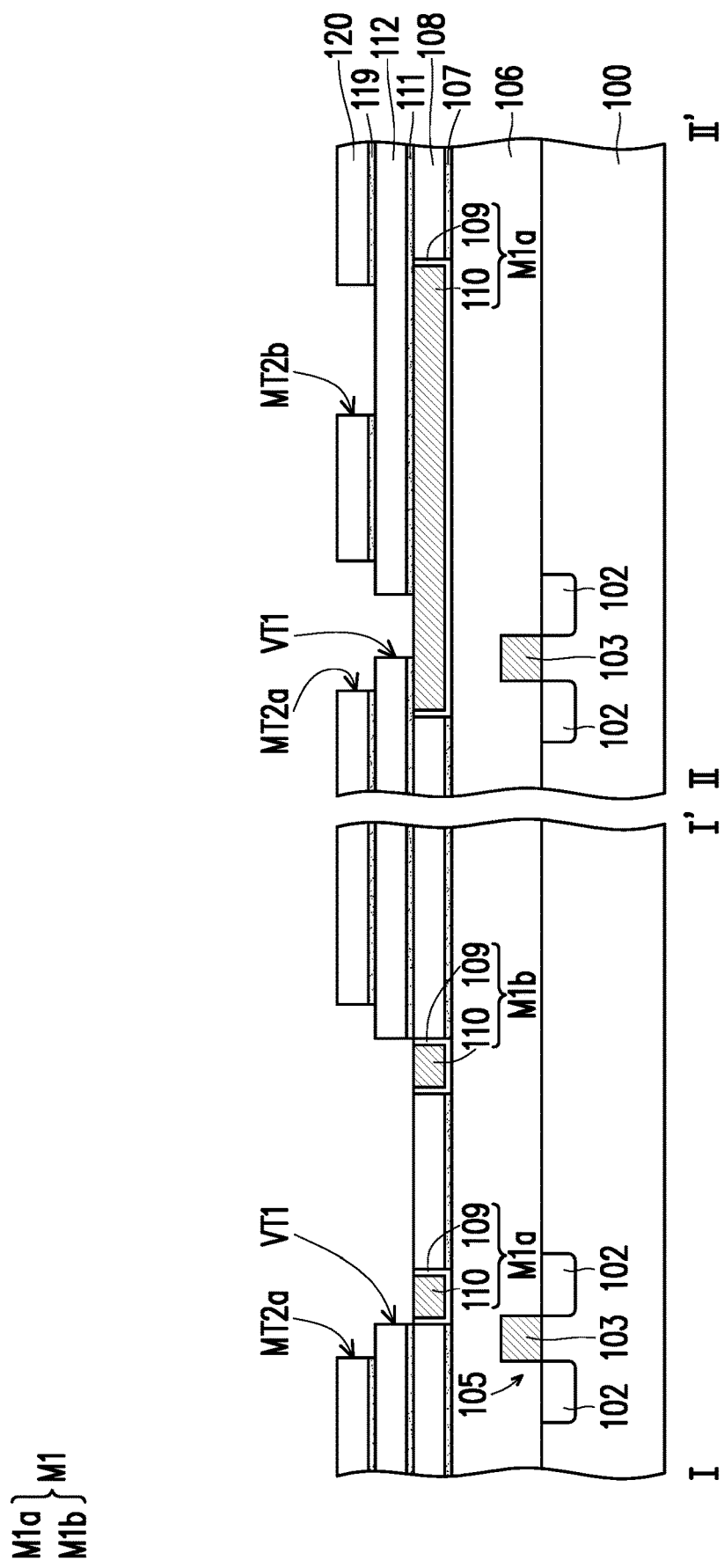
Figure 4H:
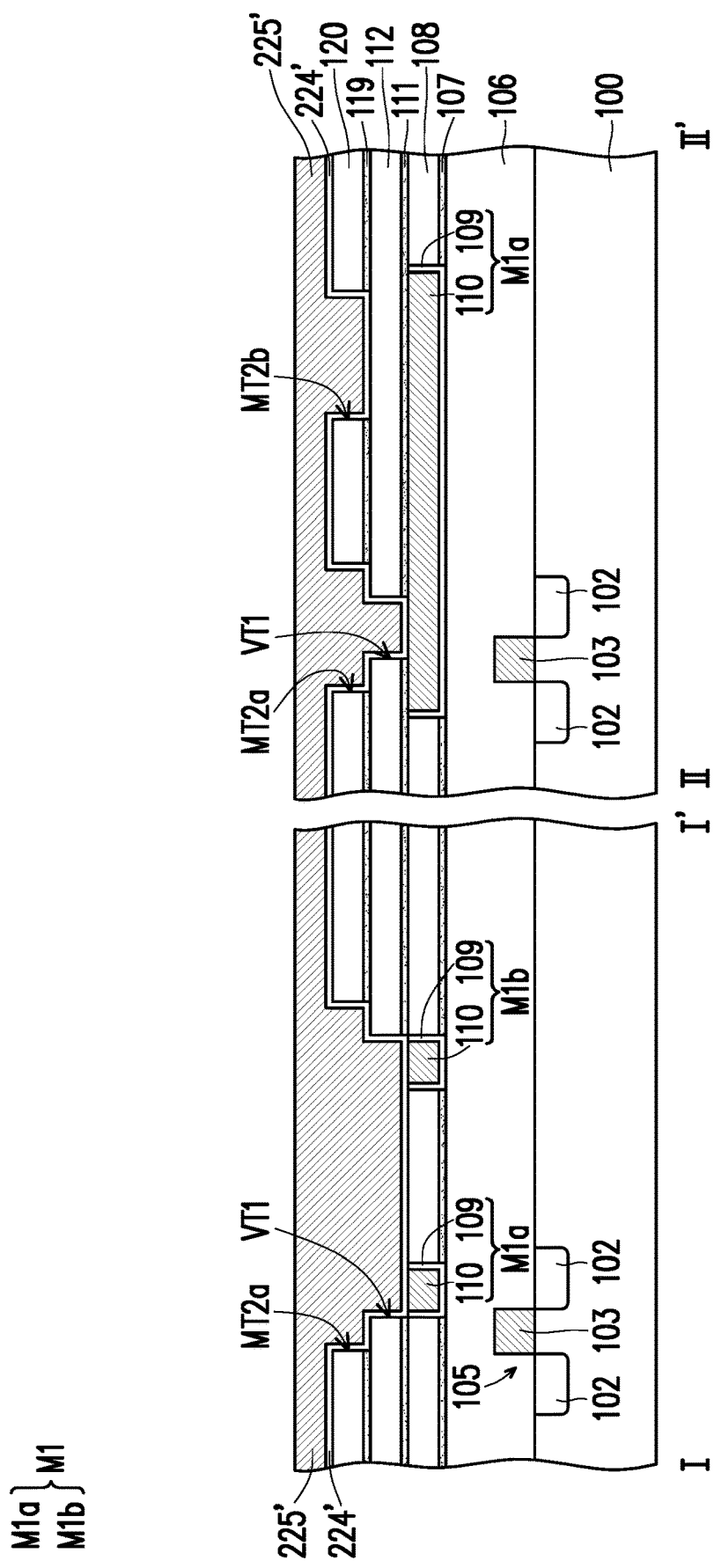

Referring to FIG. 4F and FIG. 4G, the patterned mask layer 122 is removed. Thereafter, as shown FIG. 4H and FIG. 4I, processes similar to those described in FIG. 3H to FIG. 3I are performed, a barrier material layer 224' and a conductive material layer 225' are formed over the substrate 100 to fill the via trench VT1 and the conductive line trenches MT2a and MT2b. Thereafter, a planarization process is performed to remove excess portions of the conductive material layer 225' and the barrier material layer 224', remaining a barrier layer 224 and a conductive layer 225 in the via trench VT1 and the conductive line trenches MT2a and MT2b to form a conductive via V1 and the second tier conductive layer M2. The second tier conductive layer M2 includes conductive lines M2a and M2b.

Figure 4I:
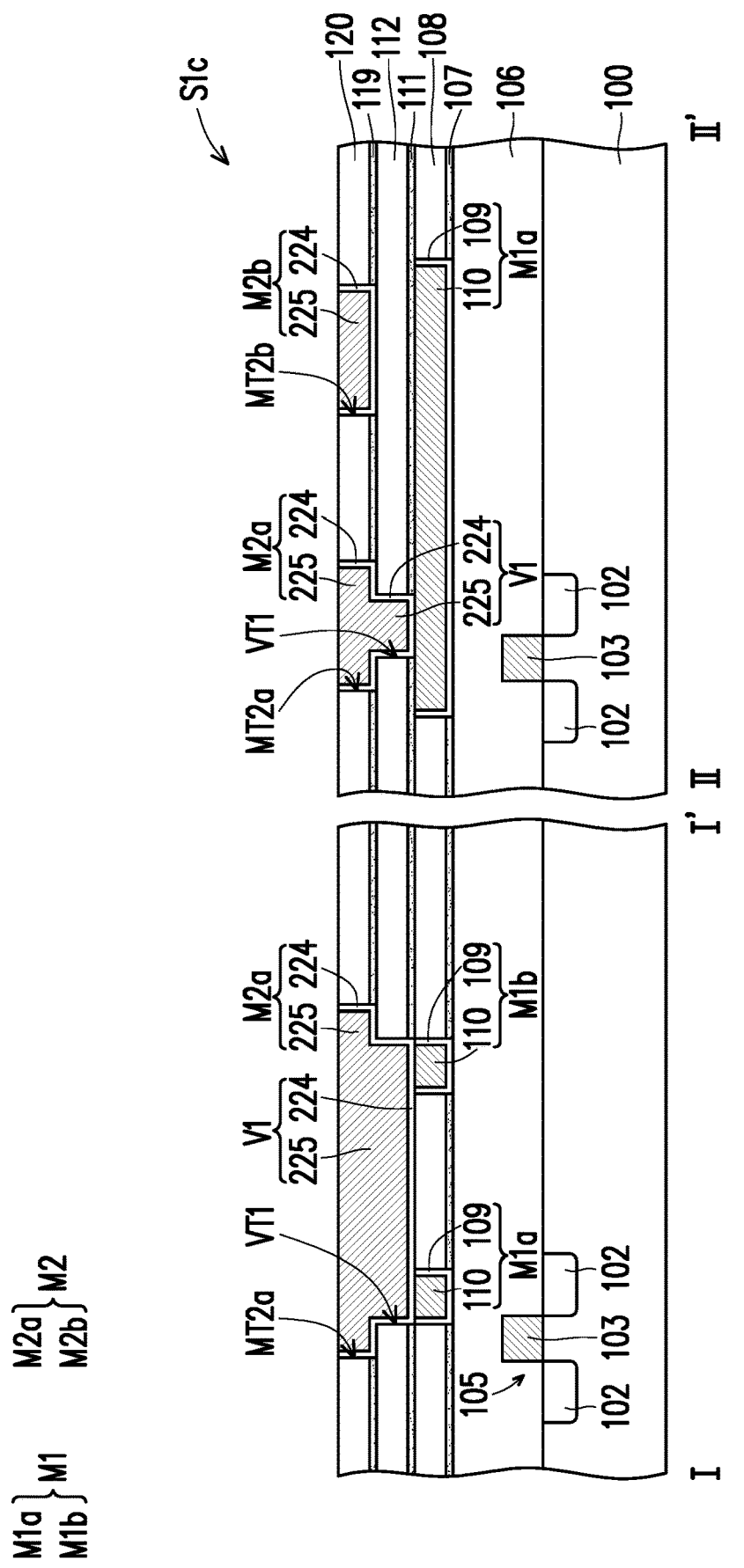

Referring to FIG. 4I, a semiconductor structure S1c is thus formed, the structure feature of the semiconductor structure S1c is substantially the same as those of the semiconductor structure S1b (FIG. 3I), which are not repeated again here.

Figure 5:
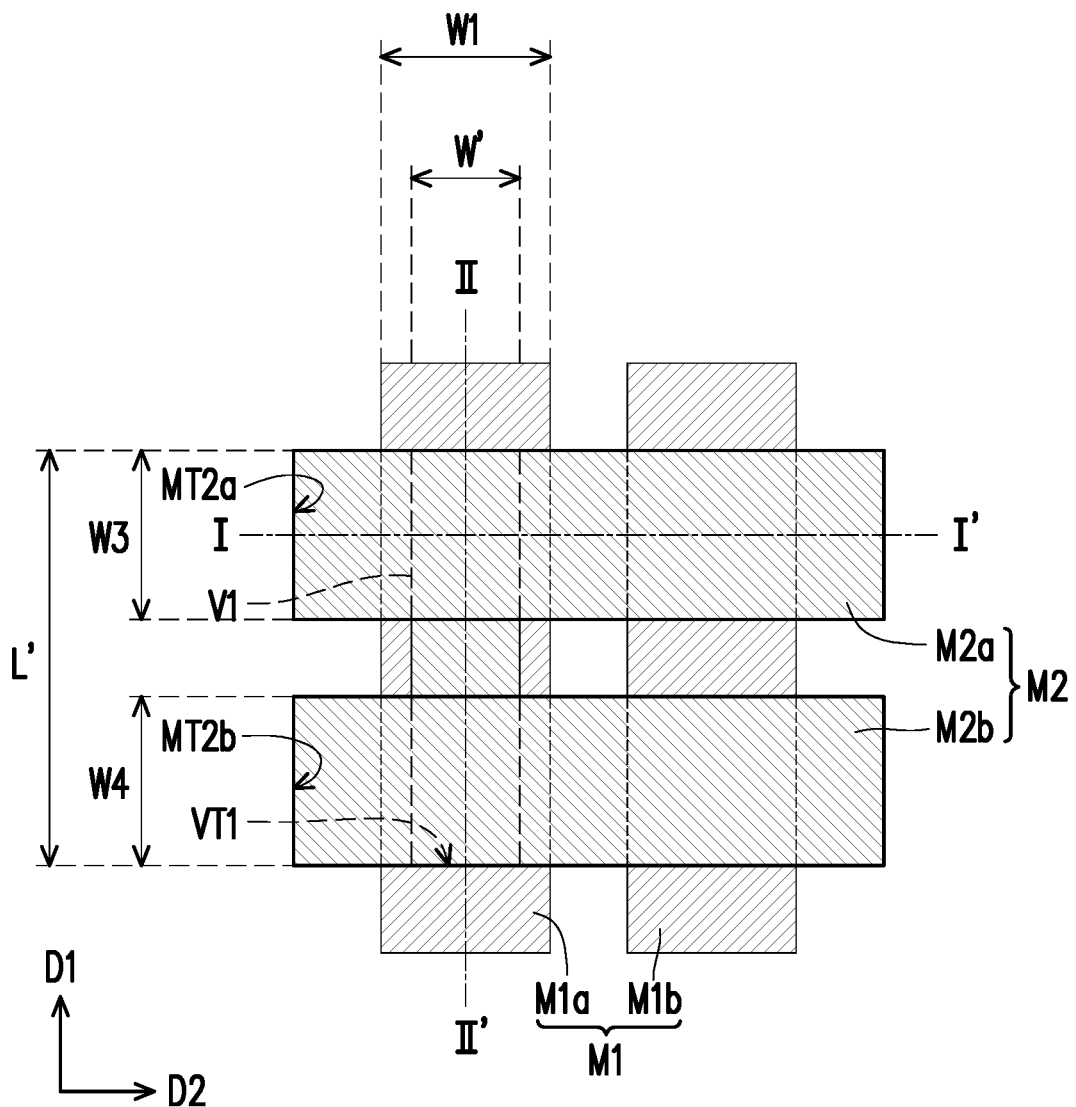
FIG. 5 illustrates a top view of a semiconductor structure according to some other embodiments of the disclosure.

FIG. 5 is a top view of an interconnection structure of a semiconductor structure according to some other embodiments of the disclosure. The top view shown in FIG. 5 is similar to the top view shown in FIG. 1, except that conductive via V1 extends in a direction the same as the underlying conductive line M1a, and connected to two adjacent overlying conductive lines M2a and M2b.

FIG. 6A to FIG. 6J are schematic cross-sectional views illustrating a method of forming a semiconductor structure according to a fourth illustrative embodiment of the disclosure. Specifically, FIG. 6A to FIG. 6J illustrates cross-sectional views of intermediate stages of forming an interconnection structure having the top view of FIG. 5. FIG. 6A to FIG. 6J corresponds to cross-sectional views of intermediate stages taken along I-I' line and II-II' line of FIG. 5. The fourth illustrative embodiment utilizes single-damascene process to form conductive via and second tier conductive layer.

Figure 6A:
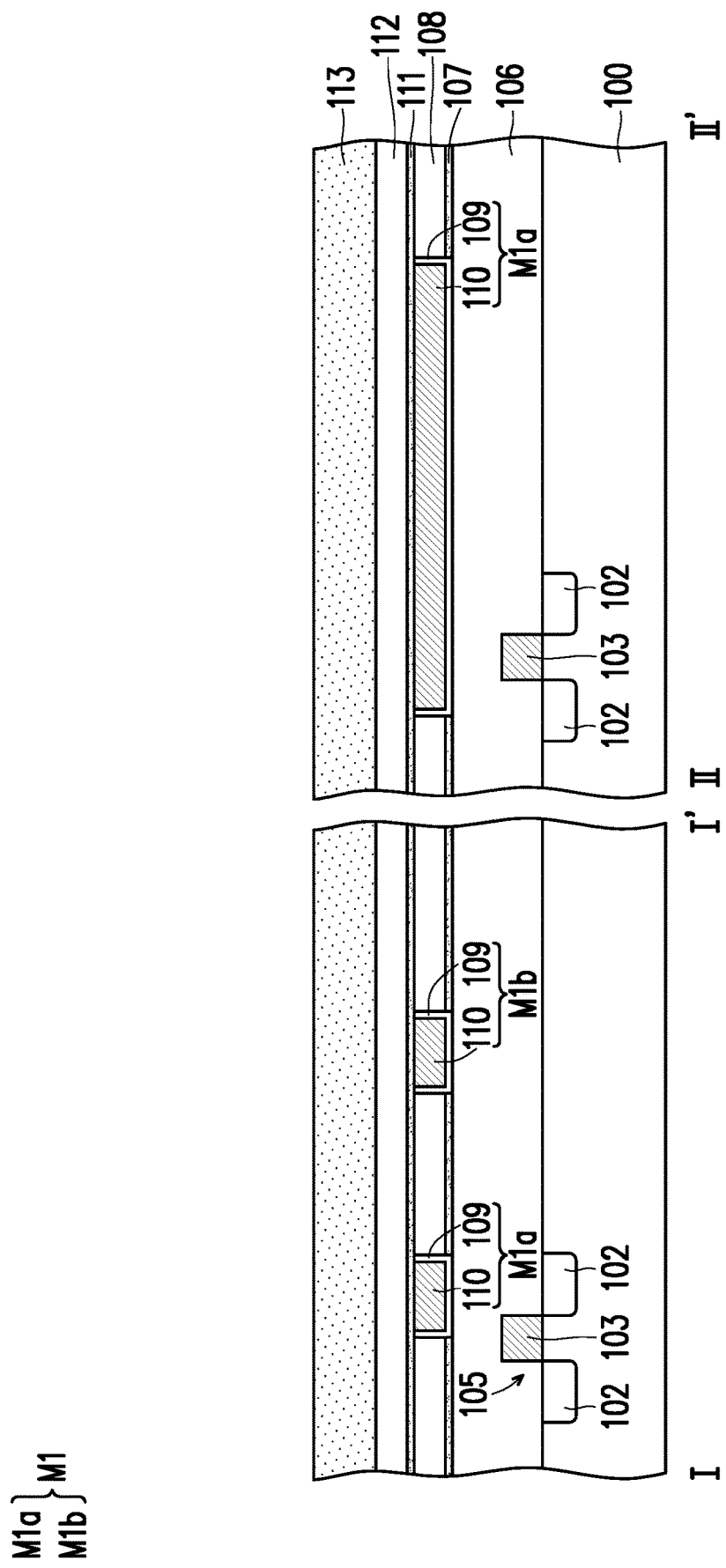
FIG. 6A through FIG. 6J are schematic cross-sectional views illustrating intermediate stages for forming a semiconductor structure according to a fourth embodiment of the disclosure.

Referring to FIG. 6A, processes similar to those described in FIG. 2A are performed. After the etching stop layer 111 and the dielectric layer 112 are formed on the first tier conductive layer M1 and the dielectric layer 108, a mask layer 113 is formed on the dielectric layer 112.

Figure 6B:
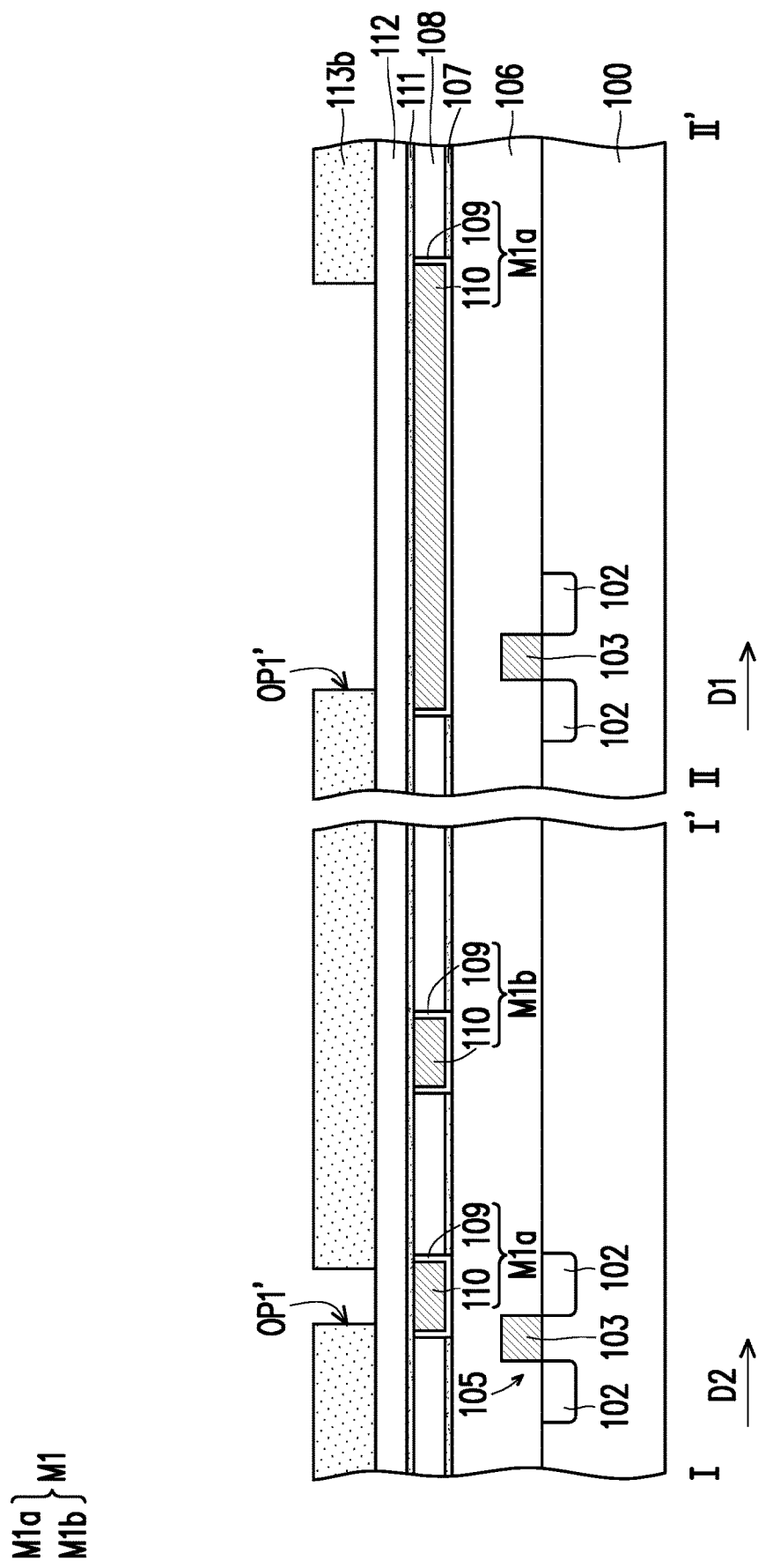

Referring to FIG. 6A and FIG. 6B, the mask layer 113 is patterned to form a patterned mask layer 113b having an opening OP1'. The patterned mask layer 113b is used for defining the via trench. Different from the foregoing embodiments, the opening OP1' may be a trench extending along the first direction D1, which is the same as the extending direction of the conductive line M1a. In some embodiments, the opening OP1' is located directly over the conductive line M1a, and expose a portion of the top surface of the dielectric layer 112.

Figure 6C:
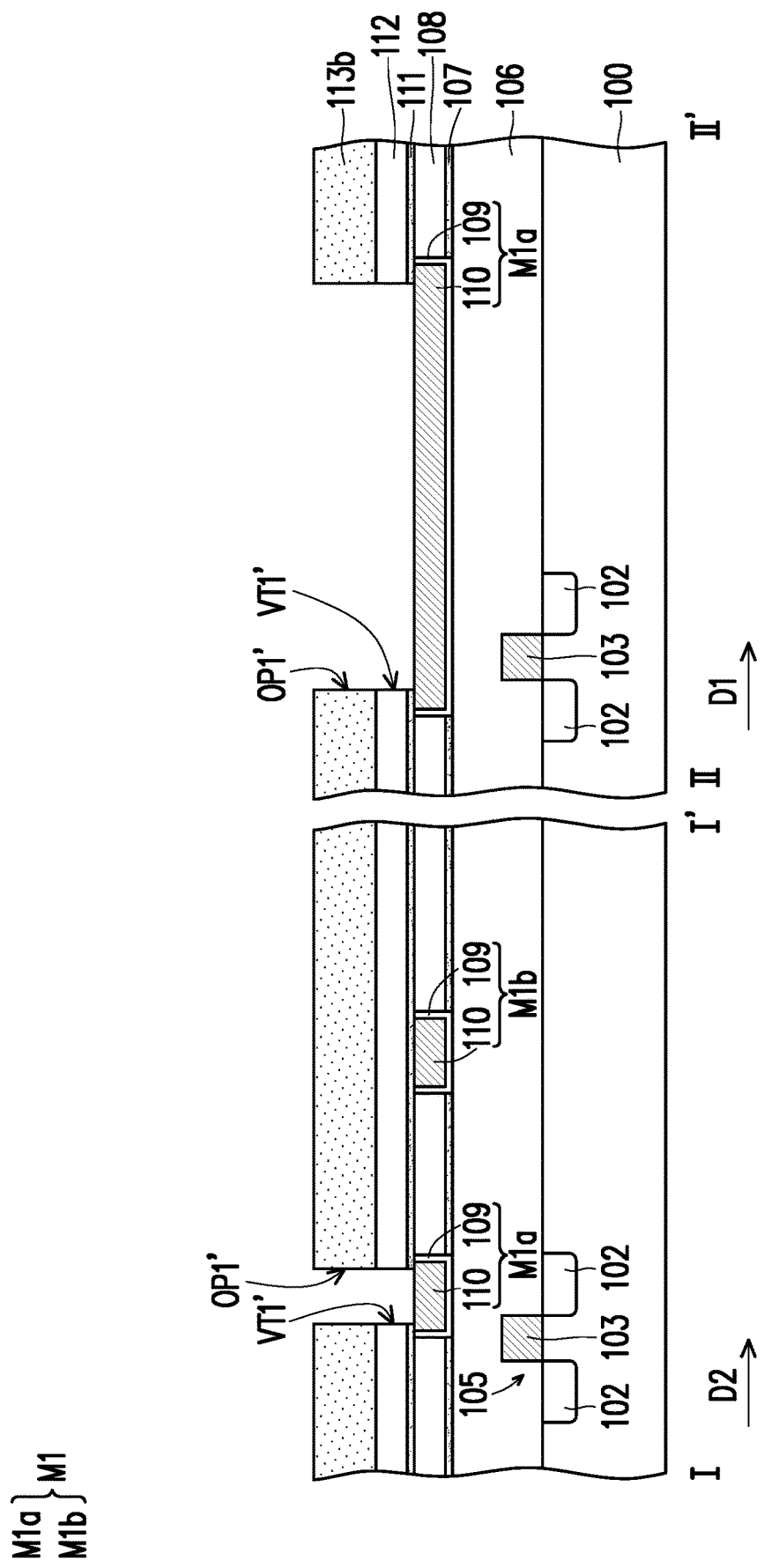

Referring to FIG. 6C, one or more etching process is performed using the patterned mask layer 113b as an etching mask, so as to remove portions of the dielectric layer 112 and the etching stop layer 111 exposed by the opening OP1', and form a via trench VT1' in the dielectric layer 112 and the etching stop layer 111. In some embodiments, the via trench VT' exposes a portion of the top surface of the conductive line M1a and extends along the first direction D1.

Figure 6D:
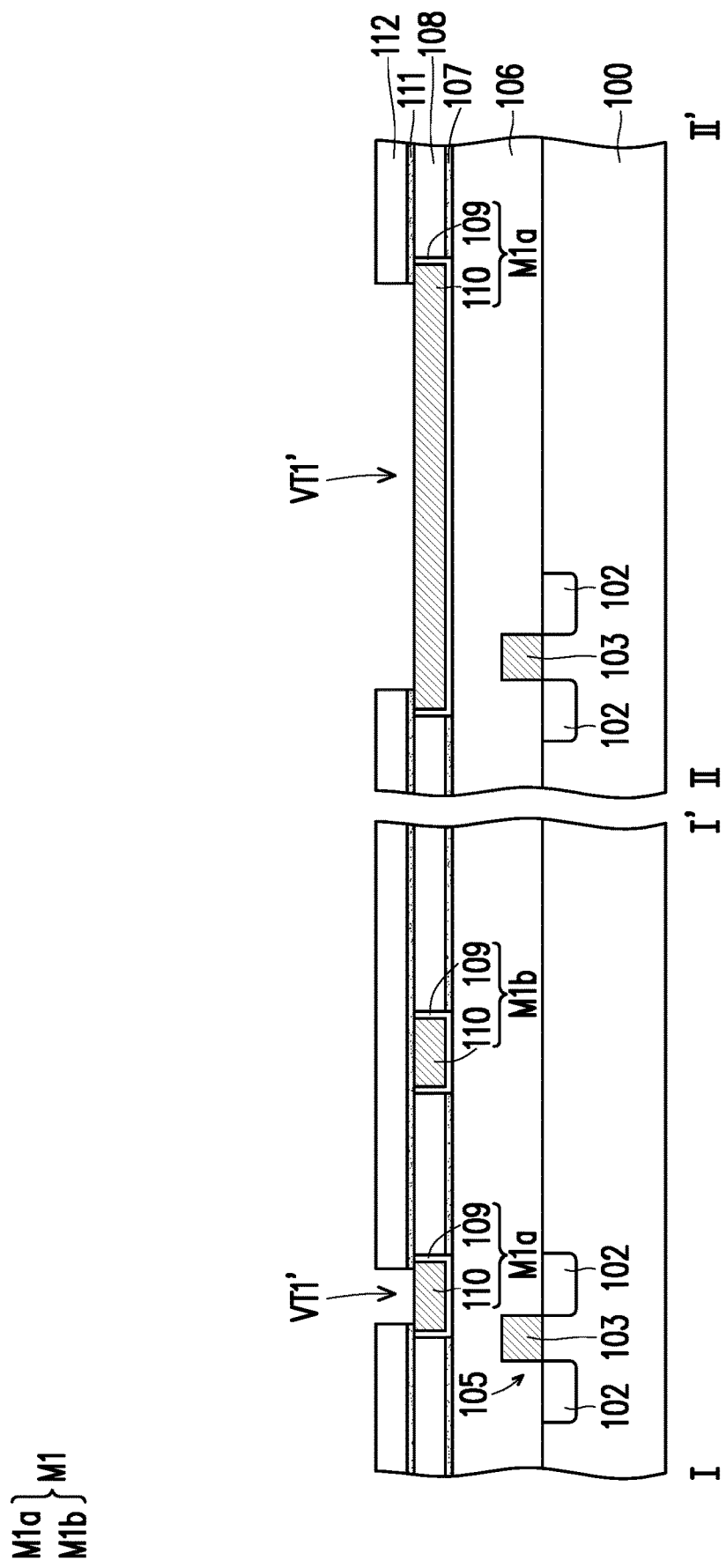
Figure 6E:
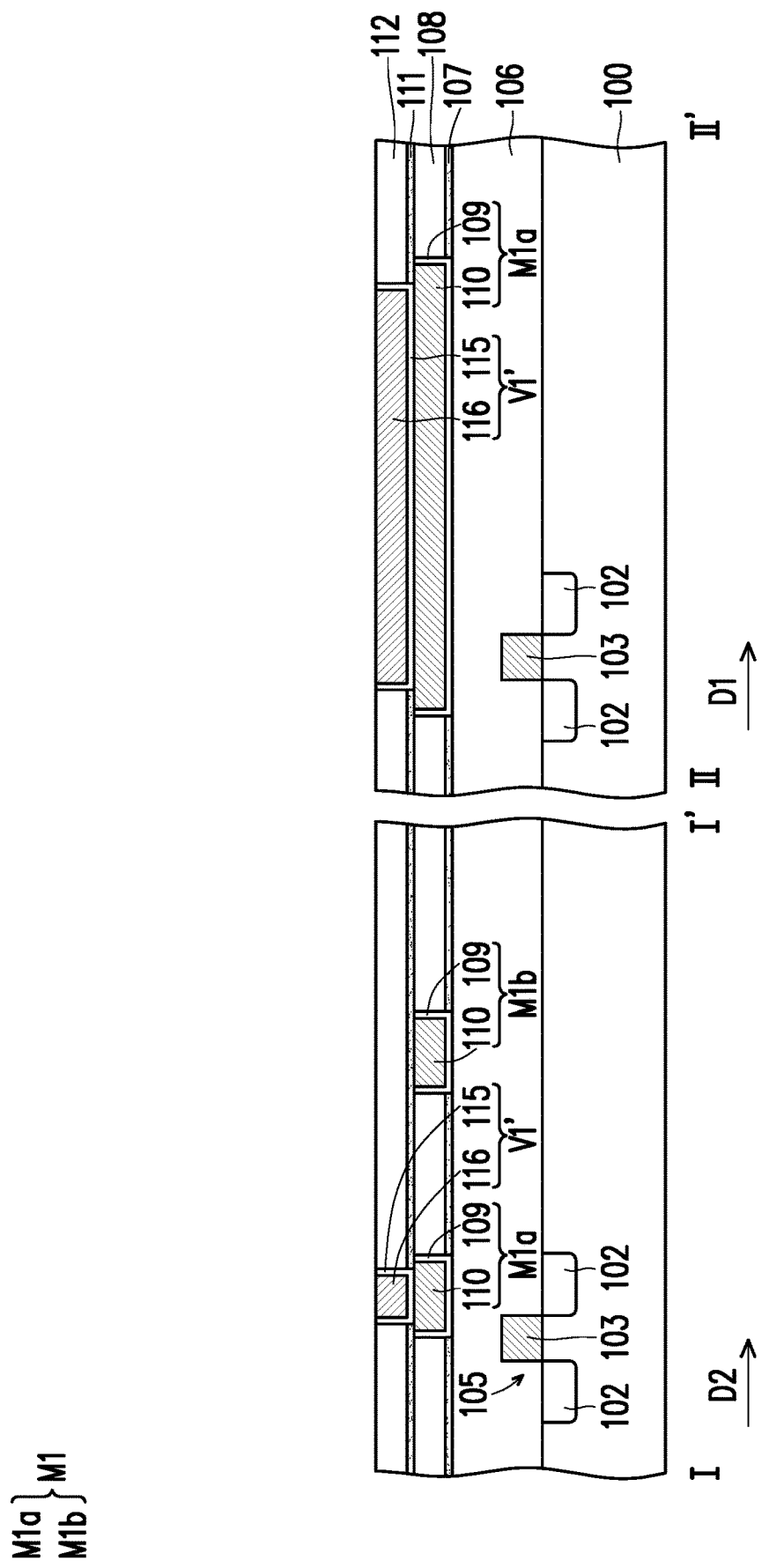

Referring to FIG. 6D and FIG. 6E, the patterned mask layer 113b is removed, and a conductive via V1' is formed in the via trench VT'. In some embodiments, the conductive via V1' includes a barrier layer 115 and a conductive layer 116 on the barrier layer 115. The materials and forming method of the conductive via V1' are similar to those of the conductive via V1 described in FIG. 2D to FIG. 2E of the first embodiment, which are not repeated again here. The conductive via V1' extends in the first direction D1, which is the same as the extending direction of the conductive line M1a. In some embodiments, the conductive via V1' is located directly over and electrically connected to the conductive line M1a.

Figure 6F:
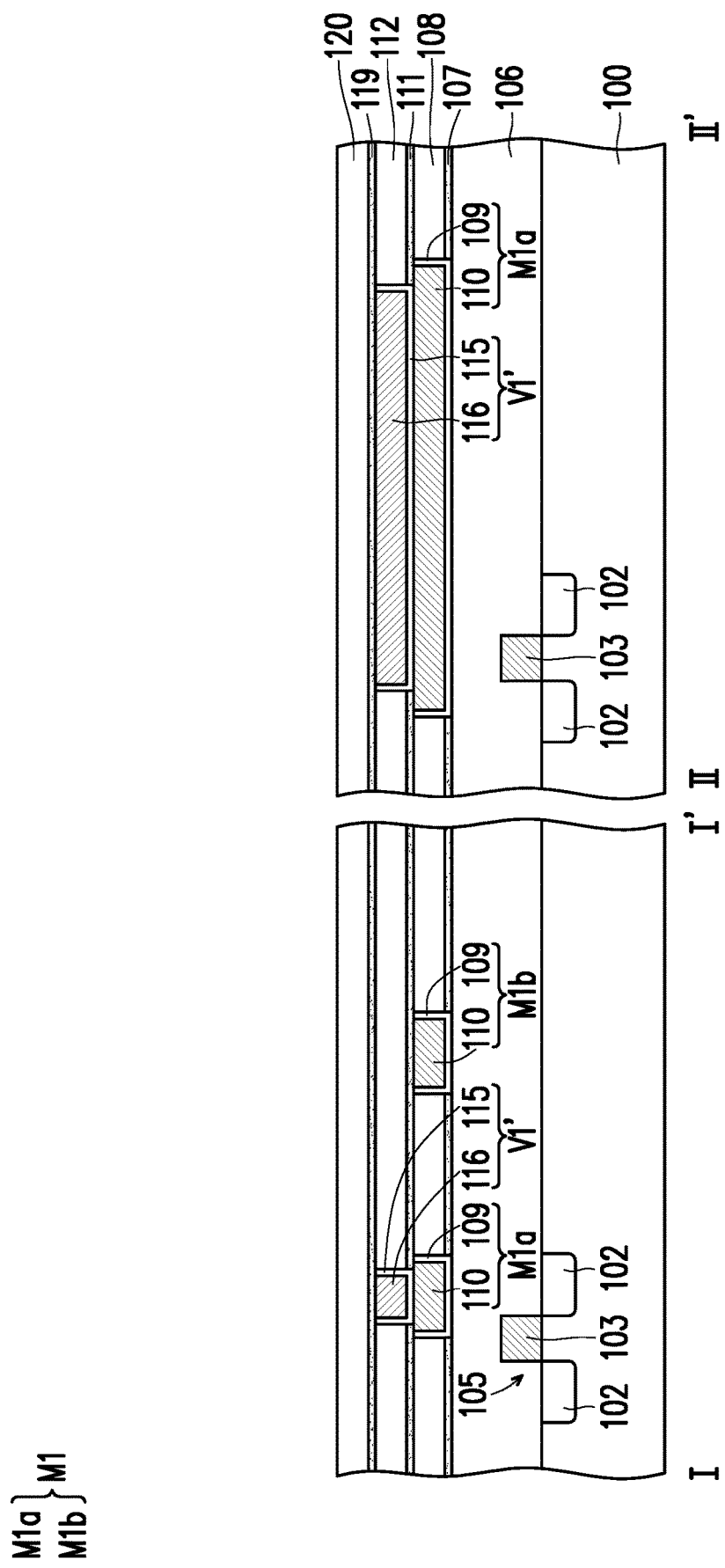
Figure 6G:
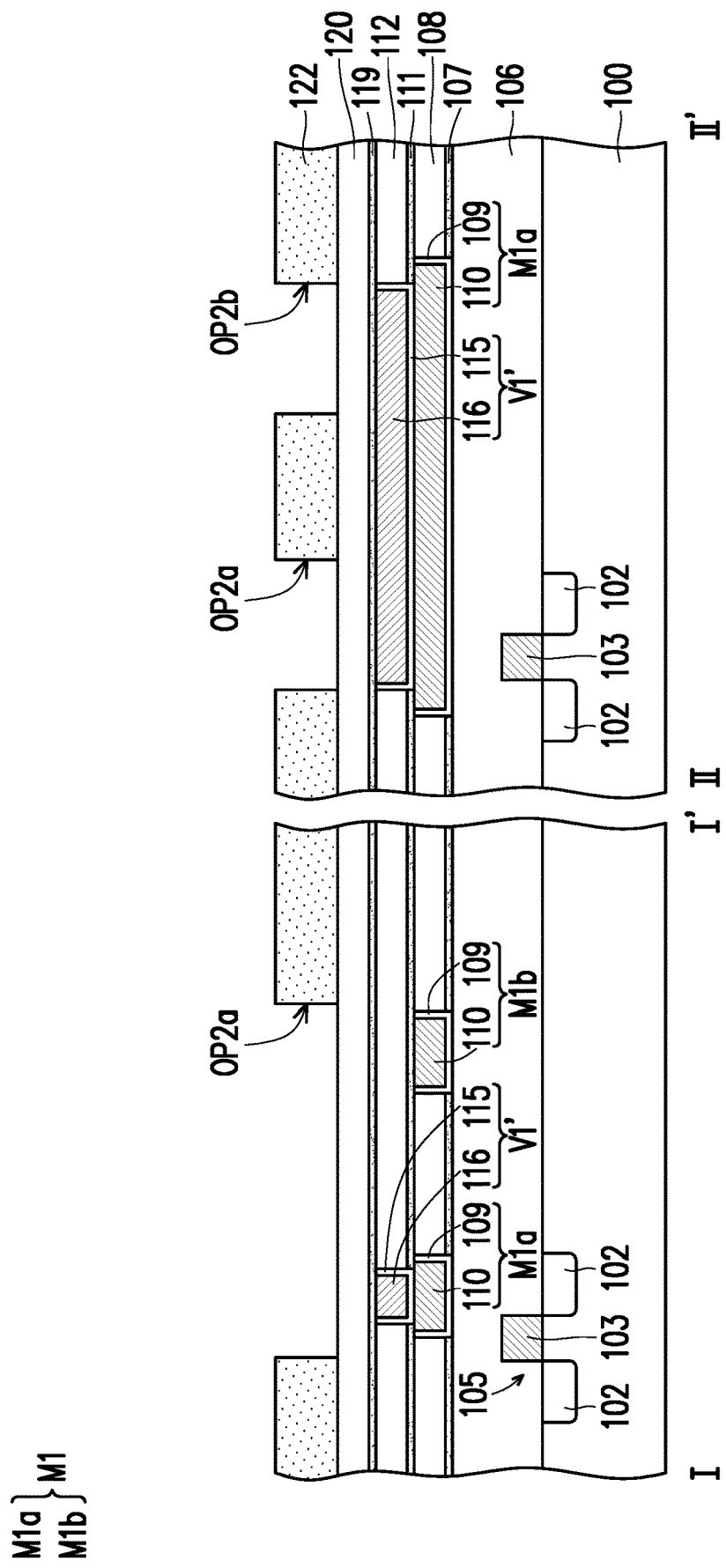
Figure 6H:
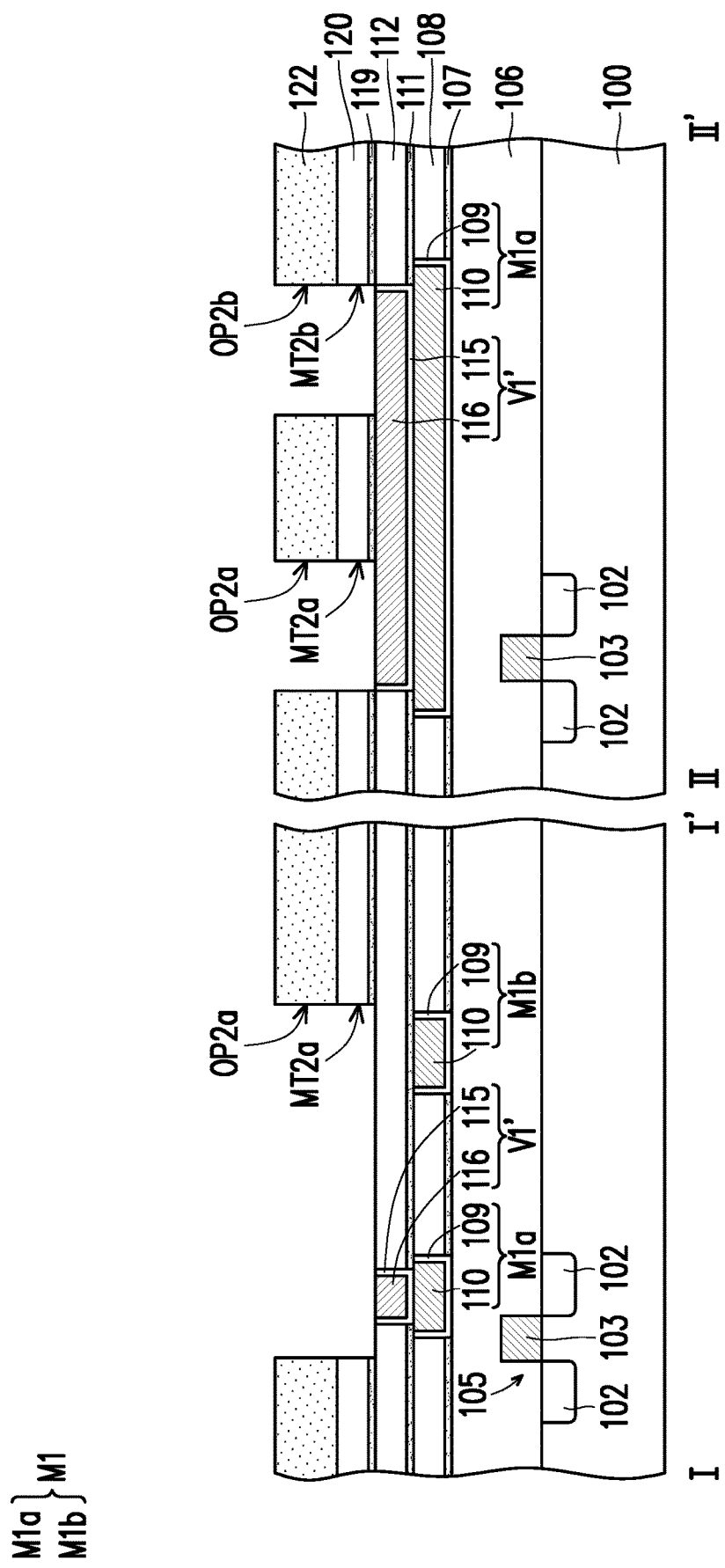

Referring to FIG. 6F to FIG. 6I, thereafter, processes similar to those described in FIG. 2F to FIG. 2J are performed to form second tier conductive layer M2 over the conductive via V1'. Referring to FIG. 6F, an etching stop layer 119 and a dielectric layer 120 are formed on the dielectric layer 112 and the conductive via V1'. Thereafter, referring to FIG. 6G to FIG. 6I, a patterned mask layer 122 having openings OP2a and OP2b is formed on the dielectric layer 120; the dielectric layer 120 and the etching stop layer 119 are then patterned using the patterned mask layer 122 as a mask, so as to form conductive line trenches MT2a and LMT2b in the dielectric layer 120 and the etching stop layer 119. Thereafter, the patterned mask layer 122 is removed.

Figure 6I:
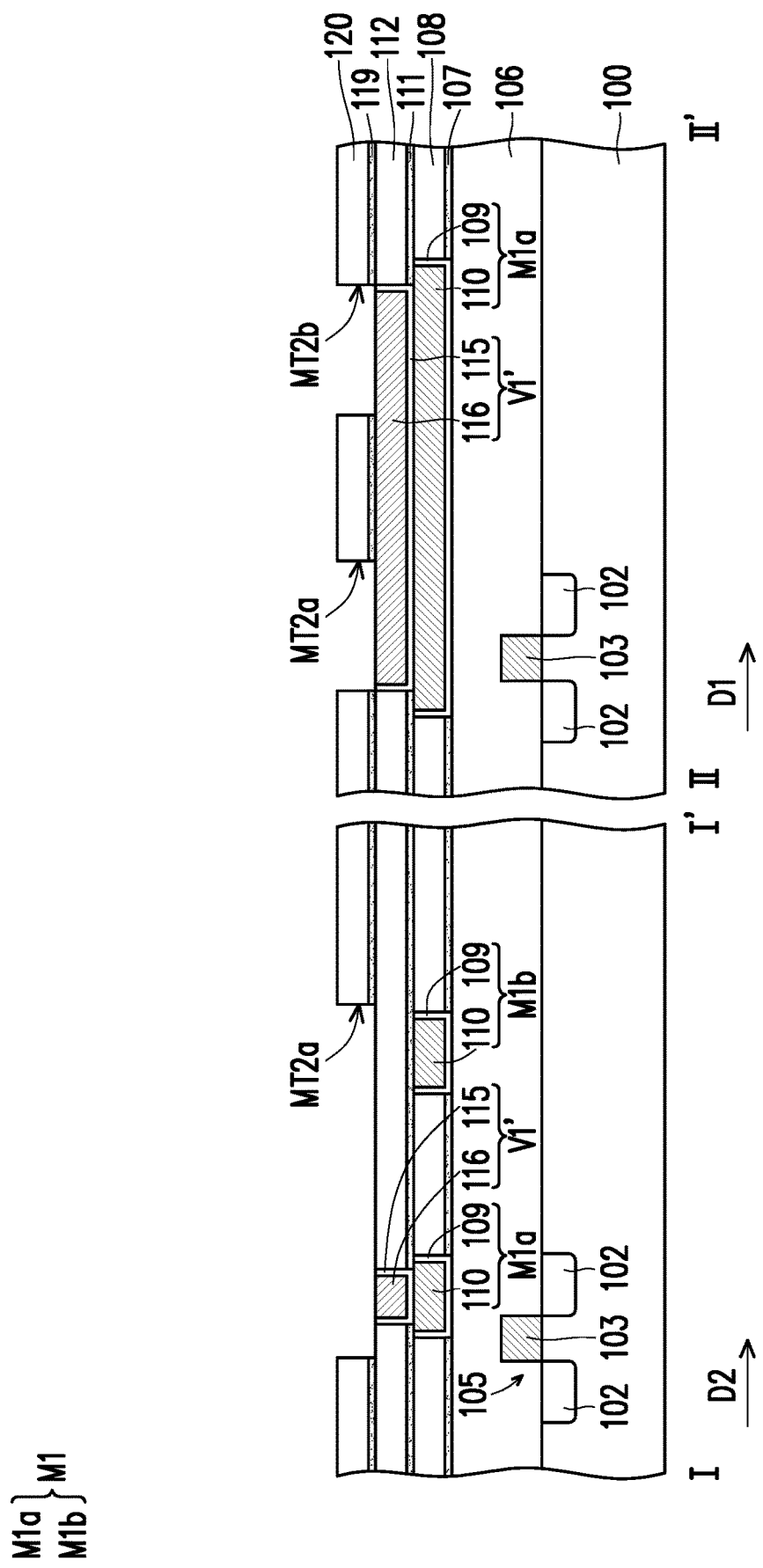

Referring to FIG. 6I, in some embodiments, the conductive line trenches MT2a and MT2b are parallel with each other and extending along the direction D2. In some embodiments, both of the conductive line trenches MT2a and MT2b are located directly over the conductive via V1', and each of the conductive line trenches MT2a and MT2b may expose a portion of the top surface of the conductive via V1' and a portion of the top surface of the dielectric layer 112.

Figure 6J:
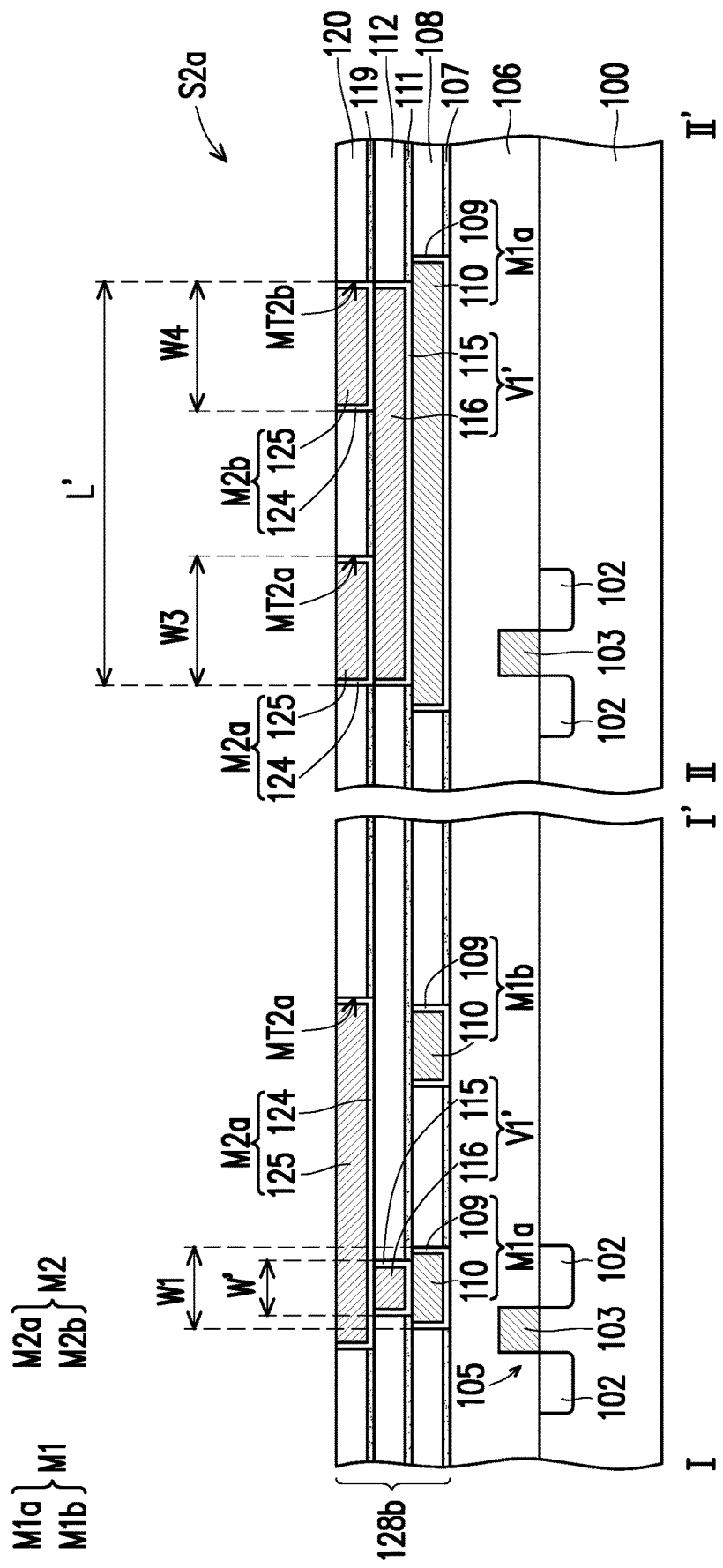

Referring to FIG. 6J, the second tier conductive layer M2 are then formed in the conductive line trenches MT2a and MT2b to electrically connect to the conductive via V1'. In some embodiments, the conductive line M2 includes a barrier layer 124 and a conductive layer 125 on the barrier layer 124. The materials and forming method of the barrier layer 124 and conductive layer 125 are substantially the same as those described in the foregoing embodiments, which are not repeated again here. In some embodiments, the top surface of the second tier conductive layer M2 may be substantially coplanar with the top surface of the dielectric layer 120. The second tier conductive layer M2 may include the conductive lines M2a and M2b parallel with each other.

Referring to FIG. 5 and FIG. 6J, a semiconductor structure S2a is thus formed. The semiconductor structure S2a includes the substrate 100, the device 105, the interlayer dielectric layer 106 and the interconnection structure 128b. In some embodiments, the interconnection structure 128b includes multi-layers of dielectric features (etching stop layers and dielectric layers) and conductive feature (the first tier conductive layer M1, the second tier conductive layer M2 and conductive via V1') embedded in the dielectric features. It is noted that, the number of layers of the dielectric features and conductive features included in the interconnection structure 128b are merely for illustration, and the disclosure is not limited thereto. The interconnection structure 128b is similar to the interconnection structure 128a described in FIG. 2J, except that the extending direction of the conductive via V1' is different.

In some embodiments, the conductive via V1' extends along the direction D1, which is the same as the extending direction D1 of the conductive lines M1a and M1b, and perpendicular to the extending direction D2 of the conductive lines M2a and M2b. The conductive via V1' may be directly over the conductive line M1a and disposed between the conductive line M1a and the conductive line M2a, and between the conductive line M1a and the conductive via M2b. In other words, both of the conductive lines M2a and M2b are electrically connected to the conductive line M1a through the conductive via V1' therebetween. The conductive lines M2a and M2b and portions of the etching stop layer 119 and the dielectric layer 120 laterally between the conductive lines M2a and M2b are overlapped with the conductive via V1' in a direction perpendicular to a top surface of the substrate 100. In some embodiments, the orthogonal projection of the conductive via V1' on the top surface of the substrate 100 is located within the orthogonal projection of the conductive line M1a on the top surface of the substrate 100, and may be perpendicular to the orthogonal projections of the conductive lines M2a and M2b. In some embodiments, the opposite sidewalls of the conductive via V1' in the direction D1 may be substantially aligned with a sidewall of the conductive line M2a and a sidewall of the conductive line M2b, respectively. However, the disclosure is not limited thereto. In alternative embodiments, one or both of the opposite sidewalls (in the direction D1) of the conductive via V1' may be laterally offset from the corresponding sidewall of the conductive line M2a and/or the sidewall of the conductive line M2b along the direction toward or away from the spacing between the conductive lines M2a and M2b.

In some embodiments, the width W' (along the direction D2) of the conductive via V1' is less than the width W1 of the conductive line M1a, but the disclosure is not limited thereto. In alternative embodiments, the width W' of the conductive via V1' may be substantially equal to or slightly larger than the width W1 of the conductive line M1a. In some embodiments, the length L' (along the direction D1) of the conductive via V1' is larger than the width W3 of the conductive line M2a and the width W4 of the conductive line M2b, and may be larger than the sum (W3+W4) of the widths W3 and W4 of the conductive lines M2a and M2b. However, the disclosure is not limited thereto.

Figure 7A:
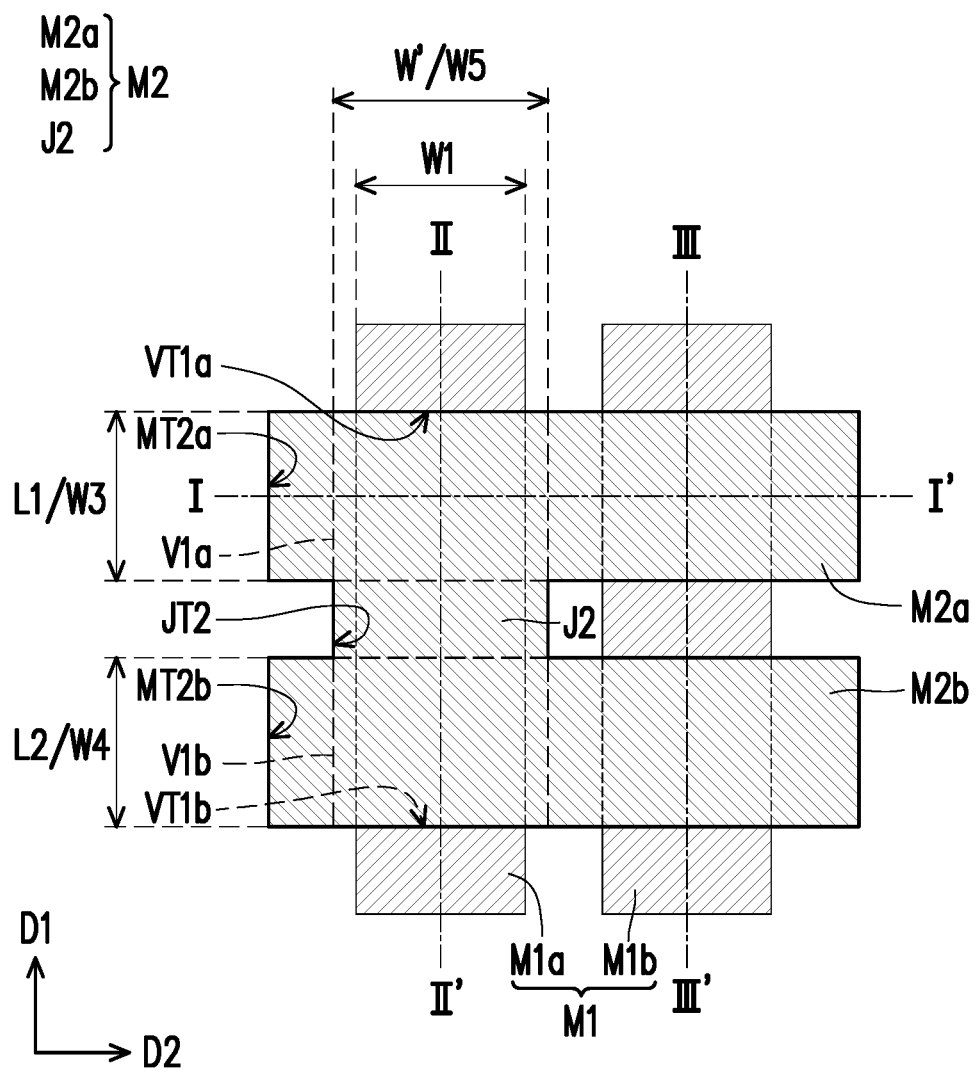
FIG. 7A and FIG. 7B illustrates top views of semiconductor structures according to some alternative embodiments of the disclosure.

FIG. 7A is a top view of an interconnection structure of a semiconductor structure according to some alternative embodiments of the disclosure. FIG. 8A to FIG. 8H are cross-sectional views illustrating a method of forming a semiconductor structure according to a fifth illustrative embodiment of the disclosure. Specifically, FIG. 8A to FIG. 8H illustrates cross-sectional views of intermediate stages of forming an interconnection structure having the top view of FIG. 7. FIG. 8A to FIG. 8G corresponds to cross-sectional views of intermediate stages taken along I-I' line and II-II' line of FIG. 7. FIG. 8H illustrates cross-sectional view taken along III-III' line of FIG. 7. The fifth embodiment is similar to the fourth embodiment (the layouts of the interconnection structures in the fourth and fifth embodiments are similar), except that the fifth embodiment utilizes dual-damascene (trench first) process to form the conductive via and second tier conductive layer.

Figure 8A:
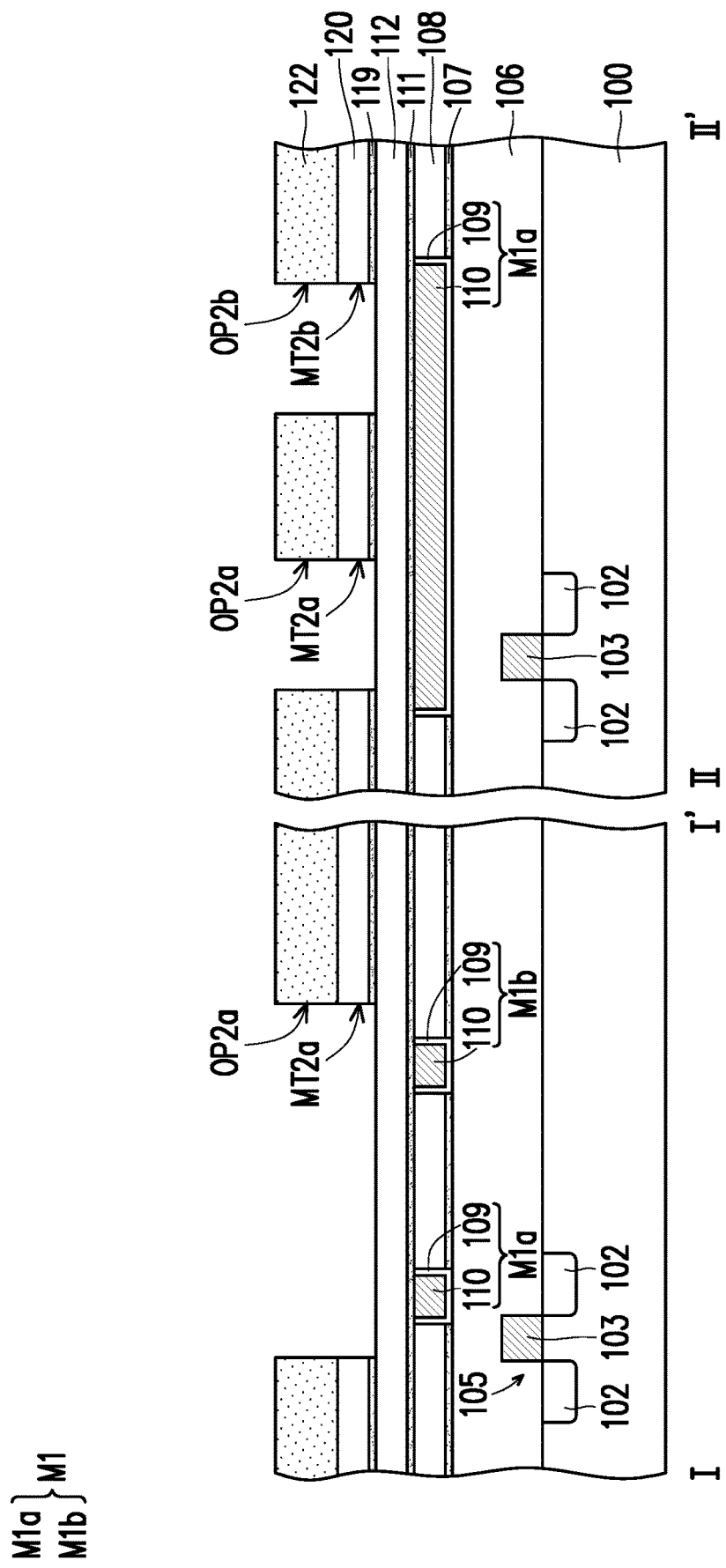
FIG. 8A through FIG. 8H are schematic cross-sectional views illustrating intermediate stages for forming a semiconductor structure according to a fifth embodiment of the disclosure.

Referring to FIG. 7A and FIG. 8A, processes similar to those described in FIG. 3A to FIG. 3C are performed. A patterned mask layer 122 having openings OP2a and OP2b are formed over the substrate 100, the dielectric layer 120 and the etching stop layer 119 are patterned using the patterned mask layer 122 as an pattern mask, so as to form conductive line trenches MT2a and MT2b in the dielectric layer 120 and the etching stop layer 119. In some embodiments, the conductive line trenches MT2a and MT2b are parallel with each other and extend along the second direction D2.

Figure 8B:
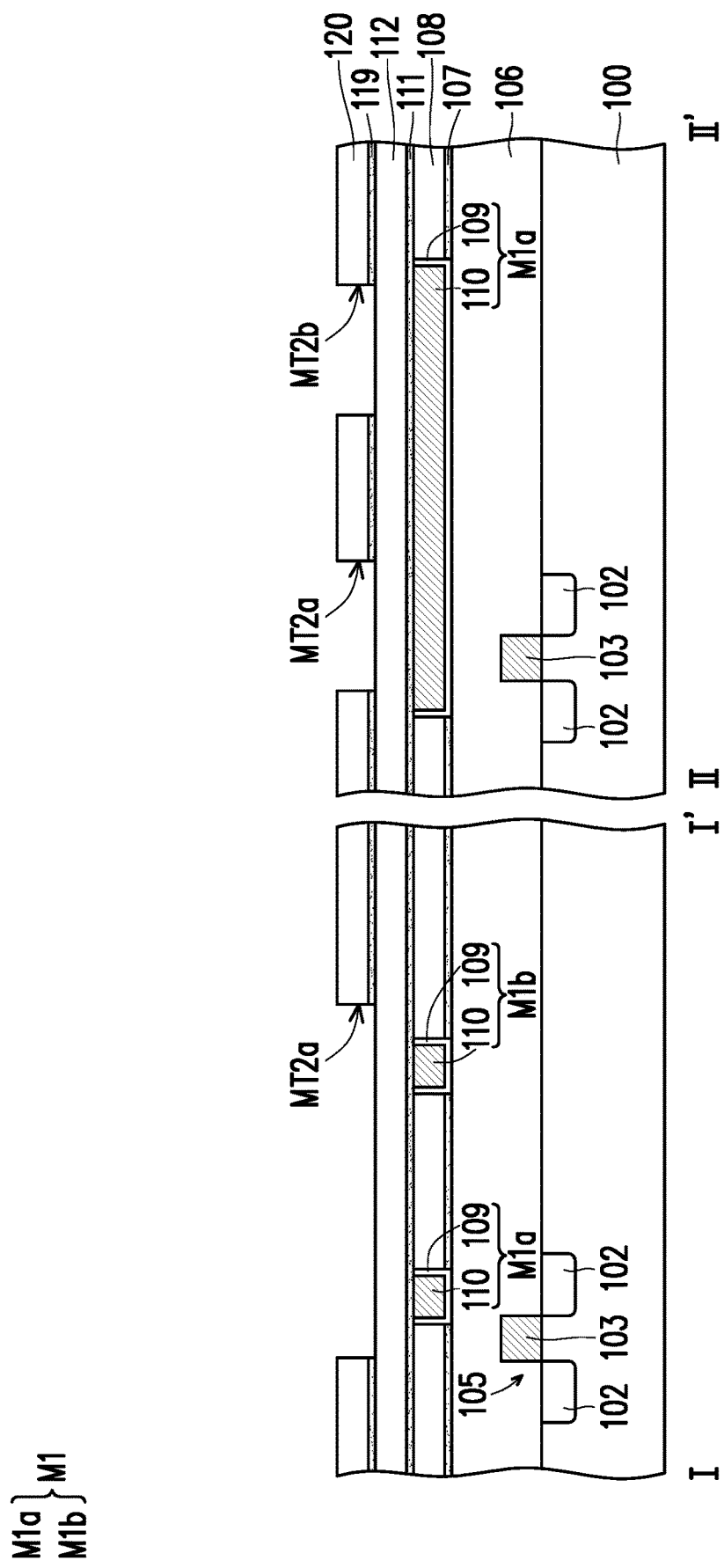
Figure 8C:
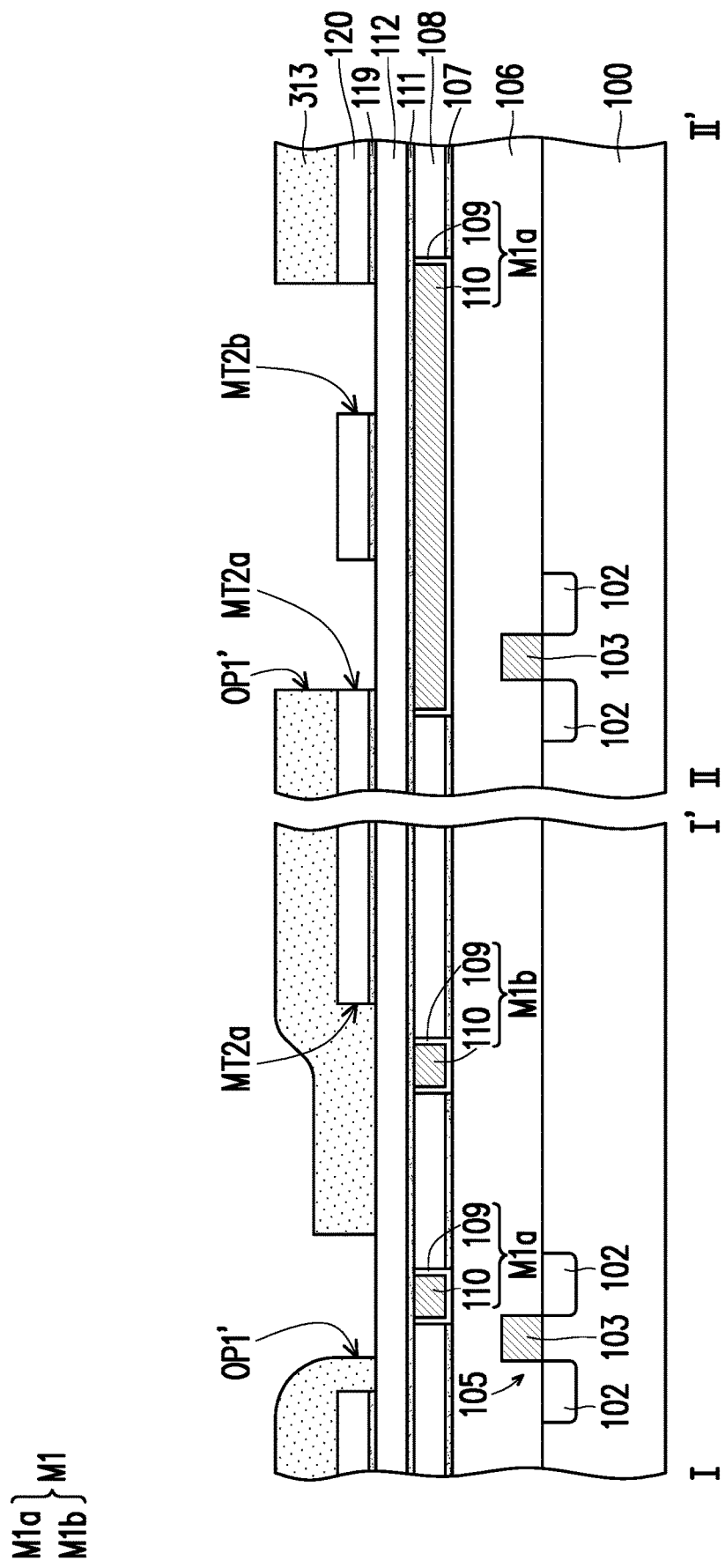

Referring to FIG. 7A, FIG. 8B and FIG. 8C, the patterned mask layer 122 (FIG. 8A) is removed, and a patterned mask layer 313 is formed over the substrate 100. The patterned mask layer 313 is used for defining the subsequently formed via opening. In some embodiments, the patterned mask layer 313 is formed on the dielectric layer 120 and partially fills the conductive line trenches MT2a and MT2b. The patterned mask layer 313 has a pattern substantially the same as that of the patterned mask layer 113b (FIG. 6B). The patterned mask layer 313 includes an opening OP1' directly over the conductive line M1a and extends in the direction D1, which is perpendicular to the extending direction D2 of the conductive line trenches MT2a and MT2b.

In some embodiments, the opening OP1' is overlapped with portions of the conductive line trenches MT2a and MT2b. The location of the opening OP1' is similar to that of the above described opening OP1' of the patterned mask layer 113b (FIG. 6B). In some embodiments, the dimension of the opening OP1' is substantially the same as or different from that of the above-described opening OP1'. In some embodiments, the width of the opening OP1' is larger than the width of the underlying conductive line M1a, but the disclosure is not limited thereto. In alternative embodiments, the width of the opening OP' may be equal to or less than the width of the underlying conductive line M1a. In some embodiments, the opening OP1' exposes a portion of the top surface of the dielectric layer 112 and a portion of the top surface of the dielectric layer 120 laterally between the conductive line trenches MT2a and MT2b.

Figure 8D:
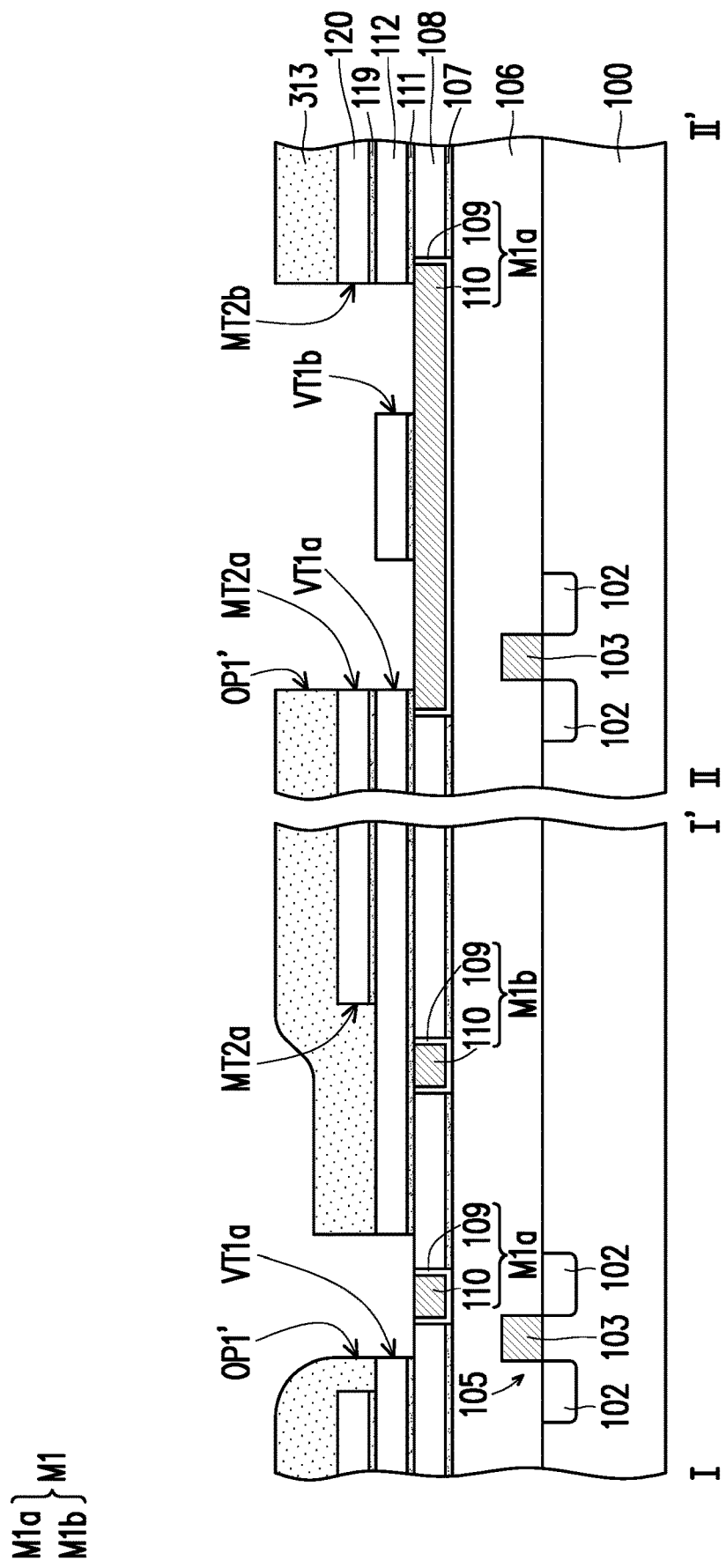
Figure 8E:
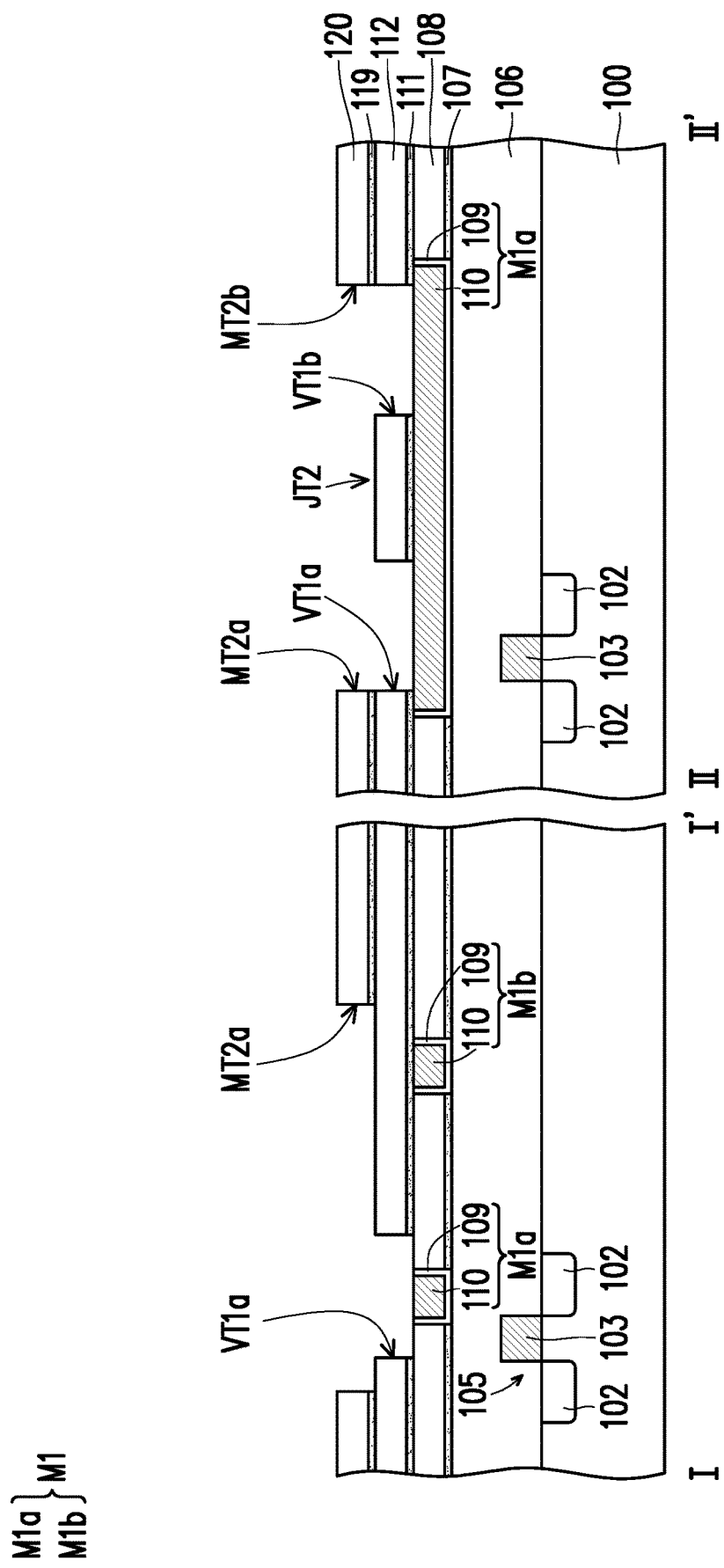

Referring to FIG. 7A, FIG. 8C and FIG. 8D, an etching process is performed with the patterned mask layer 313 as an etching mask, so as to remove portions of the dielectric layers/etching stop layers exposed by the opening OP1' of the patterned mask layer 313, and via opening(s) are formed in the dielectric layer 112 and the etching stop layer 111. In some embodiments, the etching process removes one layer of dielectric layer and one layer of etching stop layer. In other words, during the etching process, portions of the dielectric layer 112 and etching stop layer 111 exposed by both of the opening OP1' and the conductive line trenches MT2a and MT2b are removed, meanwhile, portions of the dielectric layer 120 and etching stop layer 119 laterally between the conductive line trenches MT2a and MT2b and exposed by the opening OP1' are removed. As a result, via openings VT1a and VT1b are formed in the dielectric layer 112 and the etching stop layer 111. The via openings VT1a and VT1b are laterally spaced from each other by dielectric layer 112 and etching stop layer 111 therebetween. In other words, two separate via opening VT1a and VT1b are formed in the dielectric layer 112 and etching stop layer 111 and directly underlying the conductive line trenches MT2a and MT2b. On the other hand, since portions of the dielectric layer 120 and etching stop layer 119 laterally between the conductive line trenches MT2a and MT2b are removed, a junction opening JT2 is formed laterally between the conductive line trenches MT2a and MT2b. In other word, the conductive line trenches MT2a and MT2b are spatial connected to each other through the junction opening JT2.

Referring to FIG. 7A, FIG. 8E to FIG. 8G, the patterned mask layer 313 is removed, a barrier material layer 324' and a conductive material layer 325' are then formed on the dielectric layer 120 and fill into the via openings VT1a and VT1b, the conductive line trenches MT2a and MT2b and junction opening JT2. Thereafter, a planarization process is performed to remove excess portions of the barrier material layer 324' and the conductive material layer 325' over the top surface of the dielectric layer 120, and a barrier layer 324 and a conductive layer 325 are remained within the via openings VT1a and VT1b, conductive line trenches LT1a and LT1b, and the junction opening JT2.

Figure 8F:
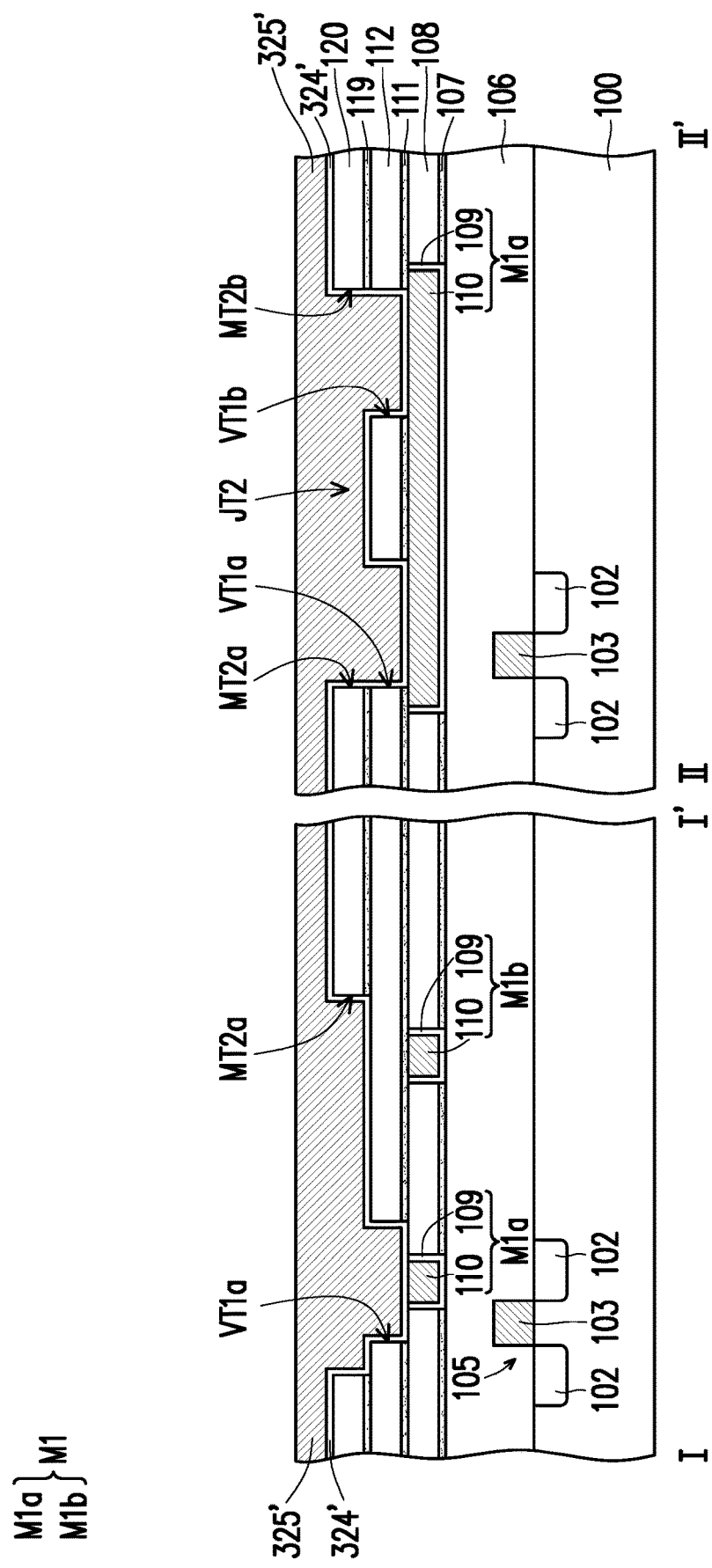
Figure 8G:
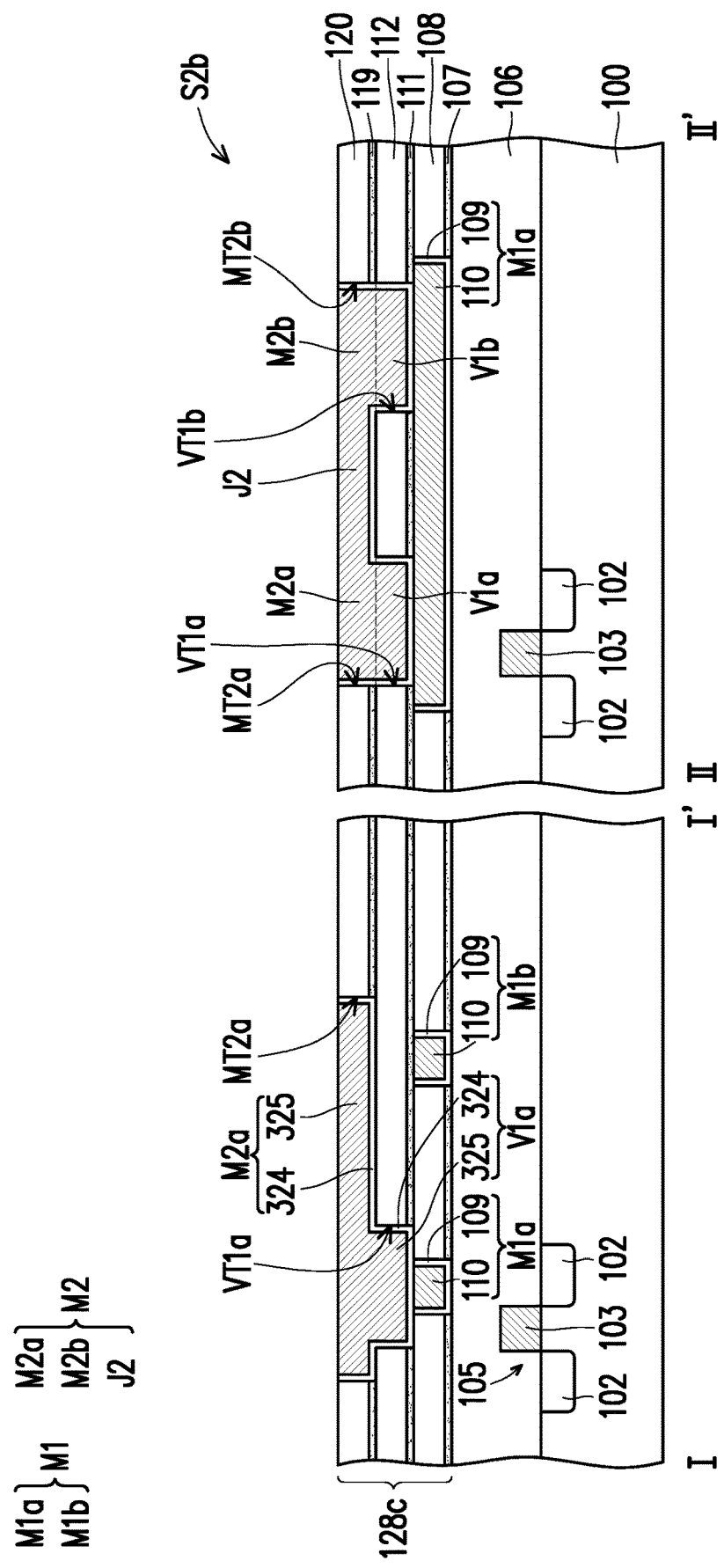

Referring to FIG. 8G, the barrier layer 324 and the conductive layer 325 in the via openings VT1a and V1b respectively constitute the conductive vias V1a and V1b, the barrier layer 324 and the conductive layer 325 in the conductive trenches MT2a and MT2b constitute conducive lines M2a and M2b, while the barrier layer 324 and conductive layer 325 in the junction opening JT2 constitute a junction part J2 between the conductive lines M2a and M2b. In other words, the conductive vias V1a and V1b, the conductive lines M2a and M2b, and the junction part J2 are formed simultaneously and share the barrier layer 324 and the conductive layer 325, and therefore free of interface therebetween.

Referring to FIG. 7A, FIG. 8G and FIG. 8H, a semiconductor structure S2b is thus formed. The semiconductor structure S2b includes the substrate 100, the device 105, and an interconnection structure 128c. The interconnection structure 128c includes multi-layers of dielectric features (alternative stacked etching stop layers 107/111/119 and dielectric layers 108/112/120) and a plurality of conductive features embedded in the dielectric features. In some embodiments, the conductive features includes the first tier conductive layer M1, the conductive vias V1a and V1b, and the second tier conductive layer M2. In some embodiments, the first tier conductive layer M1 includes the conductive lines M1a and M1b, the second tier conductive layer M2 includes the conductive lines M2a and M2b and the junction part J2 laterally between the conductive lines M2a and M2b. The semiconductor structure S2b is similar to the semiconductor structure S2a (FIG. 6J), except that the semiconductor structure S2b includes two separate conductive vias V1a and V1b, and the conductive lines MT2a and MT2b are connected to each other through the junction part J2. In the present embodiment, the conductive lines MT2a and MT2b and the conductive line M1a are electrically connected to each other through the conductive vias V1a and V1b and the junction part J2.

In some embodiments, the conductive vias V1a and V1b are directly over the conductive line M1a and are spaced apart from each other by portions of the dielectric layer 112 and etching stop layer 111 therebetween. The conductive via V1a is disposed vertically between and electrically connected to the conductive line M1a and the conductive line M2a, while the conductive via V1b is disposed vertically between and electrically connected to the conducive line M1a and the conductive line M2a. In some embodiments, as shown in FIG. 7A, the conductive via V1a and the conductive via V1b are overlapped with each other in the first direction D1, and the sidewalls of the conductive vias V1a and V1b are substantially aligned with each other.

Still referring to FIG. 7A, FIG. 8G and FIG. 8H, in some embodiments, the junction part J2 is located laterally between and electrically connected to the conductive lines M2a and M2b. The top view of the conductive lines M2a and M2b and the junction part J2 may be H-shaped or the like. The junction part J2 is directly overlying the portions of dielectric layer 112 and etching stop layer 111 laterally between the conductive vias V1a and V1b. In other words, the junction part J2 is overlapped with the said portions of the dielectric layer 112 and etching stop layer 111 in a direction perpendicular to a top surface of the substrate 100. In some embodiments, the dimension (e.g. area, widths) of the junction part J2 is substantially the same as the dimension (e.g, area, widths) of the said portions of dielectric layer 112 and etching stop layer 111.

In some embodiments, when viewed in the top view FIG. 7A, along the direction D1, the conducive vias V1a and V1b are disposed at the same net, and the junction part J2 is immediately adjacent to and between the conductive vias V1a and V1b. In some embodiments, the opposite sidewalls of the junction part J2 are substantially aligned with the corresponding opposite sidewalls of the conductive vias V1a and V1b, along the direction D1. In some embodiments, the opposite sidewalls of the junction part J2 and the conductive vias V1a/V1b laterally extends beyond the sidewalls of the conductive line M1a, but the disclosure is not limited thereto. In other words, the orthogonal projection of the junction part J2 on the top surface of the substrate 100 is immediately adjacent to and laterally between the orthogonal projections of the conductive vias V1a and V1b on the top surface of the substrate 100. The orthogonal projections of the junction part J2, and the conductive vias V1a/V1b on the top surface of the substrate 100 are aligned and overlapped with each other along the direction D1.

Referring to FIG. 7A, in some embodiments, the widths W' of the conductive vias V1a and V1b and the width W5 of the junction part J2 are substantially the same as each other. In some embodiments, the widths W'/W5 may be larger than the width W1 of the conductive line M1a, but the disclosure is not limited thereto. In alternative embodiments, the widths W'/W5 may be substantially equal to or less than the width W1 of the conductive line M1a. In some embodiments, the length L1 of the conductive via V1a may be substantially equal to the width W3 of the conductive line M2a, while the length L2 of the conductive via V1b may be substantially equal to the width W4 of the conductive line M2b. However, the disclosure is not limited thereto.

Figure 7B:
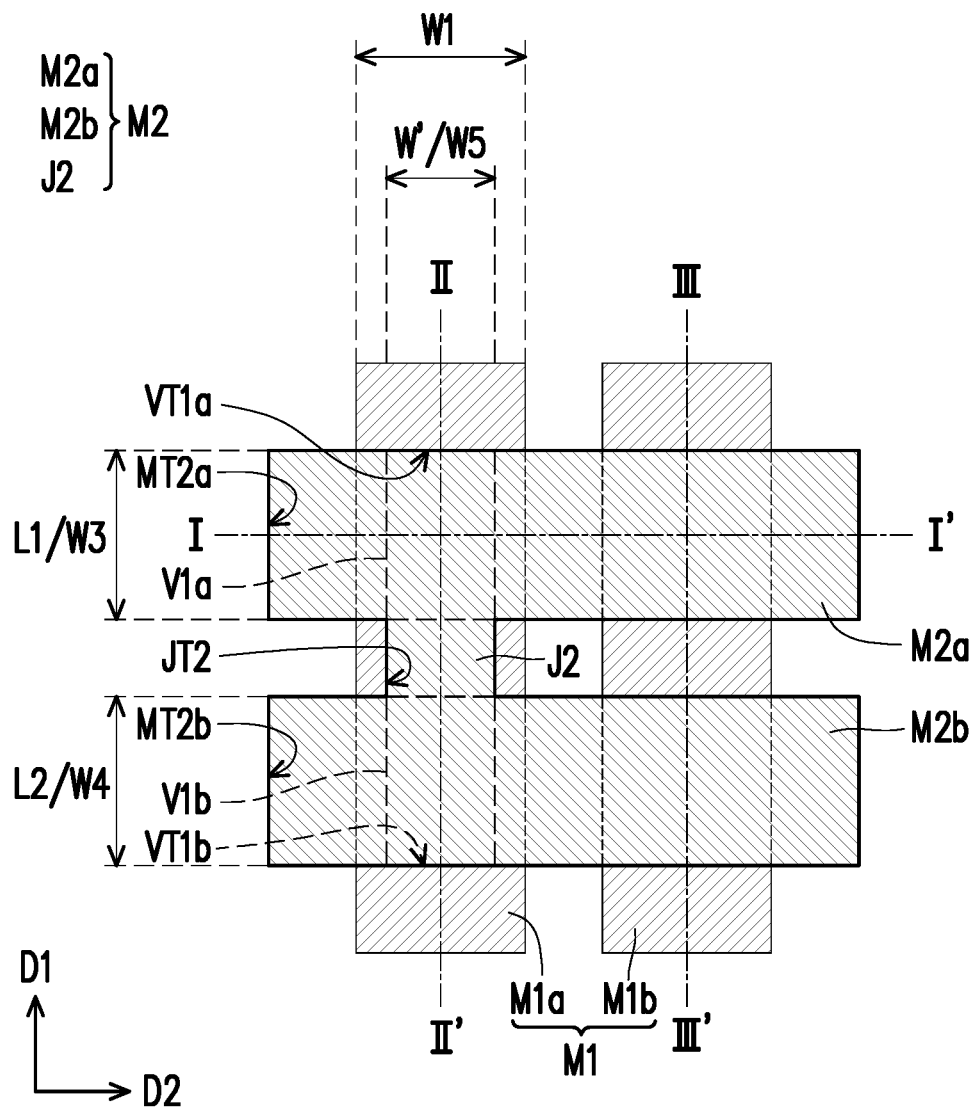
Figure 8H:
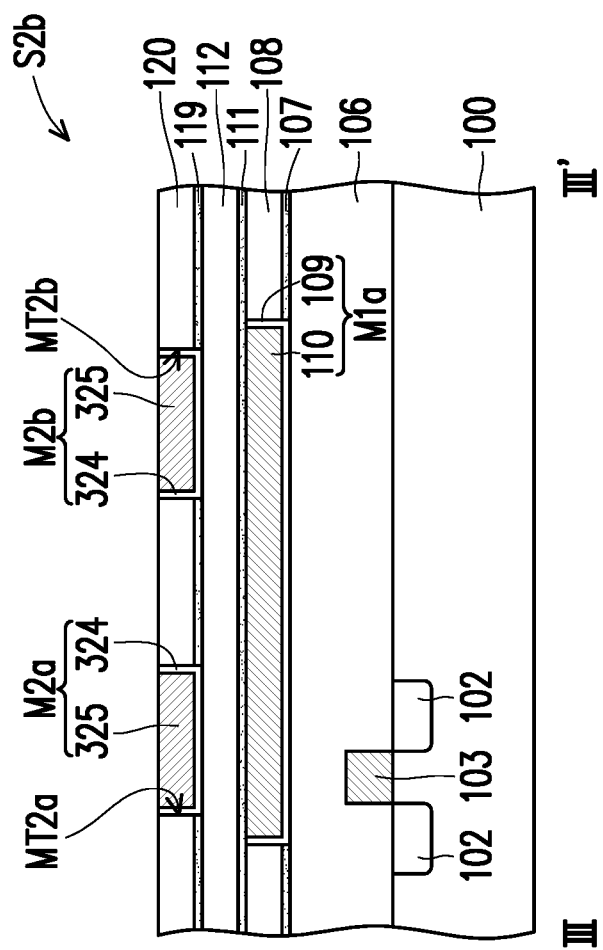

FIG. 7B is a top view of an interconnection structure of a semiconductor structure according to yet alternative embodiments of the disclosure. FIG. 7B is similar to FIG. 7A, except that the widths W'/W5 of the conductive vias V1a/V1b and junction part JT2 are less than the width W1 of the underlying conductive line M1a.

FIG. 9A to FIG. 9G are cross-sectional views illustrating a method of forming a semiconductor structure according to a sixth illustrative embodiment of the disclosure. Specifically, FIG. 9A to FIG. 9G illustrates cross-sectional views of intermediate stages of forming an interconnection structure having the top view of FIG. 7B. FIG. 9A to FIG. 9G corresponds to cross-sectional views of intermediate stages taken along I-I' line and II-II' line of FIG. 7B. The sixth embodiment is similar to the fifth embodiment, except that the fifth embodiment utilizes dual-damascene (via first) process to form the conductive vias and second tier conductive layer.

Figure 9A:
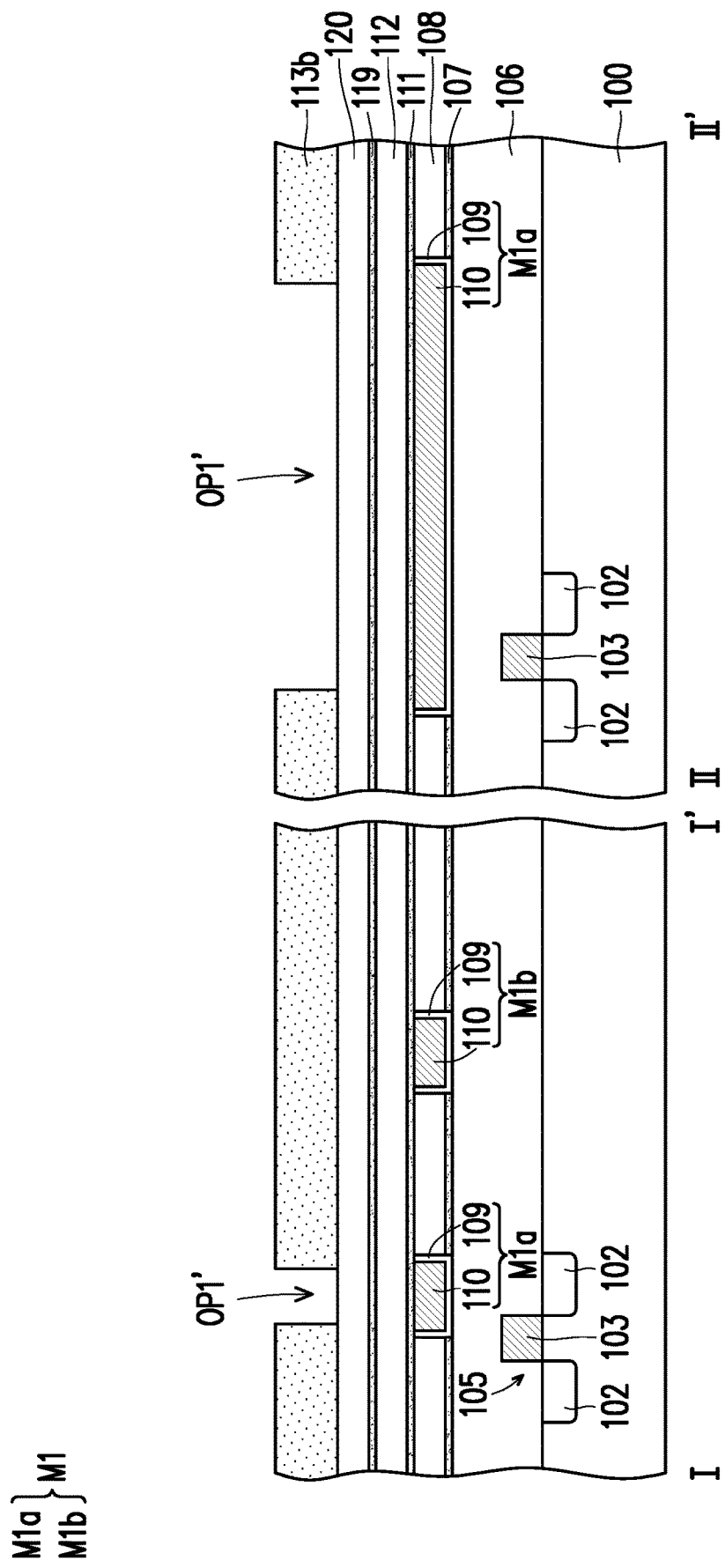
FIG. 9A through FIG. 9G are schematic cross-sectional views illustrating intermediate stages for forming a semiconductor device according to a sixth embodiment of the disclosure.

Referring to FIG. 9A, after the dielectric layer 120 is formed over the substrate 100, a patterned mask layer 113b is formed on the dielectric layer 120 for defining via openings. In some embodiments, the patterned mask layer 113b has an opening OP1' exposing a portion of the top surface of the dielectric layer 120. The opening OP1' may be a trench located directly over the conductive line M1a and extending along the direction D1 (FIG. 7B).

Figure 9B:
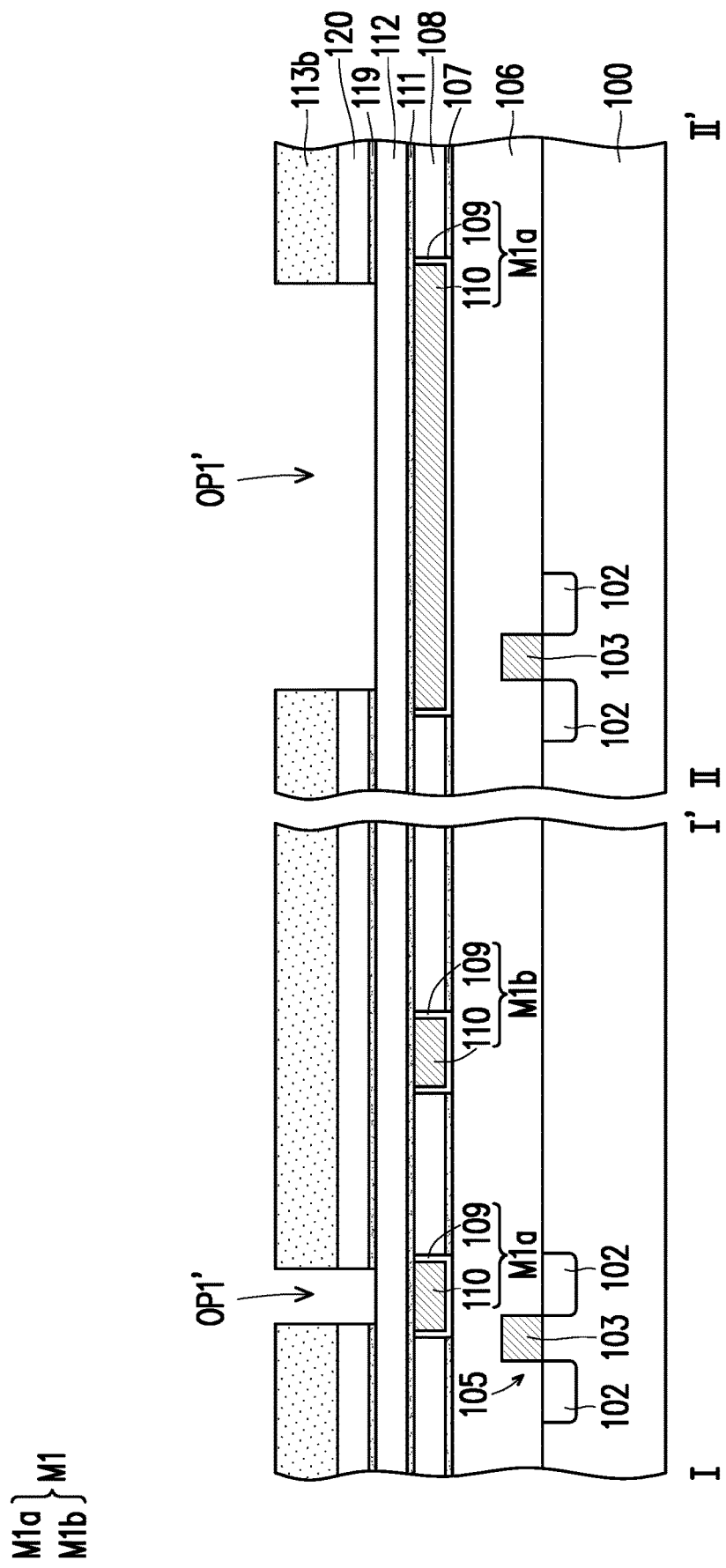

Referring to FIG. 9B, etching process is performed using the patterned mask layer 113b as an etching mask to remove portions of the dielectric layer 120 and the etching stop layer 119 exposed by the opening OP1'. In some embodiments, the etching process is stopped when the dielectric layer 119 is removed and the top surface of the dielectric layer 112 is exposed. In other words, the opening OP1' extends down into the dielectric layer 120 and the etching stop layer 119, without extending into the dielectric layer 112 and the etching stop layer 111. However, the disclosure is not limited thereto. In some other embodiments, the etching process may further remove portions of the dielectric layer 112 and the etching stop layer 111 to expose the top surface of the conductive line M1a.

Figure 9C:
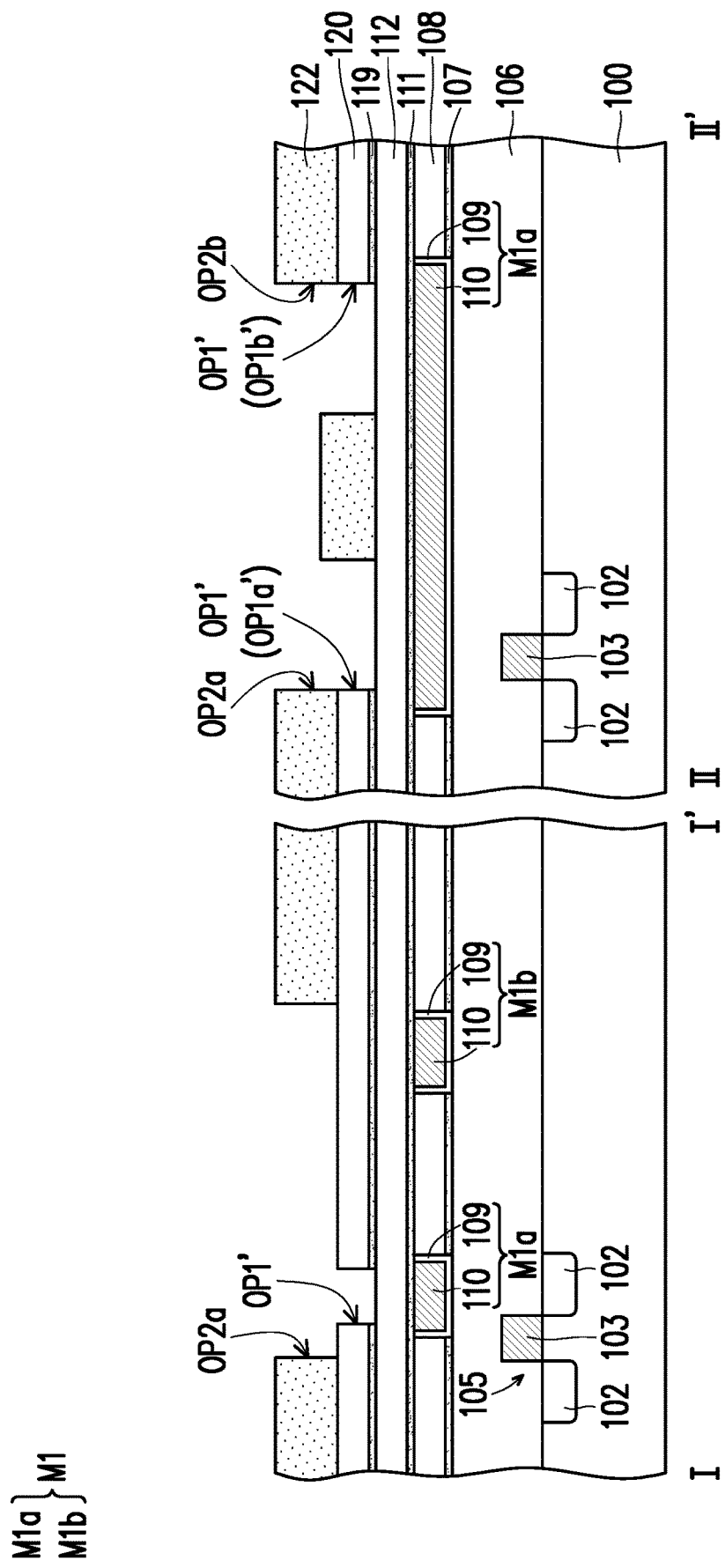

Referring to FIG. 9C, the patterned mask layer 113b is removed, and a patterned mask layer 122 is formed on the dielectric layer 120. In some embodiments, the patterned mask layer 122 has openings OP2a and OP2b in spatial communication with the opening OP1'. The openings OP2a and OP2b may be trenches parallel with each other and extending along the direction D2 (FIG. 7B). A portion of the patterned mask layer 122 fills into the opening OP1' and cover a portion of the top surface of the dielectric layer 112 previously exposed by the opening OP1'. In other words, a portion of the opening OP1' is occupied by the patterned mask layer 122, and the opening OP1' is divided into openings OP1a' and OP1b' spaced from each other by the patterned mask layer 122.

Figure 9D:
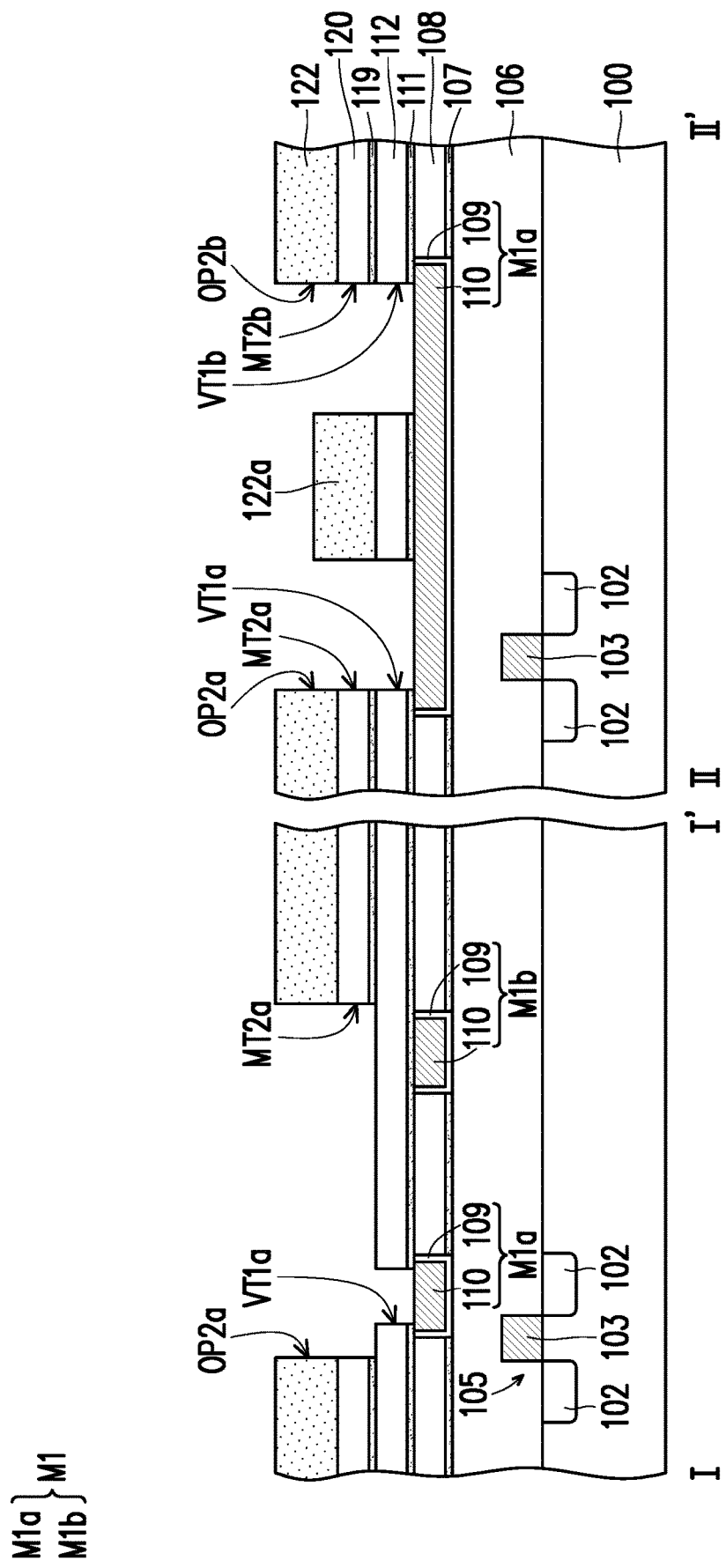

Referring to FIG. 9C and FIG. 9D, in some embodiments, an etching process is performed using the patterned mask layer 122 as an etching mask to remove one layer of dielectric layer and one layer of etching stop layer. In other words, portions of the dielectric layer 120 and the etching stop layer 119 exposed by the opening OP2a are removed, meanwhile, portions of the dielectric layer 112 and the etching stop layer 111 exposed by the openings OP1a' and OP1b' are removed. As a result, the openings OP1a' and OP1b' are transferred into the dielectric layer 112 and the etching stop layer 111 to form via openings VT1a and VT1b in the dielectric layer 112 and the etching stop layer, and portions of the top surface of the conductive line M1a are exposed, while the opening OP2a extends down into the dielectric layer 120 and the etching stop layer 119 to form conductive line trenches MT2a and MT2b in the dielectric layer 120 and the etching stop layer 119.

Referring to FIG. 9D, in some embodiments, after the etching process is performed, a portion 122a of the patterned mask layer 122 is located laterally between portions of the conductive line trenches MT2a and MT2b.

Figure 9E:
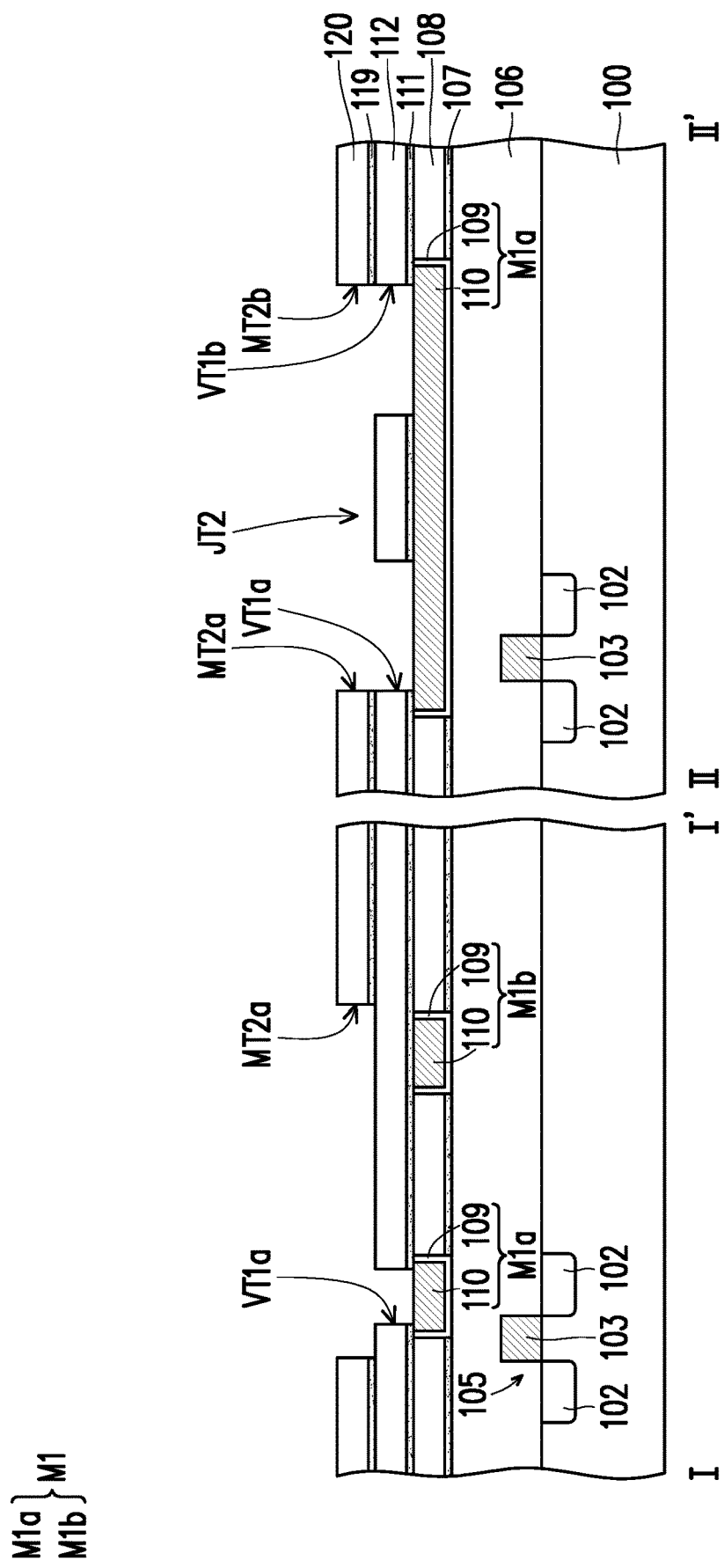

Referring to FIG. 7B, FIG. 9D and FIG. 9E, the patterned mask layer 122 is removed. In some embodiments, the removal of the portion 122a of the patterned mask layer 122 forms a junction opening JT2 laterally between conductive line trenches MT2a and MT2b, such that the conductive line trenches MT2a and MT2b spatially connected to each other through the junction opening JT2. The structural relations between the via openings VT1*a*/VT1*b*, the conductive line trenches MT2*a*/MT2*b* and the junction opening JT2 are substantially similar to those described in the fifth embodiment, except that the width of the via opening VT1*a* is less than the width of the underlying conductive line M1*a*.

Figure 9F:
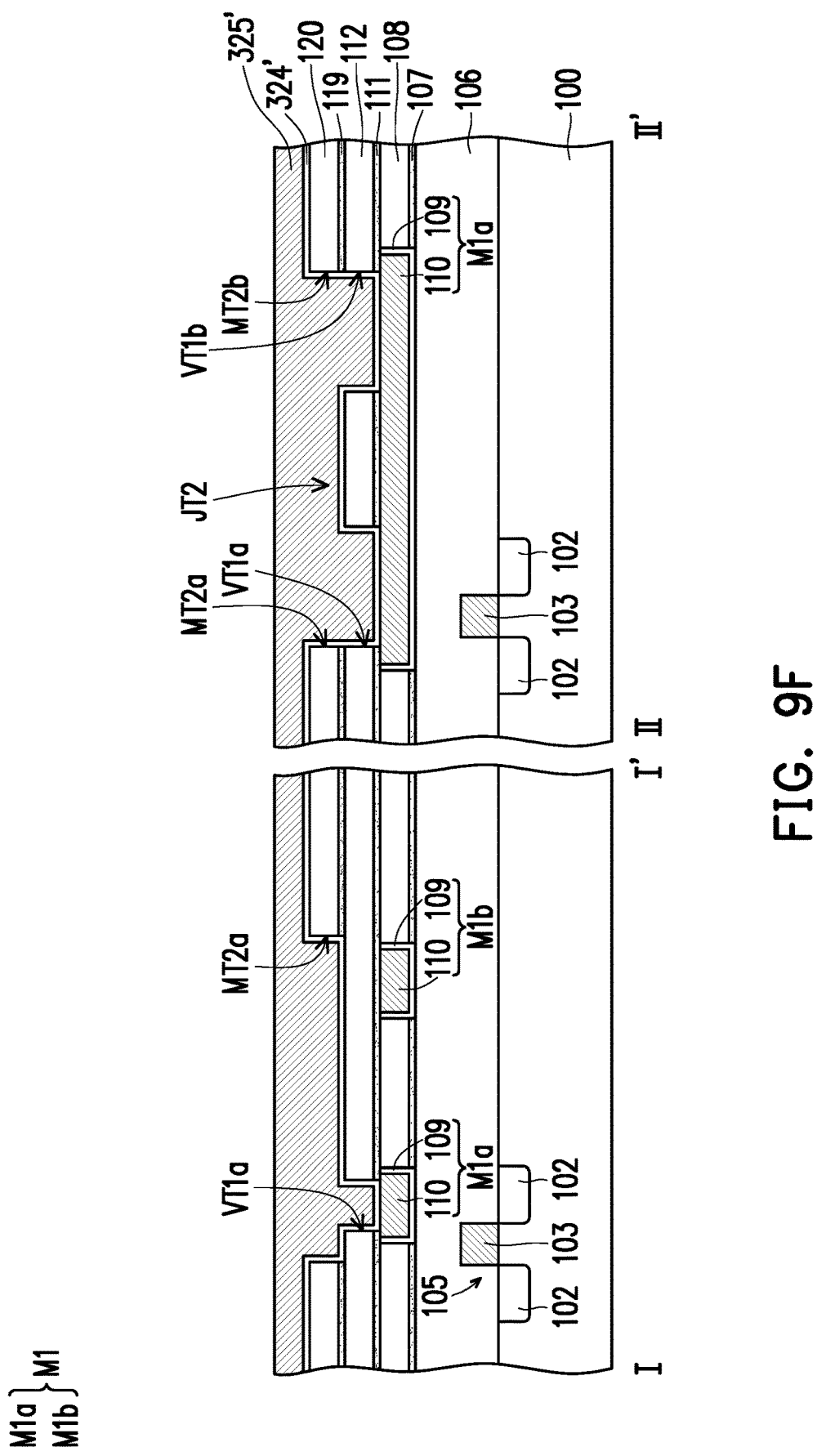
Figure 9G:
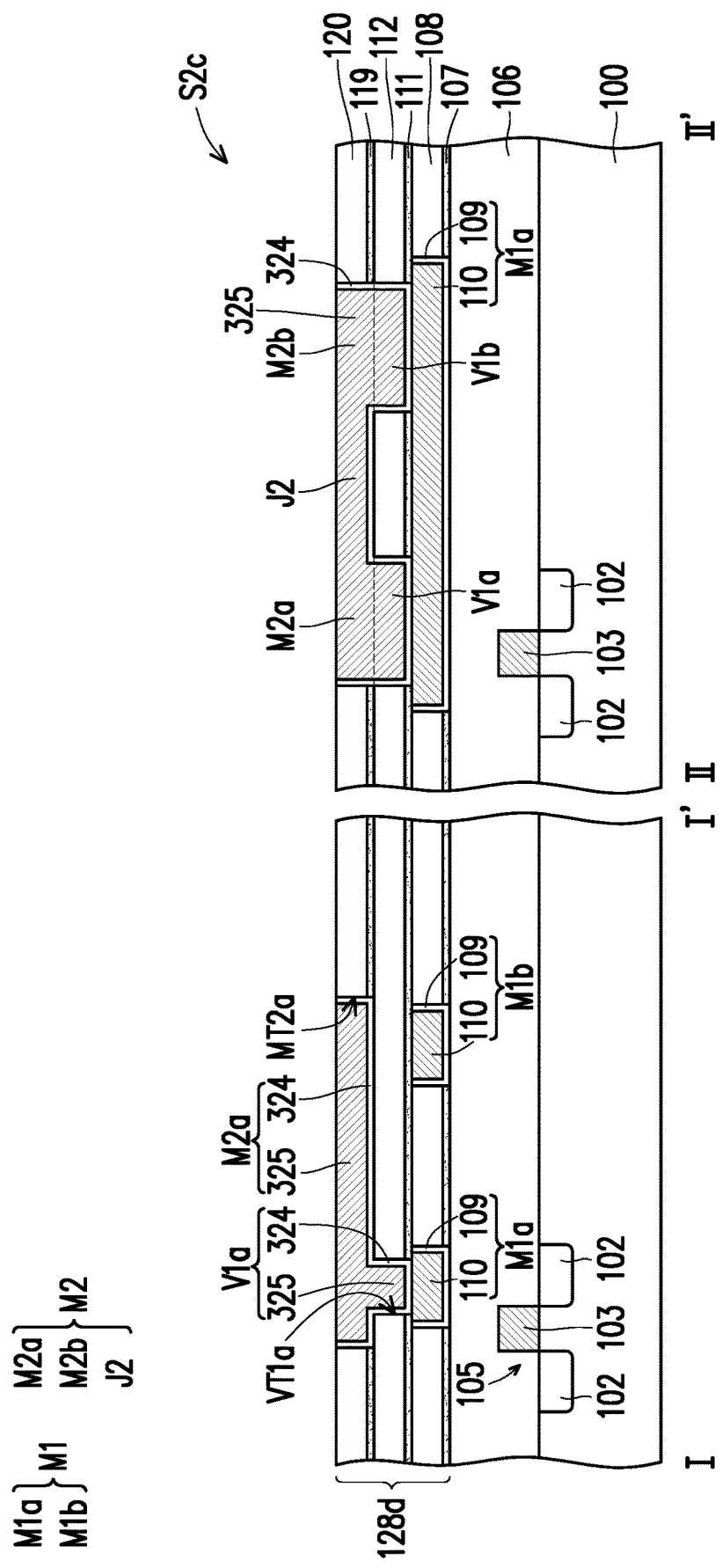

Referring to FIG. 9F and FIG. 9G, processes similar to those described in FIG. 8F to FIG. 8G are performed to form conductive vias V1*a*/V1*b* and second tier conductive layer M2. For example, a barrier material layer 324' and a conductive material layer 325' are formed on the dielectric layer 120 and fill into the via openings VT1*a*/VT1*b*, the conductive line openings MT1*a*/MT1*b* and the junction opening JT2. Thereafter, a planarization process is performed to remove excess portions of the conductive material layer 325' and barrier material layer 324' over the top surface of the dielectric layer 120, and a conductive layer 325*a* and a barrier layer 324*a* are remained in the openings and trenches to form the conductive vias V1*a*/V1*b*, the conductive lines M2*a*/M2*b* and the junction part.

Referring to FIG. 7B and FIG. 9G, a semiconductor structure S2*c* is thus formed, the semiconductor structure S2*c* includes the substrate 100, the device 105, and the interconnection structure 128*d*. The interconnection structure 128*d* is similar to the interconnection structure 128*c* (FIG. 8G), except that the widths W'/W5 of the conductive vias V1*a*/V1*b* and the junction part J2 are different from those described in the fifth embodiment. As shown in FIG. 7B, in some embodiments, the widths W' of the conductive vias V1*a*/V1*b* and the width W5 of the junction part J2 are substantially equal to each other and are less than the width W1 of the underlying conductive line M1*a*. The other structural features of the semiconductor structure S2*c* are substantially the same as those of the semiconductor structure S2*b* described in FIG. 7A and FIG. 8G, which are not repeated again here.

In some embodiments of the disclosure, the process for defining via trench/opening and the process for defining conductive line trenches may respectively be referred to as one-patterning-one-etching (1P1E) process. That is, one mask (e.g. photoresist) and corresponding etching process are used for defining the via opening or conductive line trench.

In some embodiments of the disclosure, the layout of the conductive via is configured to across two adjacent conductive lines which are underlying or overlying the conductive via, and the conducive via is disposed vertically between the two adjacent conductive lines and another conductive line in adjacent tier conductive layer, so as to electrically connect the two adjacent conductive lines to another conductive line in adjacent tier conductive layer. In alternative embodiments of the disclosure, separate conductive vias are configured at the same net to connect two adjacent conductive lines to another conductive line in adjacent tier conductive layer, and a junction part is disposed laterally between the two adjacent conductive lines. As such, the resistance of the interconnection structure (conductive via and/or the conductive layer) is reduced, and the electrical performance of the semiconductor structure is improved. Further, the process window for defining the via opening is increased. On the other hand, embodiments of the disclosure utilize one-patterning-one-etching (1P1E) process to define via opening or conductive line trench, instead of two-patterning-two-etching (2P2E) process. Accordingly, the manufacturing cost is reduced and manufacturing yield may be improved.

In accordance with some embodiments of the disclosure, a semiconductor structure includes a first conductive line, a second conductive line, a third conductive line and a conductive via. The first conductive line and the second conductive line are located in a first dielectric layer and extend along a first direction. The first conductive line and the second conductive line are spaced from each other by the first dielectric layer therebetween. The third conductive line is located in a second dielectric layer and extends along a second direction. The conductive via is vertically between the first conductive line and the third conductive line, and between the second conductive line and the third conductive line. The conductive via, in a vertical direction, is overlapped with a portion of the first dielectric layer that is laterally between the first conductive line and the second conductive line.

In accordance with alternative embodiments of the disclosure, a semiconductor structure includes a substrate and an interconnection structure over the substrate. The interconnection structure includes a first tier conductive layer, a second tier conductive layer, a first conductive via and a second conductive via. The first tier conductive layer includes a first conductive line extending along a first direction. The second tier conductive layer is over the first tier conductive layer. The second tier conductive layer includes a second conductive line, a third conductive line, and a junction part laterally between and electrically connected to the second conductive line and the third conductive line. The second conductive line and the third conductive line extends along a second direction. The first conductive via is vertically between and electrically connected to the first conductive line and the second conductive line. The second conductive via is vertically between and electrically connected to the first conductive line and the third conductive line. The orthogonal projections of the first conductive via, the second conductive via and the junction part on a top surface of the substrate are overlapped with each other in the first direction.

In accordance with some embodiments of the disclosure, a method of forming a semiconductor structure includes providing a substrate and forming an interconnection structure over the substrate. The formation of the interconnection structure includes: forming a first tier conductive layer in a first dielectric layer, the first tier conductive layer comprises a first conductive line and a second conductive line; forming a second dielectric layer and a third dielectric layer over the first dielectric layer; forming a via trench in the second dielectric layer to expose portions of the first conductive line and the second conductive line and a portion of the first dielectric layer laterally between the portions of the first conductive line and the second conductive line; forming a conductive line trench in the third dielectric layer, wherein the conductive line trench is spatially connected to the via trench; and forming a conductive via in the via trench and a third conductive line in the conductive line trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure having a conductive structure, comprising:
   a first conductive line embedded in a first dielectric layer and laterally extending along a first direction;
   a second conductive line and a third conductive line embedded in a second dielectric layer and laterally extending along a second direction different form the first direction, the second dielectric layer being over the first dielectric layer;
   a conductive junction part embedded in the second dielectric layer, the conductive junction part being laterally between the second conductive line and the third conductive line;
   a first conductive via disposed between the first conductive line and the second conductive line, and the first conductive via electrically connected to the first conductive line and the second conductive line; and
   a second conductive via disposed between the first conductive line and the third conductive line, and the second conductive via electrically connected to the first conductive line and the third conductive line, wherein the second conductive line, the conductive junction part and the third conductive line are arranged in order along the first direction.

2. The semiconductor structure of claim 1, wherein a lateral dimension of the first conductive via or the second conductive via in the first direction is less than a lateral dimension of the first conductive line in the first direction, and a lateral dimension of the first conductive via or the second conductive via in the second direction is greater than the lateral dimension of the first conductive line in the second direction.

3. The semiconductor structure of claim 1, wherein a lateral dimension of the first conductive via or the second conductive via in the second direction is less than the lateral dimension of the second conductive line or the third conductive line in the second direction.

4. The semiconductor structure of claim 1, wherein the second conductive line, the conductive junction part and the third conductive line overlap with the first conductive line.

5. The semiconductor structure of claim 1 further comprising:
   a third dielectric layer disposed between the first dielectric layer and the second dielectric layer, wherein the first conductive via and the second conductive via are embedded in the third dielectric layer.

6. The semiconductor structure of claim 5, wherein the conductive junction part is spaced apart from the first conductive line by the third dielectric layer.

7. The semiconductor structure of claim 1, wherein a width of the conductive junction part in the first direction is greater than a width of the first conductive line.

8. The semiconductor structure of claim 1, wherein a width of the conductive junction part in the first direction is less than a width of the first conductive line.

9. A semiconductor structure, comprising:
   a substrate; and
   an interconnection structure over the substrate, comprising:
      a first tier conductive layer comprising a first conductive line extending along a first direction;
      a second tier conductive layer over the first tier conductive layer, wherein the second tier conductive layer comprises a second conductive line, a third conductive line, and a conductive junction part laterally between and electrically connected to the second conductive line and the third conductive line, wherein the second conductive line and the third conductive line extend along a second direction;
      a first conductive via, vertically between and electrically connected to the first conductive line and the second conductive line; and
      a second conductive via, vertically between and electrically connected to the first conductive line and the third conductive line,
      wherein the conductive junction part offsets from the first conductive via and the second conductive via in the first direction.

10. The semiconductor structure of claim 9, wherein a first orthogonal projection of the conductive junction part on the top surface of the substrate is immediately adjacent to and laterally between a second orthogonal projection of the first conductive via and a third orthogonal projection of the second conductive via on the top surface of the substrate.

11. The semiconductor structure of claim 9, wherein a sidewall of the first conductive via is substantially aligned with a sidewall of the second conductive via in the first direction.

12. The semiconductor structure of claim 11, wherein a sidewall of the conductive junction part is substantially aligned with the sidewall of the first conductive via and the sidewall of the second conductive via when viewed in a top view.

13. The semiconductor structure of claim 9, wherein the first conductive via, the second conductive via, the first conductive line, the second conductive line and the conductive junction part share a barrier layer and a conductive layer.

14. The semiconductor structure of claim 9, wherein a width of the first conductive via is substantially equal to a width of the second conductive via and a width of the conductive junction part.

15. A semiconductor structure having a conductive structure, comprising:
   a first conductive line laterally extending along a first direction;
   a pair of second conductive lines laterally extending along a second direction different form the first direction, the pair of second conductive lines being over the first conductive layer;
   a conductive junction part laterally connecting between the pair of second conductive lines; and
   a pair of conductive vias disposed between and electrically connected to the first conductive line and the pair of second conductive lines, wherein a lateral dimension of the pair of conductive vias in the first direction is less than a lateral dimension of the first conductive line in the first direction, and a lateral dimension of the pair of conductive vias in the second direction is greater than the lateral dimension of the first conductive line in the second direction.

16. The semiconductor structure of claim 15, wherein a lateral dimension of the pair of conductive vias in the second direction is less than the lateral dimension of the pair of second conductive lines in the second direction.

17. The semiconductor structure of claim 15, wherein the pair of second conductive lines and the conductive junction part overlap with the first conductive line.

18. The semiconductor structure of claim 15 further comprising:

a dielectric layer, wherein the pair of conductive vias are embedded in the dielectric layer, and the conductive junction part is spaced apart from the first conductive line by the dielectric layer.

19. The semiconductor structure of claim 15, wherein a width of the conductive junction part in the first direction is greater than a width of the first conductive line.

20. The semiconductor structure of claim 15, wherein a width of the conductive junction part in the first direction is less than a width of the first conductive line.

* * * * *